(12) United States Patent
Nakata

(10) Patent No.: US 9,029,751 B2
(45) Date of Patent: May 12, 2015

(54) IMAGE SENSOR, IMAGING APPARATUS, AND IMAGING METHOD

(75) Inventor: Masashi Nakata, Kanagawa (JP)

(73) Assignee: Sony Corporation, Tokyo (JP)

( * ) Notice: Subject to any disclaimer, the term of this patent is extended or adjusted under 35 U.S.C. 154(b) by 505 days.

(21) Appl. No.: 13/533,363

(22) Filed: Jun. 26, 2012

(65) Prior Publication Data

US 2013/0032694 A1    Feb. 7, 2013

(30) Foreign Application Priority Data

Aug. 2, 2011    (JP) ................................. 2011-168946

(51) Int. Cl.
*H01L 27/146* (2006.01)
*H04N 5/359* (2011.01)
*H04N 9/04* (2006.01)

(52) U.S. Cl.
CPC . *H04N 5/359* (2013.01); *H04N 9/04* (2013.01)

(58) Field of Classification Search
USPC ......... 250/208.1, 226; 257/290–292; 348/242
See application file for complete search history.

(56) References Cited

U.S. PATENT DOCUMENTS

| 8,860,853 | B2 * | 10/2014 | Fukunaga et al. | 348/242 |
| 2010/0134660 | A1 * | 6/2010 | Yamauchi | 348/247 |
| 2011/0102635 | A1 * | 5/2011 | Fukunaga et al. | 348/231.99 |
| 2012/0105688 | A1 * | 5/2012 | Kita | 348/242 |

FOREIGN PATENT DOCUMENTS

| JP | 2010-016419 | 1/2010 |
| JP | 2010-147785 | 7/2010 |
| JP | 2010-239192 | 10/2010 |

* cited by examiner

*Primary Examiner* — Seung C Sohn

(74) *Attorney, Agent, or Firm* — Fishman Stewart Yamaguchi PLLC

(57) ABSTRACT

There is provided an image sensor including a normal pixel group composed of a plurality of normal pixels, each of the normal pixels having a photoelectric conversion device for photoelectrically converting an incident light, and a detection pixel configured to detect a light incident from a neighboring pixel by the photoelectric conversion device within an effective pixel area of the normal pixel group.

20 Claims, 43 Drawing Sheets

IMAGE SENSOR, IMAGING APPARATUS, AND IMAGING METHOD

BACKGROUND

The present disclosure relates to image sensors, imaging apparatus, and imaging methods. More particularly, the present disclosure relates to an image sensor, imaging apparatus and imaging method capable of more accurately correcting color mixing.

In the related art, there has been proposed a method of pre-setting a color mixing correction coefficient and correcting color mixing by using the color mixing correction coefficient (see, e.g., Japanese Patent Laid-open No. 2010-16419).

There has been also proposed a method of providing a color mixing detection pixel at an optical black area (OPB area) outside an effective pixel as a method of dynamically correcting color mixing (see, e.g., Japanese Patent Laid-open No. 2010-239192).

Further, there has been also proposed a method of providing an OPB within an effective pixel (see, e.g., Japanese Patent Laid-open No. 2010-147785).

SUMMARY

However, in the method of pre-setting the color mixing correction coefficient value which is described in Japanese Patent Laid-open No. 2010-16419, the manufacturing variations (for example, film thickness of color filter, or positional aberration of on-chip lens) have not been contemplated. Since color mixing ratio is changed depending on a light wavelength as well as a light source or a subject to be picked up, the method of pre-setting the color mixing correction coefficient has not contemplated on such cases.

Further, in the method described in Japanese Patent Laid-open No. 2010-239192, if a color mixing detecting pixel is provided at an area outside of the effective pixel, then the angle of incidence within the effective pixel is different from the angle of incidence outside of the effective pixel because the amount of color mixing is a value which is changed depending on the angle of light incidence. Accordingly, it is not possible to obtain the accurate amount of color mixing.

Moreover, in the method described in Japanese Patent Laid-open No. 2010-147785, the color mixing caused within Si has been not contemplated. If an OPB is provided only at a pixel of particular color, then, as well as black level, a color mixing being entered into the pixel is outputted. If the value is subtracted from other color pixel, then there is a possibility that the obtained color mixing ratio will be inaccurate because the color mixing is varied depending on colors. In addition, since the amount of color mixing is varied depending on image height (position within image sensor), it is necessary to perform an operation considering the optical distance. However, the method described in Japanese Patent Laid-open No. 2010-147785 has not mentioned about it.

In view of the foregoing, it is desirable to provide a technology capable of more accurately correcting color mixing.

According to an embodiment of the present disclosure, there is provided an image sensor which includes a normal pixel group composed of a plurality of normal pixels in which each of the normal pixels has a photoelectric conversion device for photoelectrically converting an incident light, and a detection pixel configured to detect a light incident from a neighboring pixel by the photoelectric conversion device within an effective pixel area of the normal pixel group.

The detection pixel may further include a light shielding film configured to shield an incident light incident upon the detection pixel from outside.

The light shielding film may be formed by a wiring layer.

The light shielding film may formed by a plurality of wiring layers.

Each of the wiring layers may have a gap formed thereon at different positions from each other.

Each of the wiring layers may be arranged depending on an incident angle of an incident light.

The light shielding film may be formed by a metal disposed on the photoelectric conversion device.

The image sensor may include a plurality of the detection pixels.

The image sensor may further include a filter configured to transmit an incident light of a predetermined wavelength. A result obtained by detecting a light incident from the neighboring pixel by the detection pixel may be used to correct a pixel value of a normal pixel provided with a filter configured to transmit an incident light having the same wavelength as a filter provided at the detection pixel.

The detection pixels may be provided in positions that are not contiguous with each other.

According to another embodiment of the present disclosure, there is provided an imaging apparatus which includes an image sensor and a subtraction unit. the image sensor includes a normal pixel group composed of a plurality of normal pixels in which each of the normal pixels has a photoelectric conversion device for photoelectrically converting an incident light, and a detection pixel configured to detect a light incident from a neighboring pixel by the photoelectric conversion device within an effective pixel area of the normal pixel group. The subtraction unit is configured to subtract a light amount of a light incident from a neighboring pixel of the normal pixel from a pixel value of the normal pixel by using a light amount of a light detected by the detection pixel of the image sensor.

The subtraction unit may include a selection unit configured to select a detection pixel to be used in subtracting the light amount, a light amount calculation unit configured to calculate the light amount included in a pixel value of a normal pixel to be processed using a pixel value of the detection pixel selected by the selection unit, and a light amount subtraction unit configured to subtract the light amount calculated by the light amount calculation unit from a pixel value of a normal pixel to be processed.

The selection unit may select a plurality of detection pixels. The light amount calculation unit may calculate the light amount by adding a weight to each pixel value of the plurality of detection pixels depending on a positional relationship between the plurality of detection pixels selected by the selection unit and a normal pixel to be processed.

The light amount calculation unit may change the detection pixel used to calculate the light amount to another detection pixel or prohibit the detection pixel from being used, when a pixel value of a neighboring pixel of the detection pixel selected by the selection unit is saturated.

The light amount calculation unit may change the detection pixel used to calculate the light amount to another detection pixel or prohibit the detection pixel from being used, when the detection pixel selected by the selection unit is a defective pixel.

The light amount calculation unit may further correct the calculated light amount to reduce the light amount, when a normal pixel to be processed is adjacent to a detection pixel.

The subtraction unit may subtract a black level as well as the light amount from the pixel value of the normal pixel.

The subtraction unit may include a selection unit configured to select a detection pixel to be used in subtracting the light amount, a ratio calculation unit configured to calculate a ratio of the light amount included in a pixel value of a normal pixel to be processed using a pixel value of the detection pixel selected by the selection unit, and a multiplication unit configured to multiply a pixel value of a normal pixel to be processed by a ratio of an incident light inputted to the normal pixel to be processed from outside, the ratio of the incident light is corresponded to the ratio of the light amount calculated by the ratio calculation unit.

The normal pixel and the detection pixel of the image sensor may have a vertical spectral structure.

According to another embodiment of the present disclosure, there is provided an imaging method of an imaging apparatus having an image sensor. The image sensor includes a normal pixel group composed of a plurality of normal pixels in which each of the normal pixels has a photoelectric conversion device for photoelectrically converting an incident light, and a detection pixel configured to detect a light incident from a neighboring pixel by the photoelectric conversion device within an effective pixel area of the normal pixel group. The imaging method includes subtracting, at a subtraction unit, a light amount of a light incident from a neighboring pixel of the normal pixel from a pixel value of the normal pixel using a light amount of a light detected by the detection pixel of the image sensor.

In accordance with an embodiment of the present disclosure, there is a provided a configuration which includes a normal pixel group composed of a plurality of normal pixels and a detection pixel. Each of the normal pixels has a photoelectric conversion device for photoelectrically converting an incident light. The detection pixel is configured to detect a light incident from a neighboring pixel by the photoelectric conversion device within an effective pixel area of the normal pixel group.

In accordance with another embodiment of the present disclosure, a light amount of a light incident from a neighboring pixel of the normal pixel is subtracted from a pixel value of the normal pixel using a light amount of a light detected by the detection pixel of the image sensor.

According to the embodiments of the present disclosure described above, it is possible to correct color mixing caused in an image device. Especially, the color mixing can be more accurately corrected without depending on imaging circumstances such as an angle of light incidence, a color temperature, a subject to be picked up, and so on.

DETAILED DESCRIPTION OF THE EMBODIMENT(S)

Figure 1:
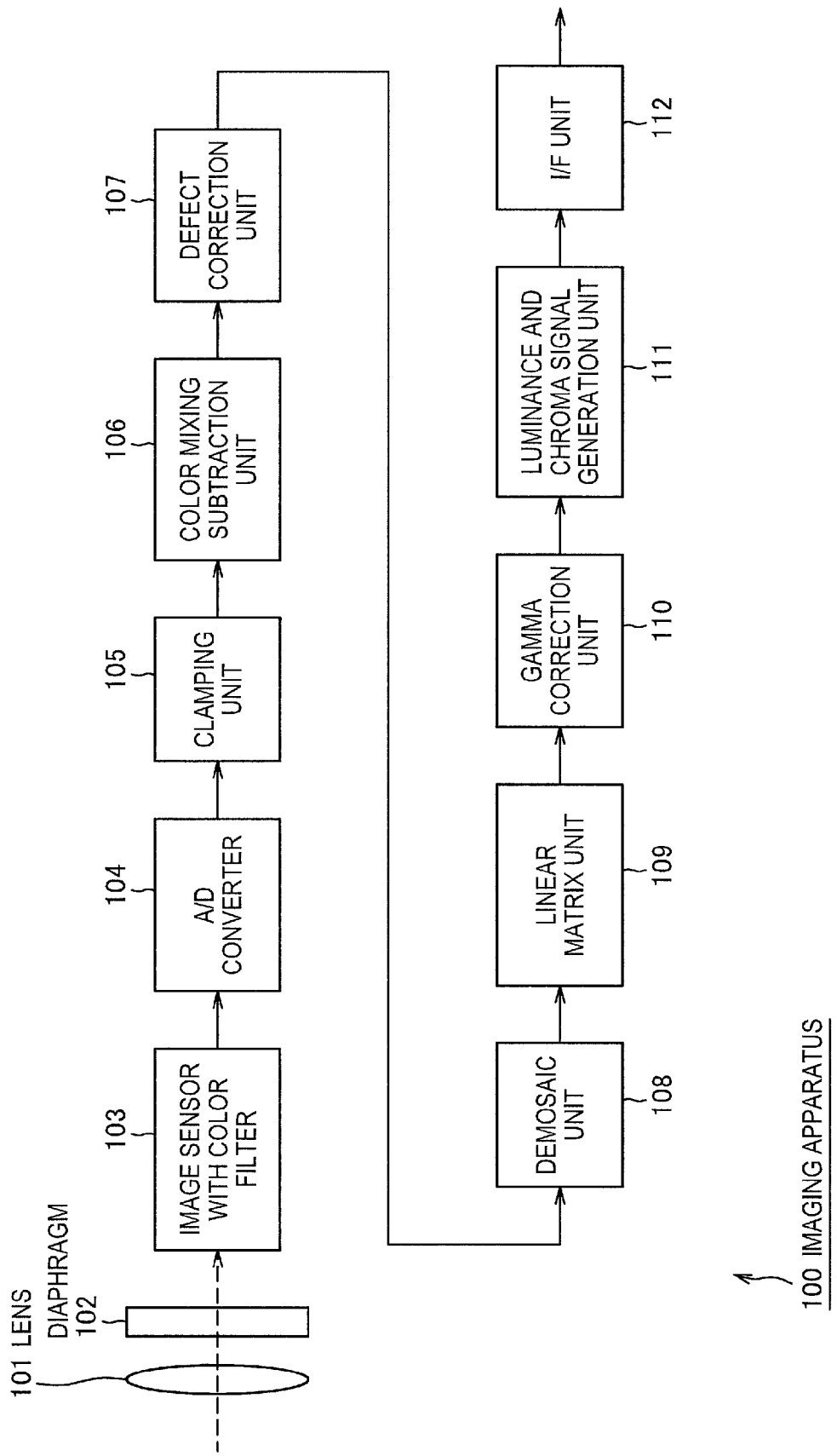
FIG. 1 is a schematic block diagram illustrating a configuration of an image device according to an embodiment of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Embodiments for implementing the present disclosure (hereinafter simply referred to as "embodiment") will be described below. In addition, the description will be made in the following order.

1. First Embodiment (sequential correction of amount of color mixing and black level)
2. Second Embodiment (simultaneous correction of amount of color mixing and black level)
3. Third Embodiment (application example)
4. Fourth Embodiment (vertical spectral structure: sequential correction of amount of color mixing and black level)
5. Fifth Embodiment (vertical spectral structure: simultaneous correction of amount of color mixing and black level)
6. Sixth Embodiment (application example: imaging apparatus)
7. Seventh Embodiment (personal computer)

First Embodiment

[Configuration of Imaging Apparatus]

FIG. 1 is a diagram illustrating a configuration example of an imaging apparatus according to an embodiment of the present disclosure. As shown in FIG. 1, the imaging apparatus 100 captures a subject, converts an image of the subject into electrical signals, and outputs the electrical signals.

As shown in FIG. 1, the imaging apparatus 100 includes a lens 101, a diaphragm 102, an image sensor with color filter 103, an analog-to-digital (A/D) converter 104, a clamping unit 105, a color mixing subtraction unit 106, and a defect correction unit 107. The imaging apparatus 100 also includes a demosaic unit 108, a linear matrix unit 109, a gamma correction unit 110, a luminance and chroma signal generation unit 111, and an interface (I/F) unit 112.

The lens 101 is configured to adjust a focal length of light incident upon the image sensor with color filter 103. The diaphragm 102 is configured to adjust an amount of light incident upon the image sensor with color filter 103. The lens 101 and the diaphragm 102 forms a processing unit of an optical system, and detailed configurations thereof are not limited to any particular configuration. For example, the lens 101 may be configured to include a plurality of lenses.

As shown by the dotted arrow in FIG. 1, the incident light transmits through both the lens 101 and the diaphragm 102 and irradiates the image sensor with color filter 103.

The image sensor with color filter 103 includes a photoelectric conversion device for each pixel and converts incident light into electrical signal. The photoelectric conversion device may be a photodiode. Specifically, the image sensor with color filter 103 includes a normal pixel group having a plurality of normal pixels. Each of the plurality of normal pixels includes a photoelectric conversion device for converting incident light into electrical signal. The image sensor with color filter 103 may be a charge coupled device (CCD) image sensor. In the CCD image sensor, the photoelectric conversion device performs light transmission using a circuit device called CCD to read out electric charge generated from light. Also, the image sensor with color filter 103 may be a complementary metal oxide semiconductor (CMOS) image sensor having an amplifier for each unit cell by using a CMOS.

The image sensor with color filter 103 includes color filters at a position of the photoelectric conversion device on which light is incident. In the color filters, each filter of red (R), green (G), and blue (B) colors are arranged on their respective photoelectric conversion devices, for example, in a Bayer array. Specifically, the image sensor with color filter 103 converts a light incident upon each color transmitted through respective filters into electrical signal and supplies the electrical signal to the analog-to-digital (A/D) converter 104.

The color filters of the image sensor with color filter 103 may have optional colors and also may have colors other than RGB. Some or all of the RGB colors may not be used. In addition, arrangement of each color is also optional and other arrays than the Bayer array may be used. For example, a clear bit type pixel array, a dye-based color filter, a white pixel (see, Japanese Patent Laid-open No. 2010-296276) and so on may be used for an arrangement of each color.

In the following, it is assumed that RGB color filters of the image sensor with color filter 103 are arranged in the Bayer array.

The A/D converter 104 is configured to convert electrical signal (analog signal) of RGB supplied from the image sensor with color filter 103 into digital data (image data). The A/D converter 104 supplies the image data (RAW data) of the digital data to the clamping unit 105.

The clamping unit 105 is configured to subtract black level from the image data. The black level is a level which is determined as black color. The clamping unit 105 supplies the image data from which the black level is subtracted to the color mixing subtraction unit 106.

The color mixing subtraction unit 106 is configured to subtract a color mixing component from the image data. The color mixing component is a type of light component transmitted through the filters of neighboring pixels. The color mixing subtraction unit 106 supplies the image data from which the color mixing component is subtracted to the defect correction unit 107.

The defect correction unit 107 is configured to correct a pixel value of a defective pixel from which a proper pixel value is not obtained. The defect correction unit 107 supplies the image data in which the defective pixel is corrected to the demosaic unit 108.

The demosaic unit 108 is configured to convert RAW data into RGB data by performing a demosaic process on the RAW data and by compensating color information. The demosaic unit 108 supplies the image data (RGB data) on which the demosaic process is performed to the linear matrix unit 109.

The linear matrix unit 109 is configured to correct each color signal of image data using a matrix coefficient and perform a process for changing the color reproducibility so as to bridge the gap between a chromaticity point of primary colors (RGB) defined by specification and an actual chromaticity point of a camera. The linear matrix unit 109 supplies the image data in which the process for changing the color reproducibility is performed to the gamma correction unit 110.

The gamma correction unit 110 is configured to adjust the relative relationship between a color of the image data and the characteristics of an output device, and perform a gamma correction process for obtaining representations more close to the original. The gamma correction unit 110 supplies the processed image data (RGB data) to the luminance and chroma signal generation unit 110.

The luminance and chroma signal generation unit 111 is configured to generate a luminance signal (Y) and chrominance signals (Cr, Cb) from the RGB data supplied from the gamma correction unit 110. The luminance and chroma signal generation unit 11 supplies the generated luminance and chrominance signals (Y, Cr, Cb) to the interface (I/F) unit 112.

The interface (I/F) unit 112 outputs the image data (luminance/chroma signal) supplied from the luminance and chroma signal generation unit 11 to the outside of the imaging apparatus 100 (for example, storage device for storing the image data or display device for displaying an image of the image data).

[Image Sensor with Color Filter]

Subsequently, each unit of the imaging apparatus will be described in detail. First, the image sensor with color filter 103 will be described in detail below.

Figure 2:
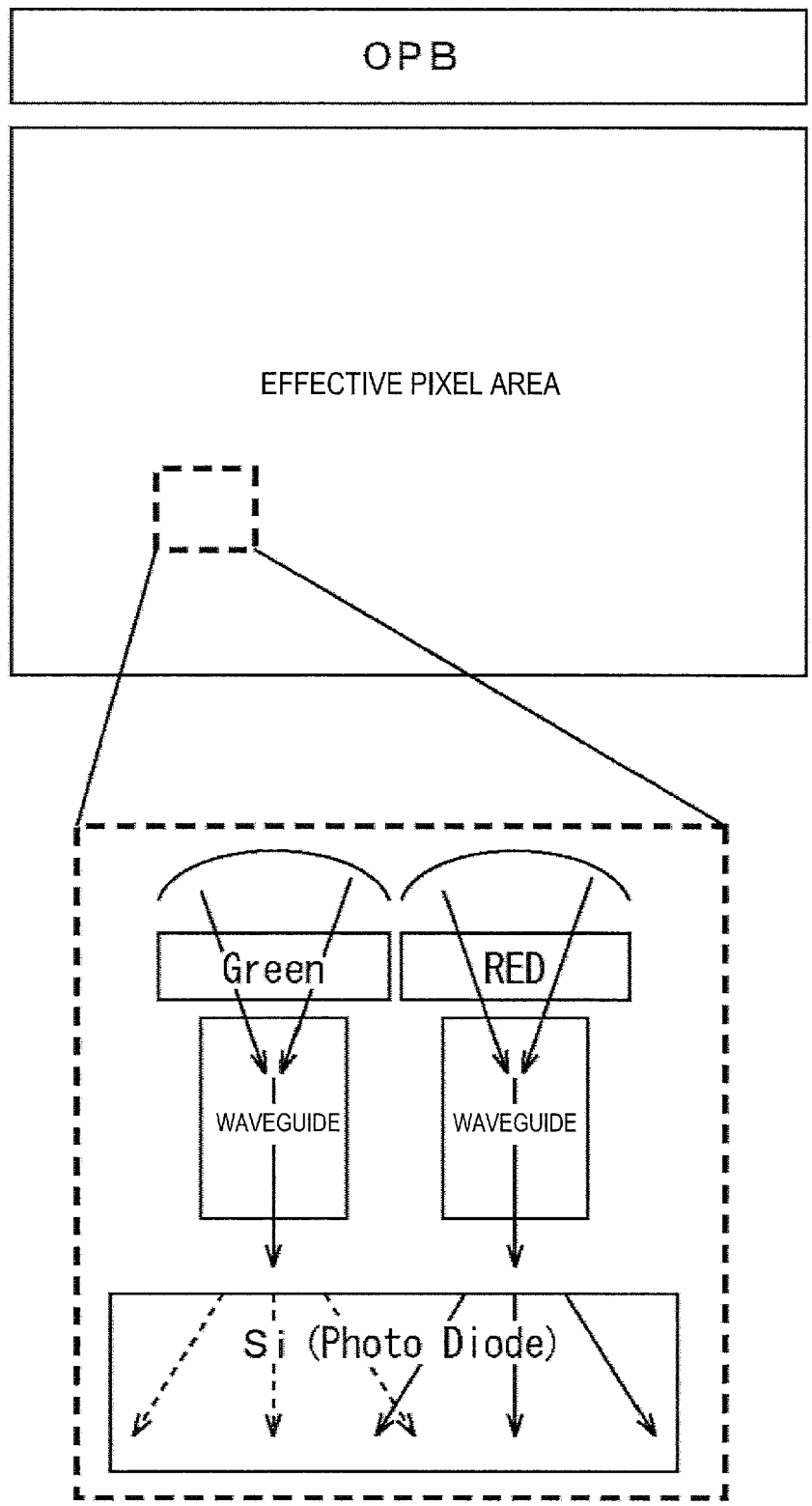
FIG. 2 is a diagram illustrating an example of how color mixing is caused.

In an image sensor of the related art, as shown in FIG. 2, an optical black area (OPB) is provided at the outside of the effective pixel area of the normal pixel group, and black level is detected in the OPB area. In each pixel within the effective pixel area, the incident light passed through an on-chip lens, a color filter, and a waveguide is irradiated on a photodiode (Si photodiode). The photodiode converts incident light into electrical signal, accumulates electric charge, and then outputs the electric charge at a predetermined timing.

As shown in FIG. 2, in accordance with the image sensor of the related art, there was a possibility that the incident light passed through the on-chip lens, the color filter and the waveguide of each pixel will be irradiated on any neighboring pixels besides the photodiode of the target pixel within a silicon photodiode. Furthermore, there also was a possibility that the incident light will be leaked into the neighboring pixels in the outside of the silicon photodiode such as the waveguide and so on.

As a result, there was a possibility that a part of incident light transmitted through the color filter of neighboring pixels adjacent to the target pixel as well as incident light of the target pixel will be irradiated on the photodiode of a certain pixel (target pixel). In other words, there was a possibility that color mixing will be caused by light incident upon the target pixel and also by light having a color different from the light incident upon the target pixel.

Figure 3:
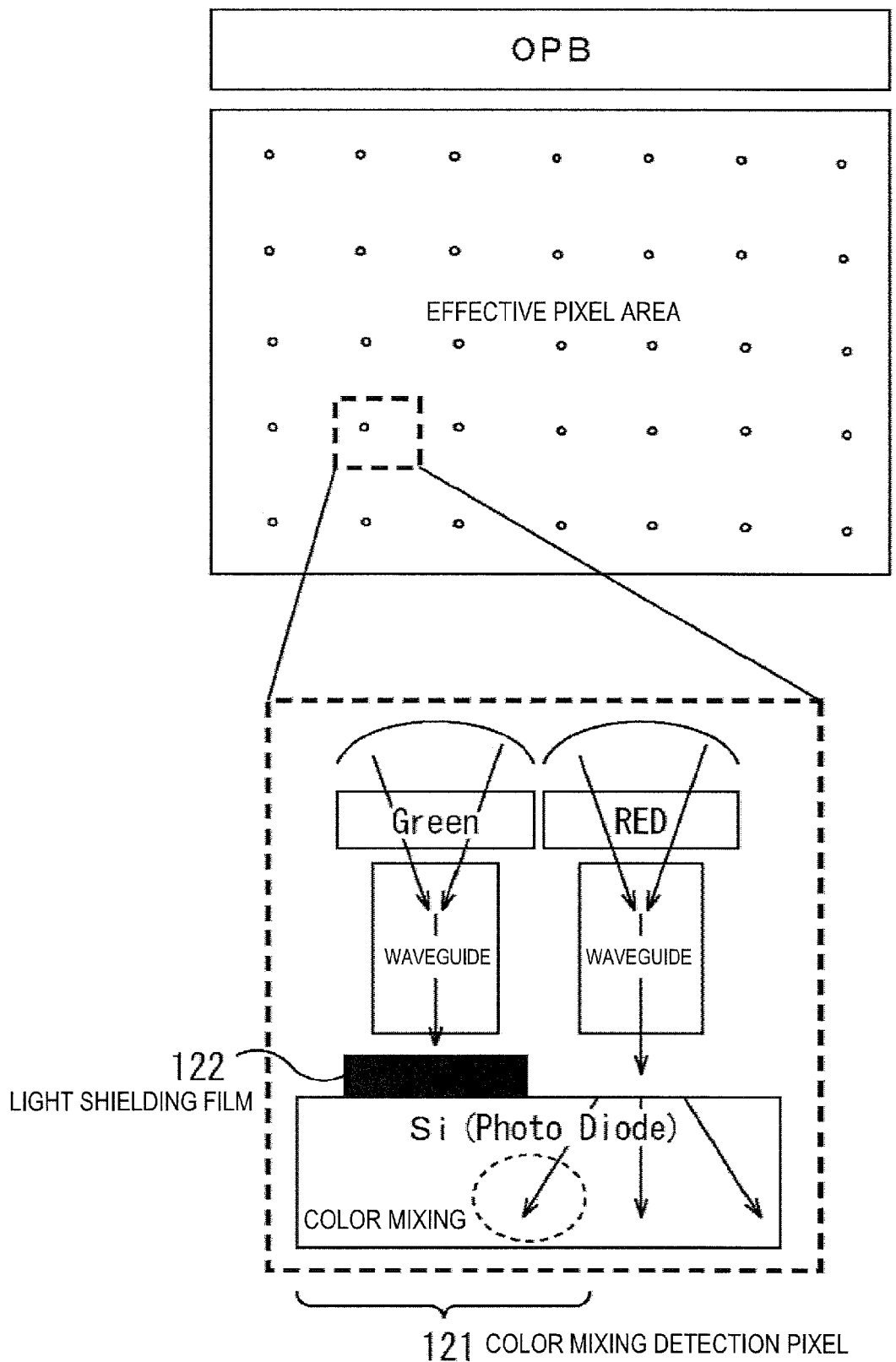
FIG. 3 is a diagram illustrating an example of a color mixing detection pixel.

Whereas, in the image sensor with color filter 103 according to the embodiment, as shown in FIG. 3, a color mixing detection pixel 121 configured to detect the amount of color mixing is provided within an effective pixel area of the normal pixel group. In the color mixing detection pixel 121, a photodiode is covered with a light shielding film 122. This substantially blocks any light originating from upper portion than the Si photodiode from entering the Si photodiode. That is, in the color mixing detection pixel 121, the incident light component transmitted through the color filter of the target pixel is blocked by the light shielding film 122, and only the incident light component transmitted through a color filter of any neighboring pixel is detected by the photodiode.

As shown in FIG. 3, a plurality of the color mixing detection units 121 are disposed within the effective pixel area. In the example of FIG. 3, thirty five color mixing detection units 121 (7 rows×5 columns=35) are provided within the effective pixel area. In addition, the number of the color mixing detection unit 121 is not particularly limited and can be suitably selected. If the number of the color mixing detection unit increases, then it is possible to more accurately calculate the amount of color mixing. However, since the color mixing detection pixel do not have a normal signal value, the color mixing detection pixel is eventually regarded as a defective pixel and then is replaced with a normal pixel value. Therefore, the number of pixel which is regarded and processed as a defective pixel can be reduced by minimizing the number of the color mixing detection pixel as small as possible. This allows malfunctions (for example, false color or resolution degradation) caused by defect correction to be prevented.

The position of the color mixing detection unit 121 within the effective pixel area is not particularly limited. However, in order to accurately perform the color mixing correction by increasing the robustness against the bias of the amount of color mixing (pixel characteristics) within the effective pixel area, it is desirable to dispose the color mixing detection unit 121 so that it may be distributed within the effective pixel area as evenly as possible.

Figure 4:
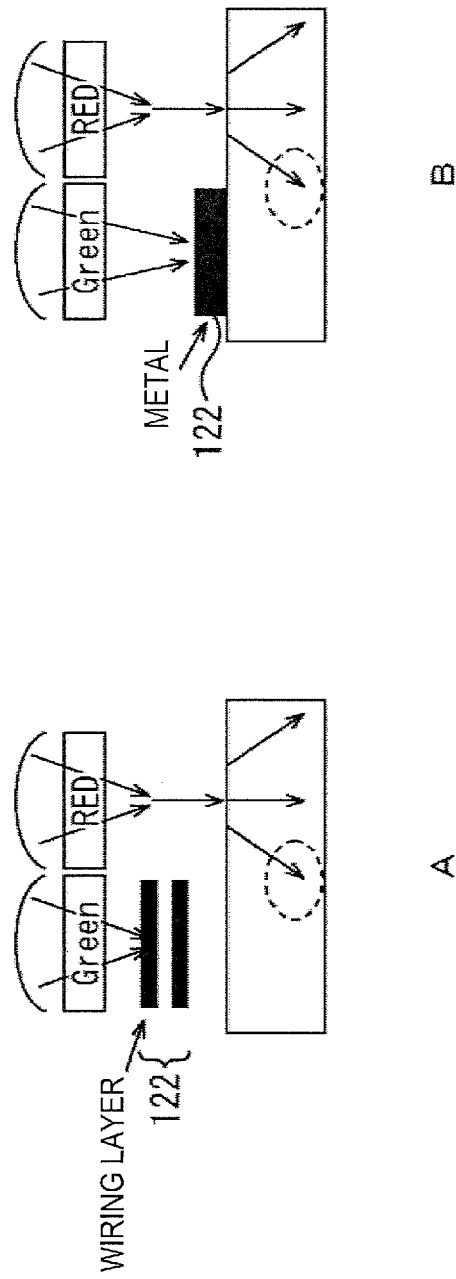
FIG. 4 is a diagram illustrating an example of a light shielding film.

The light shielding film 122 may be made of any material as long as the material prevents the light transmitted through the color filter of the target pixel from entering the photodiode. For example, for a front surface illuminated sensor, as shown in FIG. 4A, the light shielding film 122 may be a wiring layer made of a metal (for example, copper (CU) or aluminum (Al)). Also, for a back surface illuminated sensor, as shown in FIG. 4B, the light shielding film 122 may be made of a metal (for example, tungsten (W)) formed on the photodiode. Of course, suitable methods other than those described above may be used to form the light shielding film 122.

Figure 5:
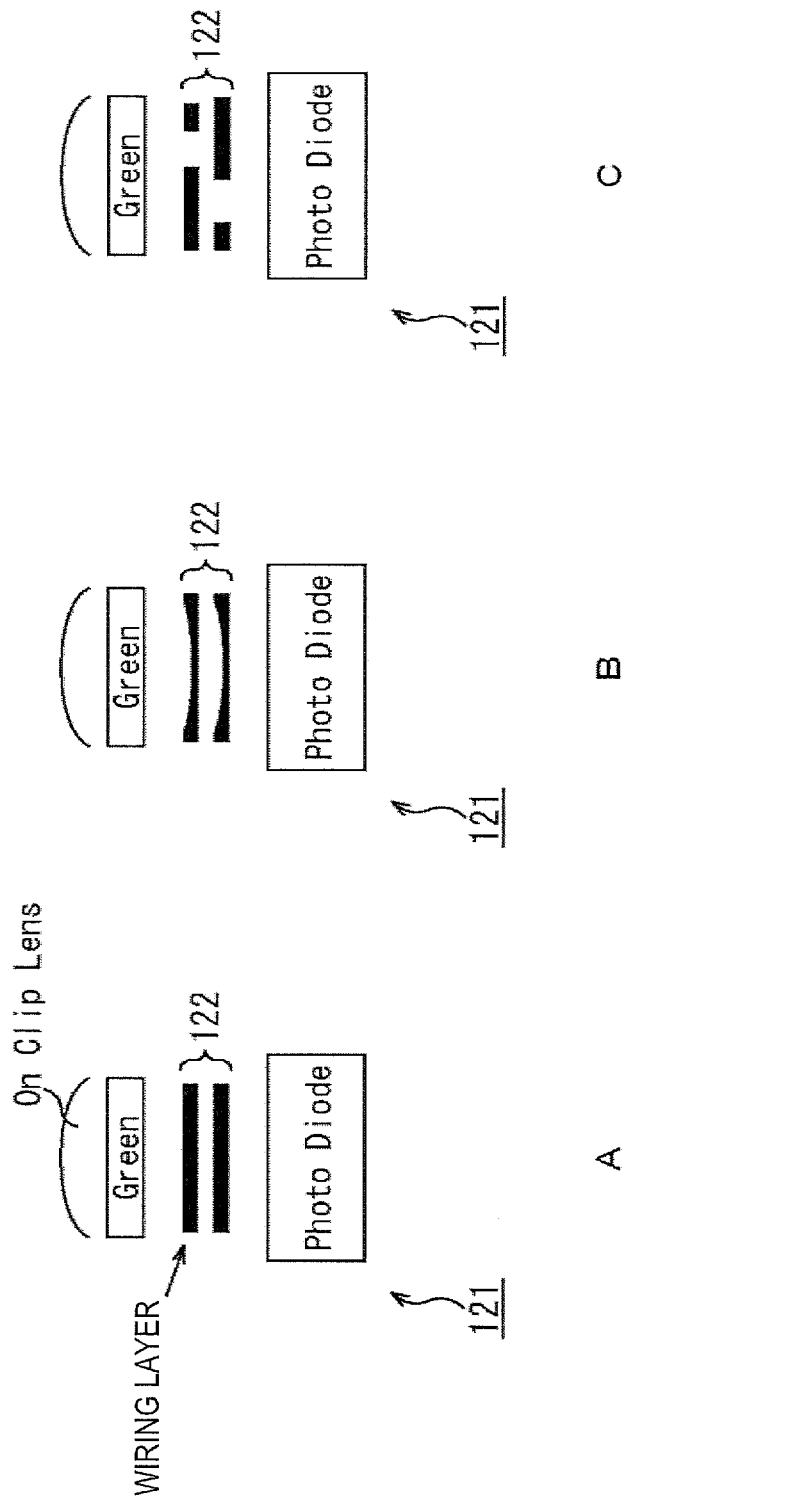
FIG. 5 is a diagram illustrating an example of a light shielding film.

For the formation pattern of the light shielding film, any technique capable of light-shielding may be used. For example, as shown in FIG. 5A, the light shielding is achievable by using a plurality of wiring layers (the plurality of wiring layers work as the light shielding film 122). However, if the wiring layer is formed large enough to cover the entire pixel, then there is a possibility that the light shielding film will be peeled off during a process of forming the film (for example, dishing that arise when surface polishing (a chemical mechanical polishing (CMP))). Accordingly, there is a possibility that the thickness of each of the wiring layers becomes thinned, thus the incident light of the target pixel will be transmitted through the wiring layers without being blocked.

Figure 6:
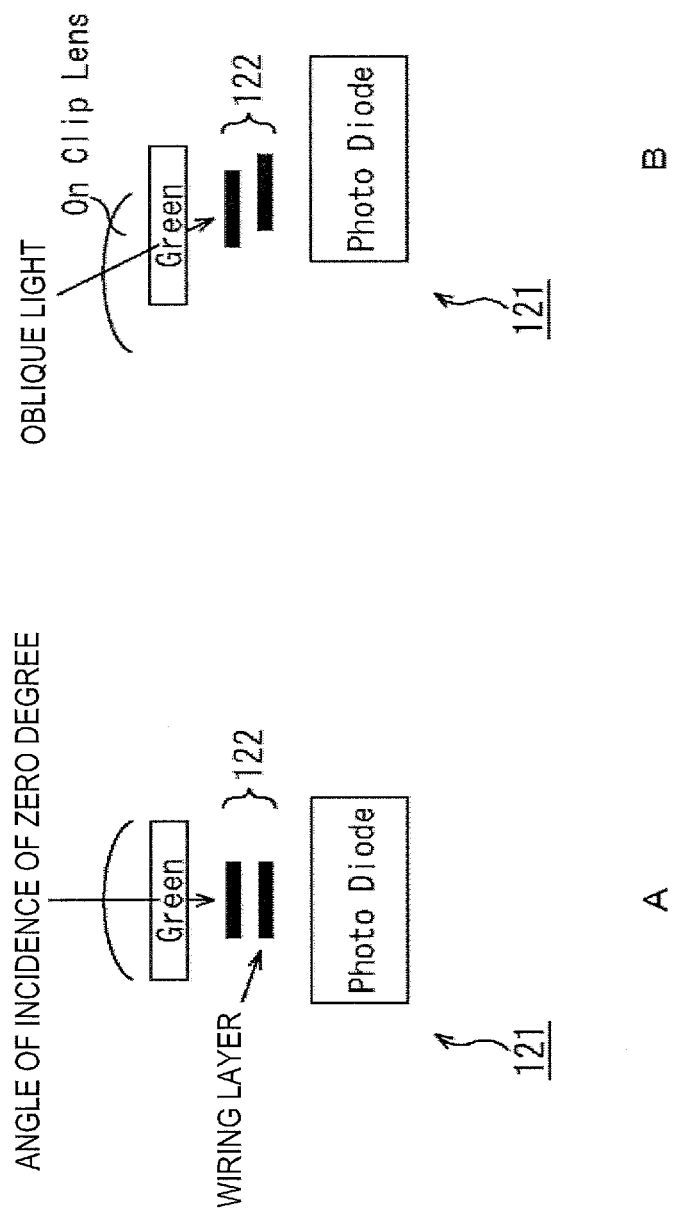
FIG. 6 is a diagram illustrating an example of a light shielding film.

For example, as shown in FIG. 5C, it may be possible to provide a configuration that a gap is formed at respective parts of each wiring layer and one wiring layer shields a light leaking from the gap formed in another wiring layer. As shown in FIG. 6, it also may be possible to provide a configuration that the light shielding film has a minimum size and an optimal exit pupil correction is performed in correspondence with the angle of incidence. For example, in the case of FIG. 6A, since the incident light entering the target pixel has the angle of incidence of zero (0) degree, the light shielding film 122 (wiring layers) is disposed in the proximity of the center of the pixel so as to prevent the incident light from entering the proximity of the center of the pixel. In the case of FIG. 6B, since a light is incident upon the target pixel from an oblique direction, the on-chip lens, the color filter and the wiring layer which is serving as the light shielding film 122 are each disposed depending on the angle of light incidence.

This allows reducing a shielding area (area size of the wiring layer serving as the light shielding film 122) necessary to shield the pixel from entering of light. Thus, it is possible to prevent the light shielding film from being peeled off during a process of forming the film (for example, dishing caused by CMP).

Figure 7:
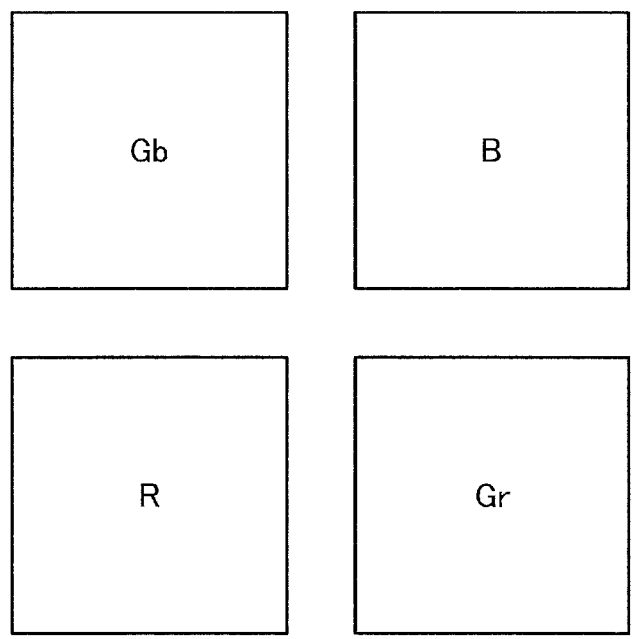
FIG. 7 is a diagram illustrating an example of a Bayer array.

As shown in FIG. 7, the color filters of a red (R), a blue (B), a Gr (green in the red (R) row), and a Gb (green in the blue (B) row) are arranged in the Bayer array pattern. Filters of each color correspond to their respective different one of the pixels. Thus, in the example of FIG. 7, the light transmitted through each filter of Gb, B, R, and Gr is mainly incident upon their respective photodiodes of pixels different from each other. However, as described above, the light is also incident upon each neighboring pixels, thereby causing color mixing.

By arranging each color in this way, the color of neighboring pixels varies according to each color of the target pixel. Thus, the amount of color mixing of each color varies according to each color of the target pixel. As a result, the color mixing detection pixel 121 is provided at each of R, B, Gr, and Gb.

Figure 8:
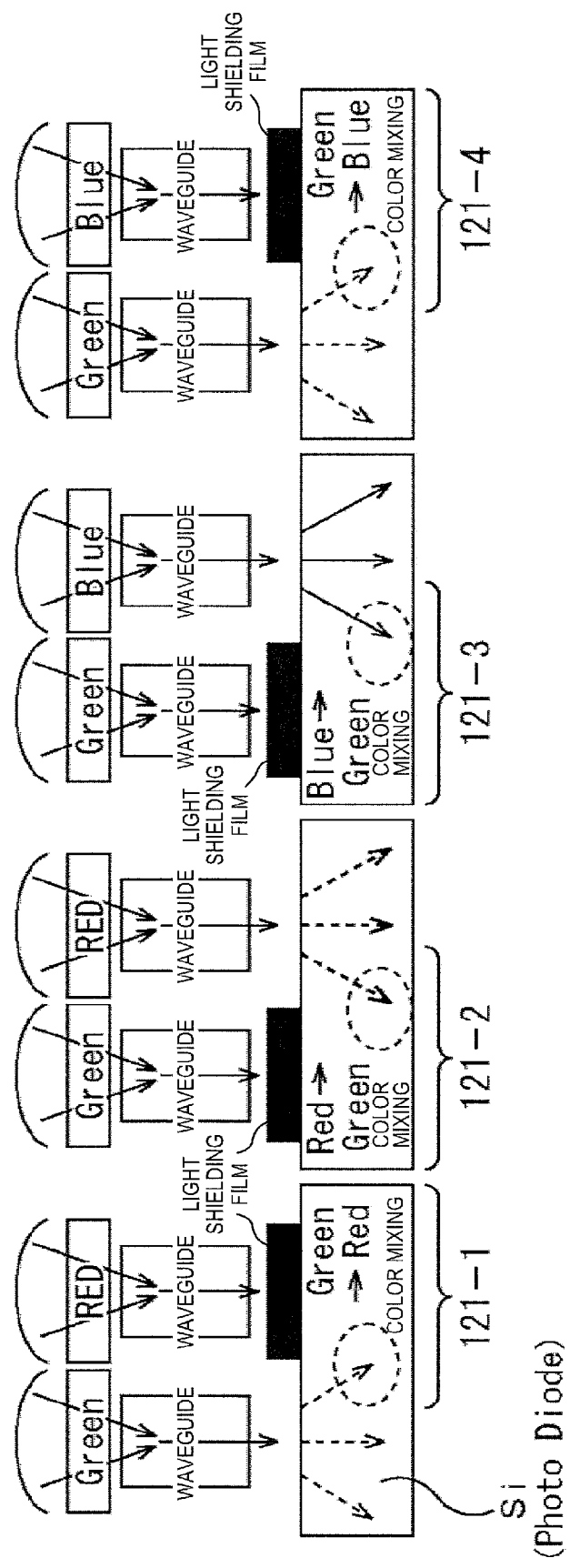
FIG. 8 is a diagram illustrating an arrangement example of a color mixing detection pixel.

In an example of FIG. 8, a color mixing detection pixel 121-1 detects the amount of color mixing for a pixel of color R. A color mixing detection pixel 121-2 detects the amount of color mixing for a pixel of color Gr. A color mixing detection pixel 121-3 detects the amount of color mixing in a pixel of color Gb. A color mixing detection pixel 121-4 detects the amount of color mixing in a pixel of color B.

Figure 9:
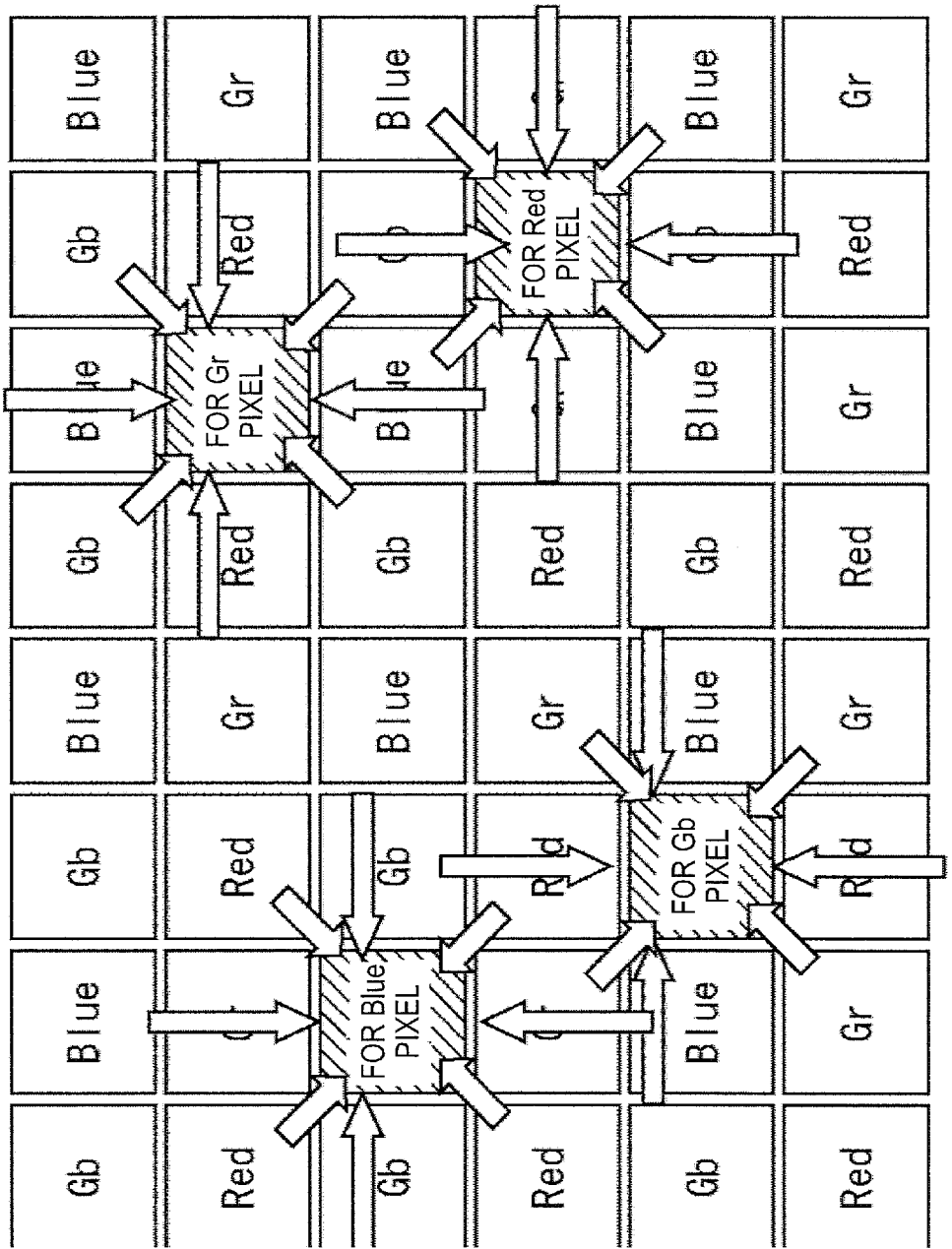
FIG. 9 is a diagram illustrating an arrangement example of a color mixing detection pixel.

The light is incident upon a target pixel from its neighboring pixels in any direction. In other words, a color mixing is caused by the neighboring pixels in any direction (for example, up, down, left, right, and oblique directions). Thus, each of the color mixing detection pixels is positioned in spatially discrete locations so that the color mixing detection pixels may be not contiguous with each other as shown in FIG. 9.

Figure 10:
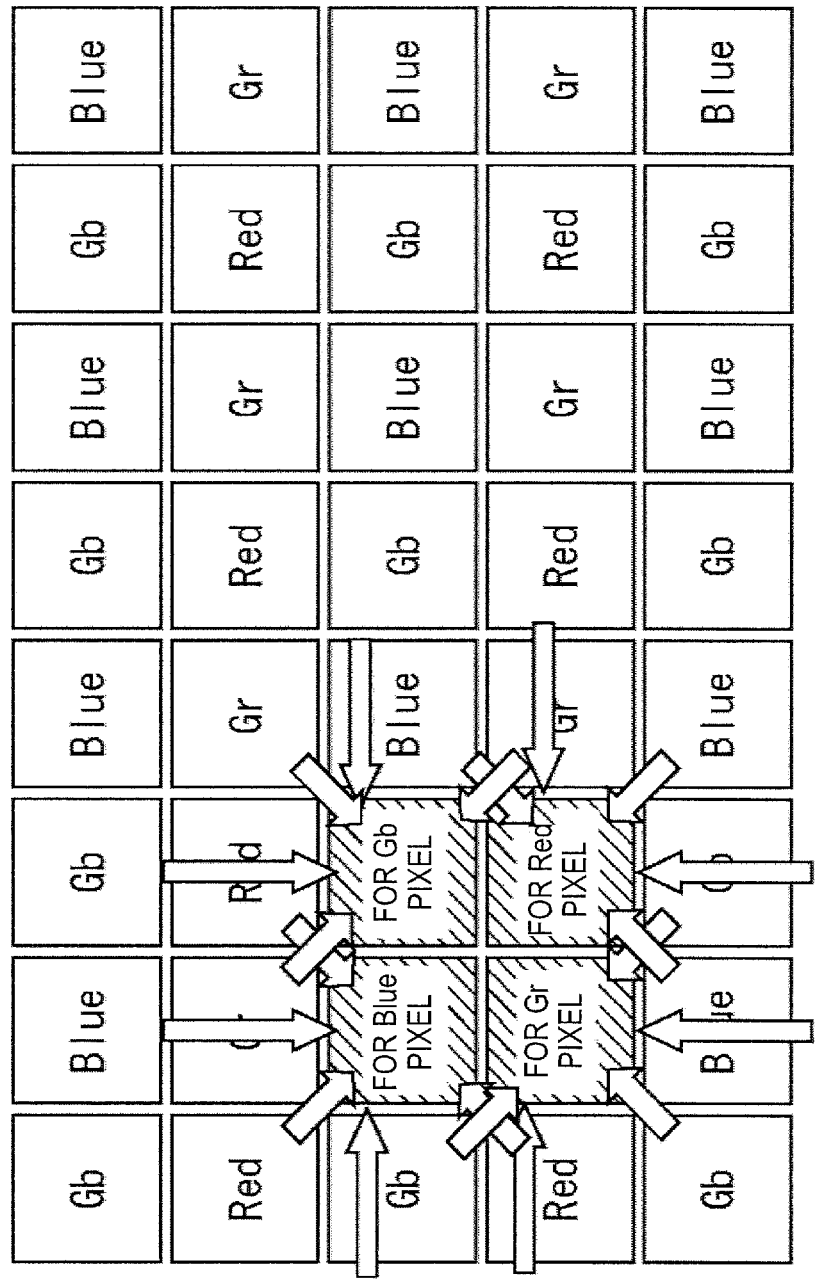
FIG. 10 is a diagram illustrating an undesirable arrangement example of a color mixing detection pixel.

The light shielding film blocks the light incident upon the target pixel from entering the color mixing detection pixel. Thus, the color mixing (entering of the light) in the direction from the color mixing detection pixel to its neighboring pixels is basically not caused (or negligibly minimal). For example, as shown in FIG. 10, if the color mixing detection pixels are disposed in contiguous relation to each other, then the color mixing is generally not caused between the adjacent color mixing detection pixels. Therefore, there is a high possibility that the amount of color mixing which is detected in the color mixing detection pixel having such arrangement will be not equivalent to the amount of color mixing of the normal pixel on which a light is incident from neighboring pixels in all directions. That is, in such an arrangement, there is a possibility that the color mixing detection pixel will not accurately detect the amount of color mixing. Thus, the color mixing detection pixels are disposed apart from each other so that they are not disposed in contiguous relation to each other as shown in FIG. 9.

Figure 11:
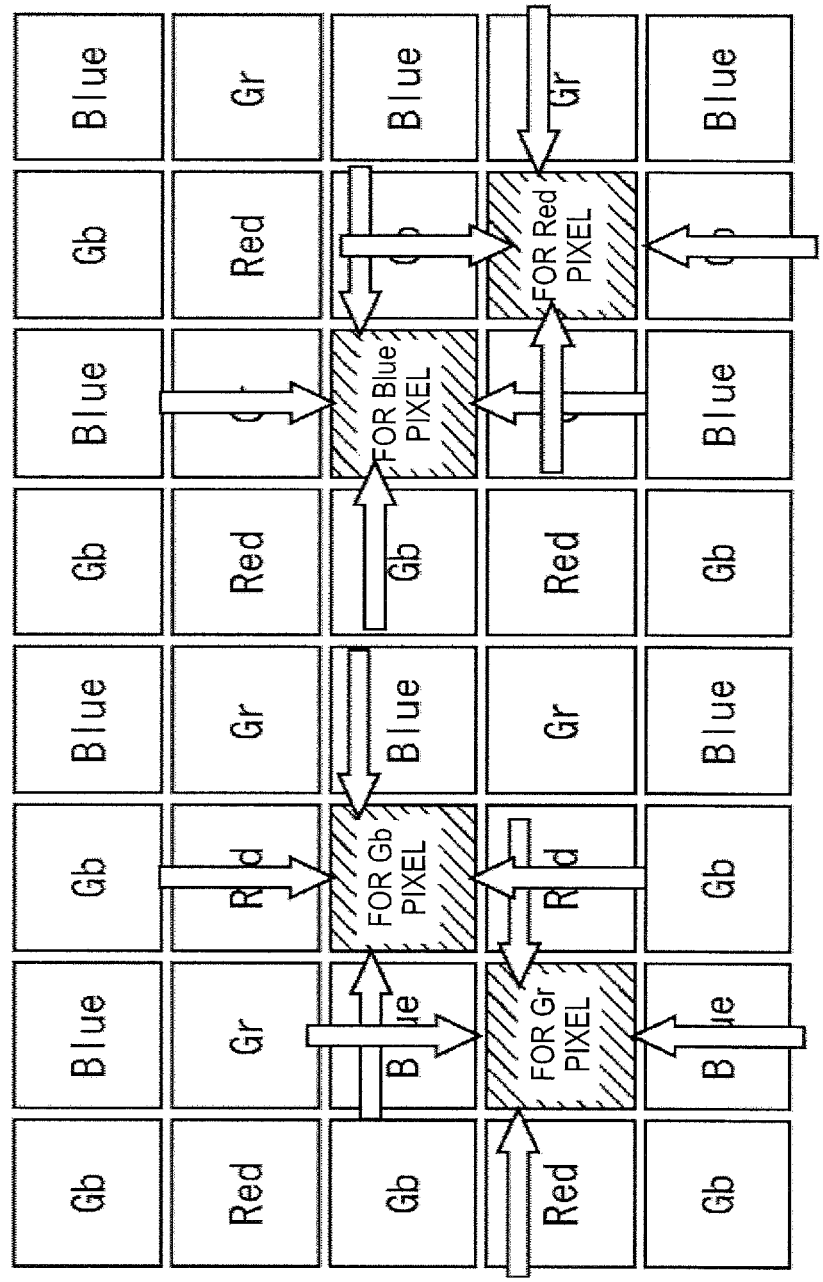
FIG. 11 is a diagram illustrating another arrangement example of the color mixing detection pixel.

If the amount of color mixing in an oblique direction is sufficiently small, then a plurality of the color mixing detection pixels may be disposed in contiguous relation to each other in the oblique direction, as an example shown in FIG. 11. Further, as long as the detection of the amount of color mixing will be not affected by any arrangement direction including the oblique direction, the plurality of color mixing detection pixels can be arranged in contiguous relation to each other.

As described above, the amount of color mixing can be more accurately detected and calculated by providing the color mixing detection pixel within the effective pixel area. Also, the amount of color mixing can be more accurately calculated by providing the color mixing detection pixel for each color. Moreover, the amount of color mixing can be more easily calculated by providing the light shielding layer at the color mixing detection pixel. The light shielding layer can be implemented in an easy way such as by forming a wiring layer or by providing a metal layer in the form of a photodiode. Furthermore, with this method, a proper light shielding layer can be provided depending on the amount or angle of the incident light, or the like, thereby more effectively blocking the light.

[Signal Correction]

Figure 12:
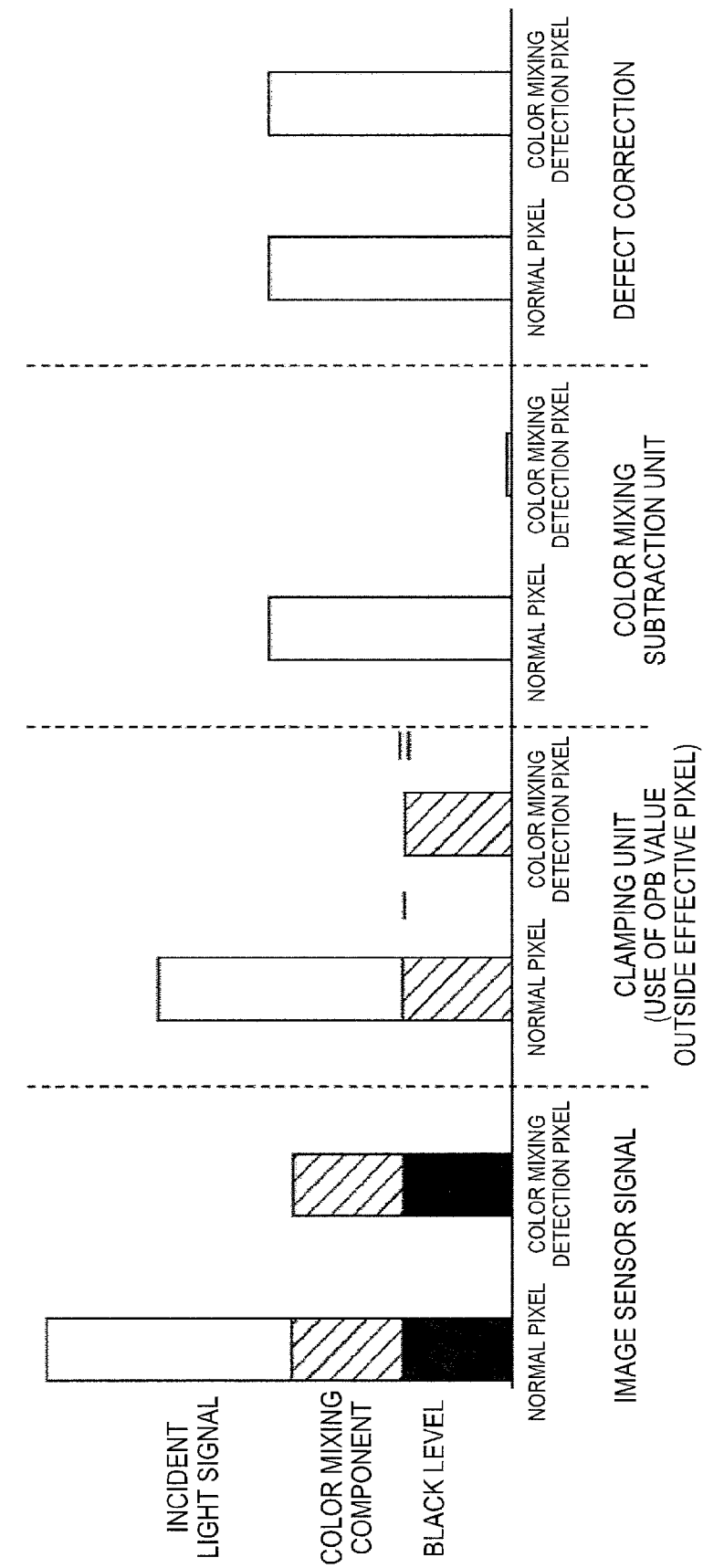
FIG. 12 is a diagram illustrating an example of how the amount of color mixing is subtracted.

The image signal (image sensor signal) obtained by the image sensor with color filter 103 as described above is corrected as shown in FIG. 12. In the clamping unit 105, the black level detected in the OPB area is removed from both a pixel value of the normal pixel and a pixel value of the color mixing detection pixel 121. Subsequently, in the color mixing subtraction unit 106, the pixel value (amount of color mixing) of the color mixing detection pixel 121 is subtracted from the pixel value of the normal pixel. This allows the pixel value of the normal pixel to become a proper pixel value corresponding to only a light incident upon the target pixel. In contrast, there is no light incident upon the color mixing detection pixel 121, thus the pixel value of the color mixing detection pixel 121 is not a proper pixel value equivalent to the pixel value of the normal pixel. As a result, the defect correction unit 107 corrects the pixel value by regarding the color mixing detection pixel 121 as a defective pixel.

In practice, there may be a case that the pixel value of the color mixing detection pixel is different from the actual amount of color mixing of the normal pixel. Thus, for example, as described below, it is possible to provide a configuration that the amount of color mixing of the position of the normal pixel is estimated by using a plurality of the actual color mixing detection pixels and the value obtained by the estimation is subtracted from the normal pixel.

The method of detecting a black level in the OPB area and the method of subtracting the black level by the clamping unit 105 are similar to methods in the related art.

[Color Mixing Subtraction Unit]

Figure 13:
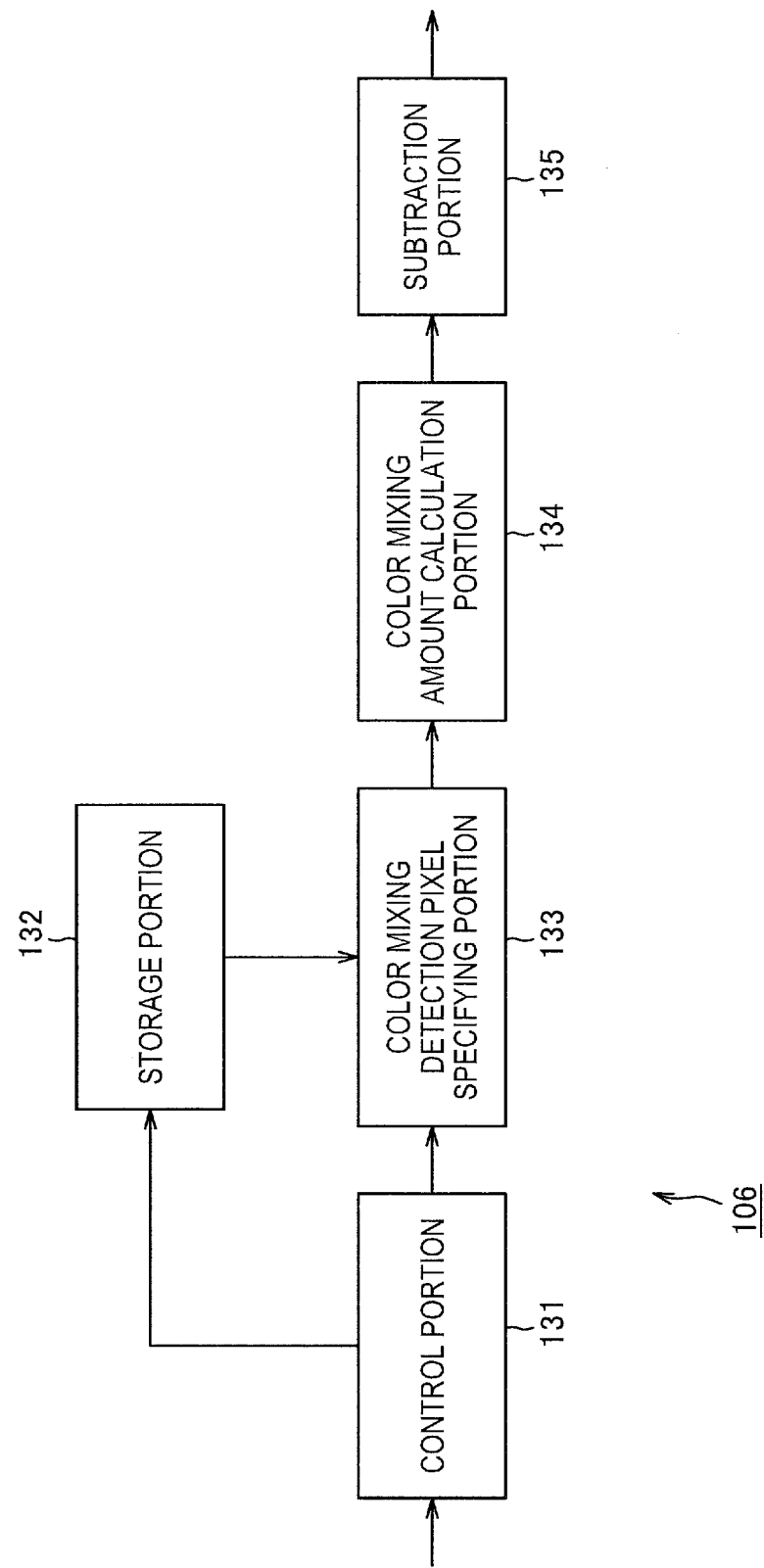
FIG. 13 is a diagram illustrating a configuration example of a color mixing subtraction unit.

FIG. 13 is a block diagram illustrating a configuration example of the color mixing subtraction unit 106 of FIG. 1.

As shown in FIG. 13, the color mixing subtraction unit 106 includes a control portion 131, a storage portion 132, a color mixing detection pixel specifying portion 133, a color mixing amount calculation portion 134, and a subtraction portion 135.

The control portion 131 is configured to determine whether or not a target pixel to be processed is the color mixing detection pixel 121. The control portion 131 knows beforehand about the position of the color mixing detection pixel 121. If the target pixel to be processed is determined to be the color mixing detection pixel 121, then the control portion 131 supplies a pixel value of the target pixel to the storage portion 132, and causes the storage portion 132 to store the pixel value. On the other hand, if the target pixel to be processed is not determined to be the color mixing detection pixel 121, then the control portion 131 causes the color mixing detection pixel specifying portion 133 to specify the color mixing detection pixel 121 to be used to subtract the amount of color mixing.

The storage portion 132 is configured to store the pixel value of the color mixing detection pixel supplied from the control portion 131. The storage portion 132 supplies the stored pixel value to the color mixing detection pixel specifying portion 133 at a predetermined timing or in response to a request from the external.

The color mixing detection pixel specifying portion 133 is configured to specify the color mixing detection pixel 121 to be used to subtract the amount of color mixing of the target pixel. The color mixing detection pixel specifying portion 133 preferentially selects the color mixing detection pixel 121 positioned in the closest possible proximity to the target pixel from around the target pixel as the color mixing detection pixel 121 to be used to subtract the amount of color mixing. The color mixing detection pixel specifying portion 133 obtains a pixel value of the specified color mixing detection pixel 121 from the storage portion 132, and supplies the obtained pixel value to the color mixing amount calculation portion 134.

The color mixing amount calculation portion 134 is configured to calculate the amount of color mixing of the target pixel using the pixel value of the color mixing detection pixel 121 specified by the color mixing detection pixel specifying portion 133. The color mixing amount calculation portion 134 supplies the calculated amount of color mixing to the subtraction portion 135.

The subtraction portion 135 is configured to subtract the amount of color mixing supplied by the color mixing amount calculation portion 134 from the pixel value of the target pixel. The subtraction portion 135 supplies the pixel value of the target pixel from which the amount of color mixing is subtracted to the defect correction unit 107.

[Calculation of Amount of Color Mixing]

A method of calculating an amount of color mixing by the color mixing amount calculation portion 134 will be described below. The color mixing detection pixel specifying portion 133 selects a plurality of its neighboring color mixing detection pixels for a target pixel. The color mixing amount calculation portion 134 calculates the amount of color mixing of the target pixel using the plurality of the color mixing detection pixels.

Figure 14:
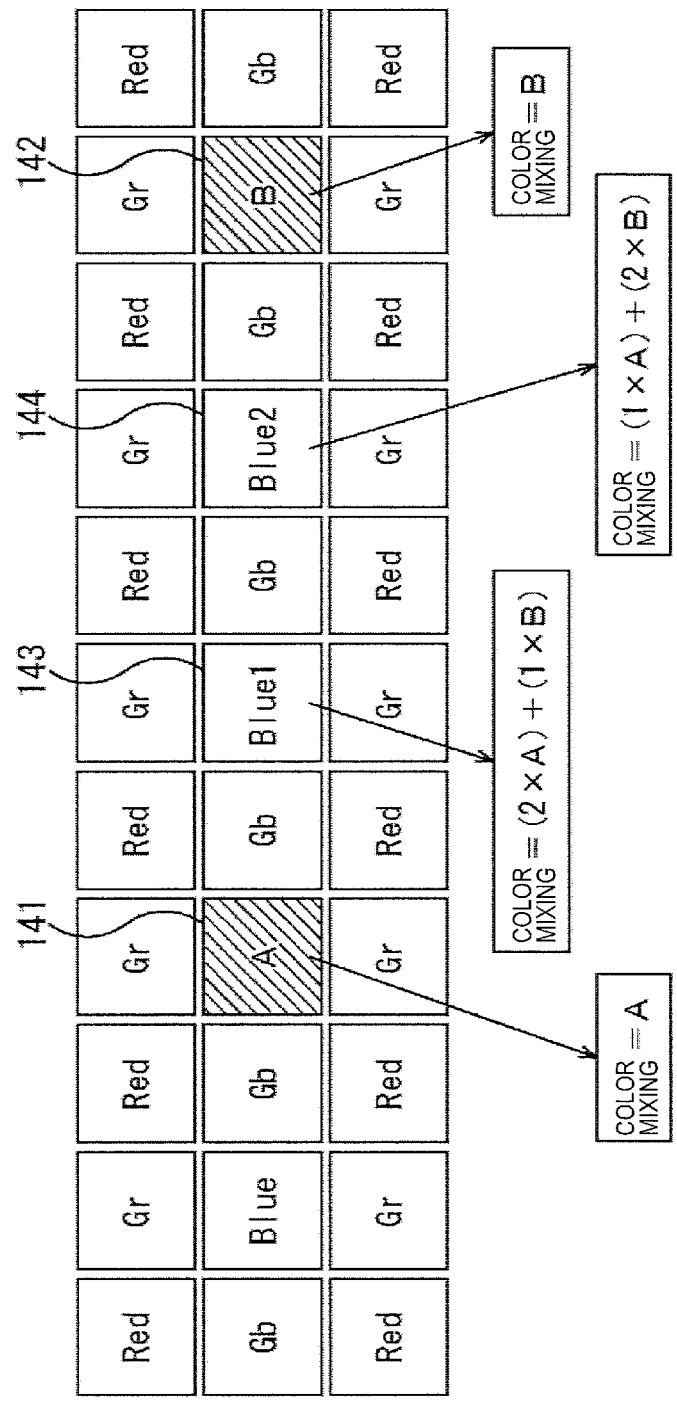
FIG. 14 is a diagram illustrating an example of calculating the amount of color mixing.

As an example shown in FIG. 14, the color mixing amount calculation portion 134 calculates an amount of color mixing of the target pixel (normal pixel) of blue color (B) using the amount of color mixing detected in a color mixing detection pixel 141 and a color mixing detection pixel 142 (both pixels are color mixing detection pixels corresponding to blue color (B)). In addition, it is assumed that a light amount detected in the color mixing detection pixel 141 is the amount of color mixing A. It is assumed that a light amount detected in the color mixing detection pixel 142 is the amount of color mixing B. In this case, the color mixing amount calculation portion 134 can obtain the amount of color mixing A and the amount of color mixing B by adding weights according to a distance from the target pixel to the color mixing detection pixel 141 and a distance from the target pixel to the color mixing detection pixel 142.

As an example shown in FIG. 14, there are two normal pixels of blue color (B) between the color mixing detection pixel 141 and the color mixing detection pixel 142. These normal pixels divide a space between the two color mixing detection pixels into three equal parts. If the blue color pixel (Blue1) 143 of the two pixels near the color mixing detection pixel 141 having the amount of color mixing A is the target pixel, then the amount of color mixing of the blue color pixel (color mixing component of Blue1) can be obtained as the following Equation (1).

$$\text{Color mixing component of Blue1} = (2 \times A) + (1 \times B)/(2+1) \quad (1)$$

Also, as the example shown in FIG. 14, if the blue color pixel (Blue2) 144 near the color mixing detection pixel 142 having the amount of color mixing B is the target pixel, then the amount of color mixing of the blue color pixel (color mixing component of Blue2) can be obtained as the following Equation (2).

$$\text{Color mixing component of Blue2} = (1 \times A) + (2 \times B)/(1+2) \quad (2)$$

Figure 15:
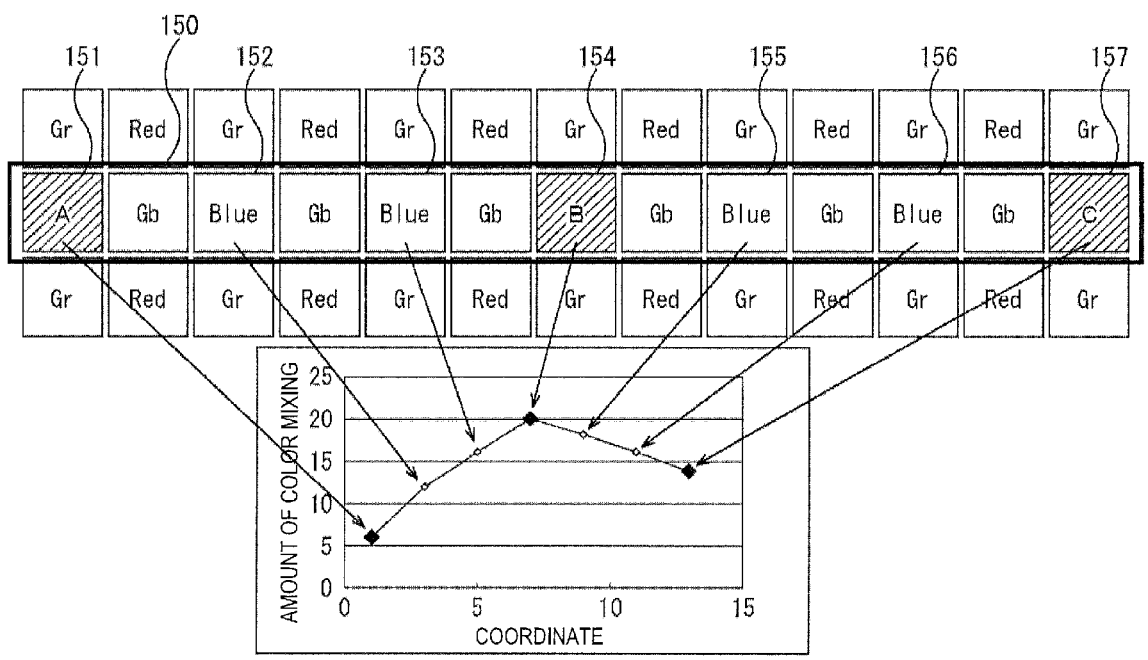
FIG. 15 is a diagram illustrating an example of calculating the amount of color mixing.

As an example shown in FIG. 15, it is assumed that the amounts of color mixing of a blue color pixel 152 and a blue color pixel 153 in a frame 150 are obtained. As shown in FIG. 15, the blue color pixel 152 and the blue color pixel 153 are both positioned between a color mixing detection pixel 151 of blue color and a color mixing detection pixel 154 of blue color. Thus, as shown in the graph of FIG. 15, the amounts of color mixing of the blue color pixel 152 and the blue color pixel 153 are both calculated by linear interpolation using the amount of color mixing A of the color mixing detection pixel 151 and the amount of color mixing B of the color mixing detection pixel 154.

Further, for example, a blue color pixel 155 and a blue color pixel 156 are both positioned between the color mixing detection pixel 154 of blue color and a color mixing detection pixel 157 of blue color. Thus, as shown in the graph of FIG. 15, the amounts of color mixing of the blue color pixel 155 and the blue color pixel 156 are both calculated by linear interpolation using the amount of color mixing B of the color mixing detection pixel 154 and the amount of color mixing C of the color mixing detection pixel 157.

Figure 16:
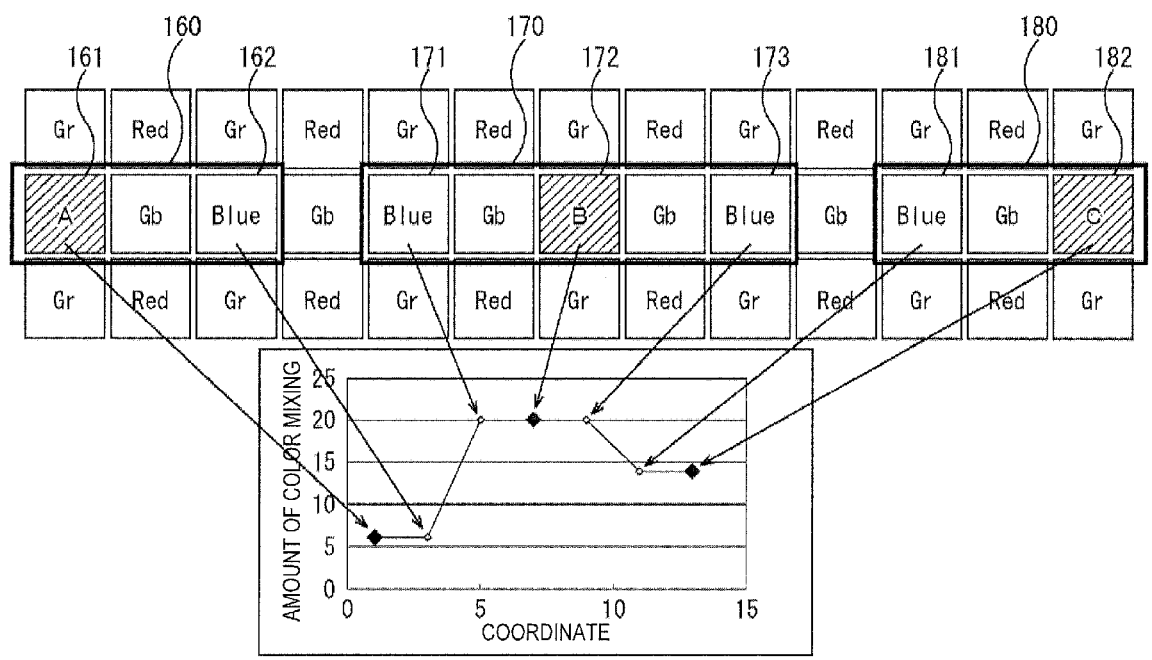
FIG. 16 is a diagram illustrating an example of calculating the amount of color mixing.

The method of calculating the amount of color mixing is not limited to those described above. For example, as an example shown in FIG. 16, there may be provided a method of dividing into each area and uniformly subtracting the amount of color mixing in each area. In this method, as the example shown in FIG. 16, the amount of color mixing of the nearest neighboring color mixing pixel is employed as the amount of color mixing of the concerned area to be processed. Thus, as shown in the graph of FIG. 16, the amount of color mixing of a blue color pixel 162 in a frame 160 is set to the amount of color mixing A of a color mixing detection pixel 161 of blue color. In addition, the amounts of color mixing of a blue color pixel 171 and a blue color pixel 173 in a frame 170 are set to the amount of color mixing B of a color mixing detection pixel 172 of blue color. The amount of color mixing of a blue color pixel 181 in a frame 180 is set to the amount of color mixing C of a color mixing detection pixel 182 of blue color. This method allows the amount of color mixing of the concerned area to be obtained easier than the method of using the weight addition described above. However, since the amount of color mixing is generally less likely to be suddenly changed, the method of using the weight addition described above can more accurately obtain the amount of color mixing.

Although there has been described a one-dimensional arrangement as an example, the operations described above may be performed using a two-dimensional arrangement. Specifically, the amount of color mixing can be calculated using a color mixing detection pixel positioned nearer to the target pixel in the two-dimensional arrangement (in any direction such as up, down, left, right or oblique).

Figure 17:
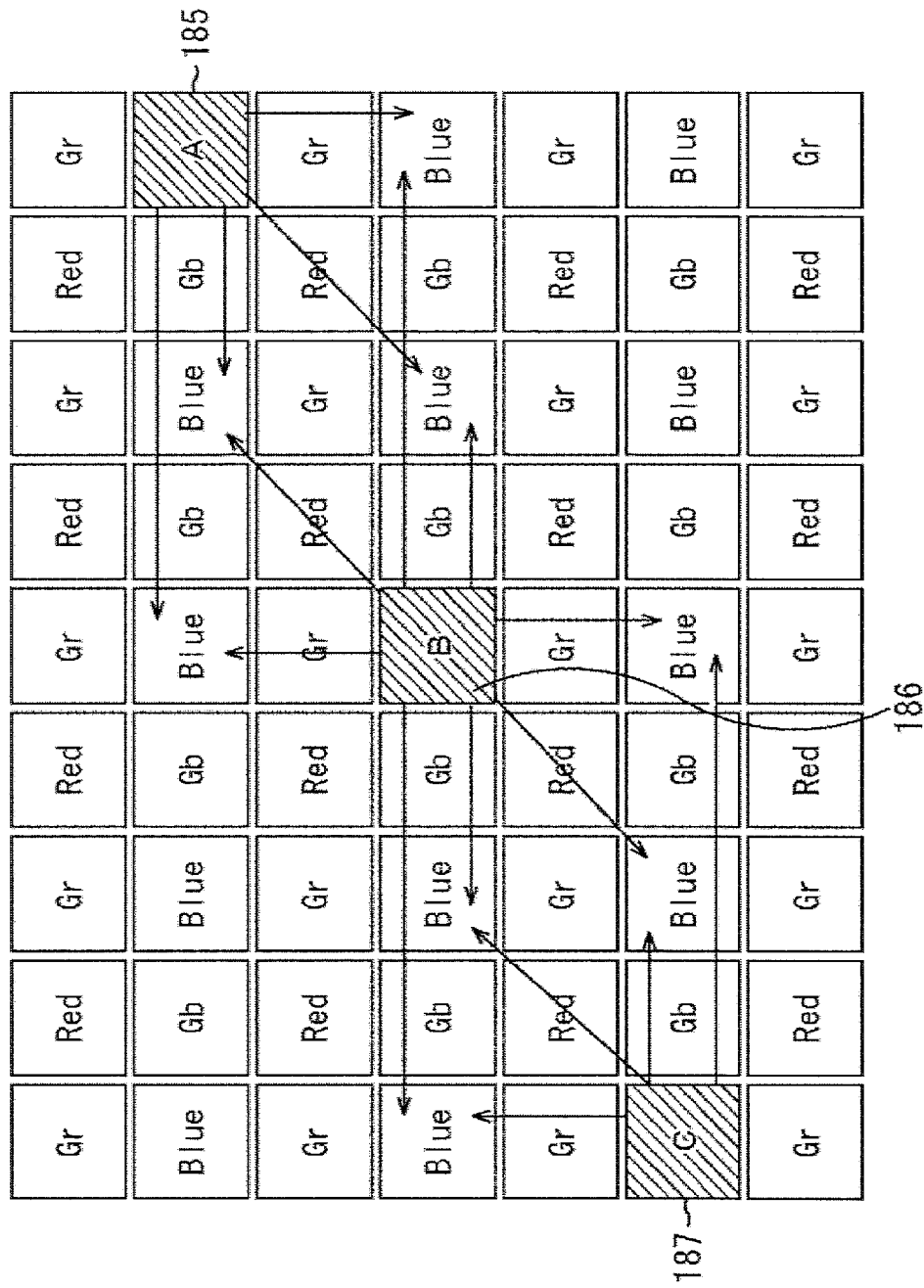
FIG. 17 is a diagram illustrating an example of calculating the amount of color mixing.

As an example shown in FIG. 17, color mixing detection pixels 185 to 187 are color mixing detection pixels of blue color. The amounts of color mixing of other blue color pixels are calculated by adding weights of the amount of color mixing of two pixels positioned near to the target pixel in the two-dimensional arrangement.

For example, in the two-dimensional arrangement, color mixing detection pixels (two pixels) having a shorter distance to the target pixel from which its amount of color mixing is calculated are assumed to be the color mixing detection pixels 185 and 186. In this case, the amount of color mixing of the target pixel is calculated by adding weights to the amount of color mixing A of the color mixing detection pixel 185 and the amount of color mixing B of the color mixing detection pixel 186 according to the distances between the respective color mixing detection pixels and the target pixel.

The number of the color mixing detection pixel used to calculate the amount of color mixing is not particularly limited and can be suitably selected. For example, the number of the color mixing detection pixel may be three or more.

As described above, since the amount of color mixing varies depending on the colors or surrounding structures (neighboring colors), only the color mixing detection pixel having the same color as the concerned area is used to calculate the amount of color mixing. For example, in order to calculate the amount of color mixing of a blue color pixel, the amount of color mixing of the color mixing detection pixel of blue color nearer to the blue color pixel is used.

[Correction of Amount of Color Mixing]

Figure 18:
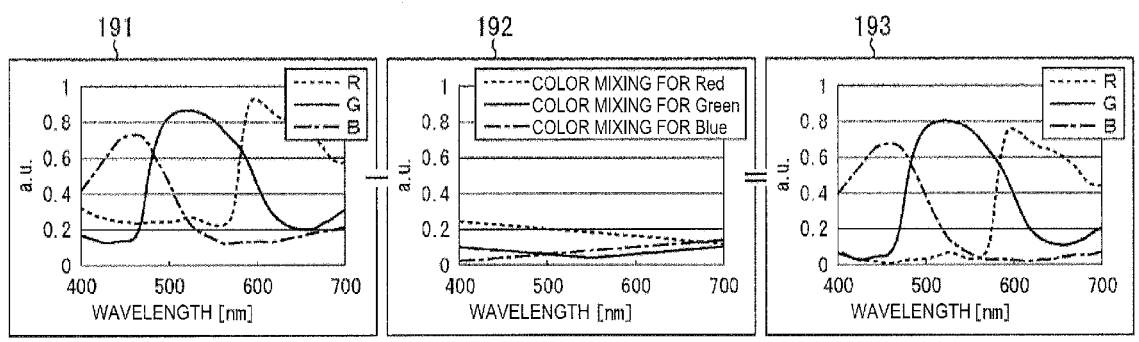
FIG. 18 is a diagram illustrating an example of how the amount of color mixing is subtracted.

As shown in FIG. 18, the subtraction portion 135 subtracts the amount of color mixing 192 calculated as described above from a pixel value 191 from which a black level is removed, thereby obtaining a pixel value 193 which is a value from which the black level and the amount of color mixing are subtracted.

[Defect Correction]

Figure 19:
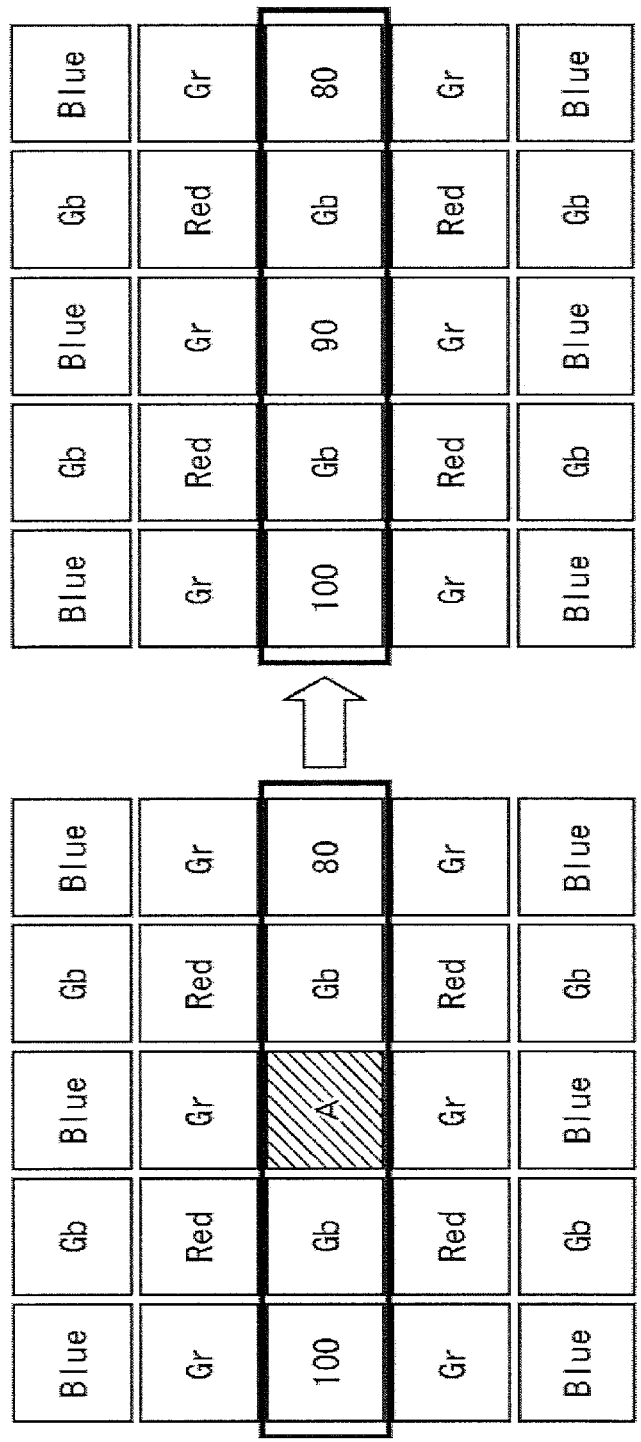
FIG. 19 is a diagram illustrating an example of how defect is corrected.

The defect correction unit 107 corrects a color mixing detection pixel by regarding the color mixing detection pixel as a defective pixel. Since the color mixing detection pixel outputs only the amount of color mixing, the proper image may not be obtained without any further processing. Thus, the defect correction unit 107 regards the color mixing detection pixel as a defective pixel, and replaces the pixel with a signal value obtained from a normal pixel. The method of correcting the defect is not limited to a particular method. As an example shown in FIG. 19, there may be provided a method (for example, linear interpolation) of estimating from an output value (value after subtracting the color mixing) of each neighboring normal pixels having same color. In the example shown in FIG. 19, the pixel value A of the color mixing detection pixel of blue color is corrected and changed into the pixel value 80 from two pixel values 100 and 80 of the neighboring blue color pixels.

The imaging apparatus 100 can more accurately correct color mixing by correcting the amount of color mixing and so on as described above.

[Procedure of Imaging Process]

Each of the processes performed by individual units of the imaging apparatus 100 will be described. Referring to the flowchart of FIG. 20, an exemplary procedure of imaging process performed by the imaging apparatus 100 upon capturing a subject will be described.

When the imaging process is started, in step S101, the image sensor with color filter 103 converts the incident light of each pixel into electrical signals and reads out each pixel signal. In step S102, the A/D converter 104 performs A/D conversion on the respective pixel signals obtained in the step S101.

In step S103, the clamping unit 105 subtracts the black level detected in the OPB area from the respective pixel values. In step S104, the color mixing subtraction unit 106 subtracts the amount of color mixing from the pixel values. In step S105, the defect correction unit 107 corrects the pixel value of the defective pixel having a color mixing detection pixel.

In step S106, the demosaic unit 108 performs a demosaic process and converts RAW data into RGB data. In step S107, the linear matrix unit 109 performs a color correction process depending on the characteristics of an input device. In step S108, the gamma correction unit 110 performs a gamma correction process depending on the characteristics of an output device.

In step S109, the luminance and chroma signal generation unit 111 generates a luminance signal and a chrominance signal (Y, Cr, and Cb data) from RGB data. In step S110, the interface (I/F) unit 112 outputs the luminance and chrominance signals generated in step S109 to an external storage device or display device, and then the imaging process is finished.

[Procedure of Color Mixing Subtraction Process]

An exemplary procedure of the color mixing subtraction process performed at step S104 of FIG. 20 will be described with reference to the flowchart of FIG. 21.

When the color mixing subtraction process is started, in step S131, the control portion 131 determines whether or not a target pixel to be processed is a color mixing detection pixel. If the target pixel is determined to be the color mixing detection pixel, then the control portion 131 moves the process to step S132. In step S132, the storage portion 132 stores a pixel value of the color mixing detection pixel, and the process proceeds to step S137.

In step S131, if the target pixel is not determined to be the color mixing detection pixel, then the control portion 131 moves the process to step S133.

In step S133, the color mixing detection pixel specifying portion 133 specifies the color mixing detection pixel to be used to calculate the amount of color mixing of the target pixel according to a predetermined method. For example, the color mixing detection pixel specifying portion 133 specifies the predetermined number of the color mixing detection pixel nearer to the target pixel as the color mixing detection pixel to be used to calculate the amount of color mixing of the target pixel. In step S134, the color mixing detection pixel specifying portion 133 obtains the pixel value of the color mixing detection pixel specified in step S133 from the storage portion 132.

In step S135, the color mixing amount calculation portion 134 calculates the amount of color mixing of the target pixel by using the pixel value of the color mixing detection pixel obtained in step S134. In step S136, the subtraction portion 135 subtracts the amount of color mixing calculated in step S135 from the pixel value of the target pixel (the pixel of interest) to be processed. When the subtraction process is completed, the subtraction portion 135 moves the process to step S137.

In step S137, the control portion 131 determines whether there is any unprocessed pixel. When it is determined that there is a pixel on which the subtraction is not performed, the process returns to step S131 and then repeats the subsequent steps. Furthermore, in step S137, if it is determined that all the amount of color mixing are subtracted from the normal pixels, then the control portion 131 finishes the process and returns it to steps of FIG. 20.

By performing the processes as described above, the imaging apparatus 100 can correct color mixing more accurately. In particular, it is possible to optimally correct the amount of color mixing depending on any imaging conditions such as a light amount, a color temperature of light, an angle of incidence, a subject, and so on. Moreover, the color mixing detection pixel is arranged in an actual device, and thus it is possible to correct color mixing more accurately and to prevent a false color by error correction from being generated. In addition, although the color mixing causes degradation of S/N ratio or color reproducibility, it is possible to improve the color mixing and S/N ratio in accordance with embodiments of the present disclosure.

The resolution can be also enhanced by the improvement of color mixing. Although it has been described that the color mixing causes a blur occurring when a photon or electron is moved between neighboring pixels, it is possible to correct this color mixing causing a blur. Thus, it is possible to obtain the output having a high definition resolution without a blur. Furthermore, the correction of color mixing may be applied to a wide range of applications and may be not limited to the Bayer array. Also, this technique is useful for improving the color mixing of many devices such as a clear bit type or a vertical spectral structure.

Second Embodiment

[Configuration of Imaging Apparatus]

Figure 22:
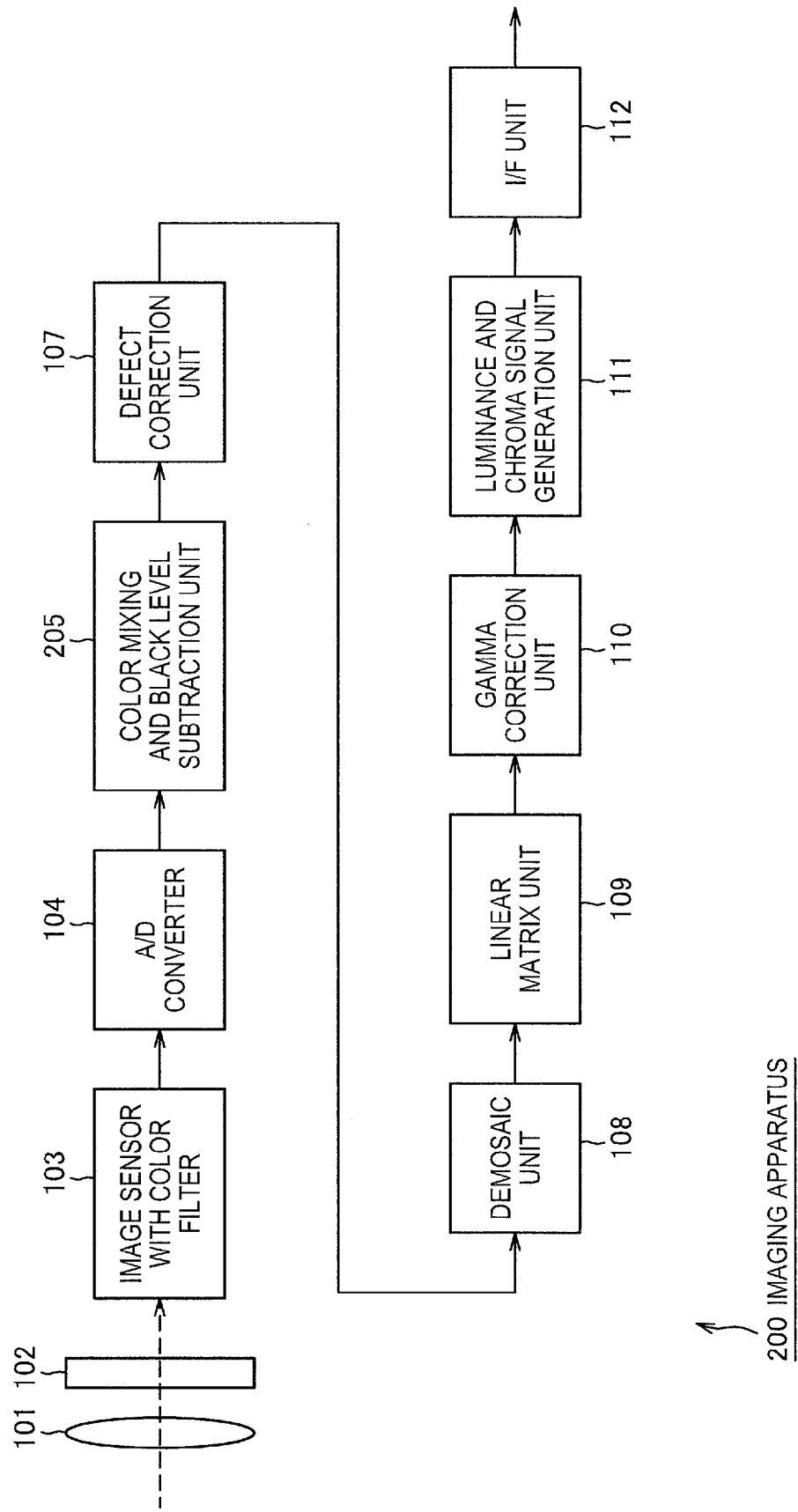
FIG. 22 is a diagram illustrating another configuration example of the imaging apparatus.

It is possible to perform the subtraction of black level and the correction of color mixing simultaneously. FIG. 22 is a diagram illustrating a configuration of the imaging apparatus according to an embodiment of the present disclosure. The imaging apparatus 200 shown in FIG. 22 is basically similar to the imaging apparatus 100 shown in FIG. 1. That is, the imaging apparatus 200 has a similar configuration to the imaging apparatus 100 and performs a similar process to the imaging apparatus 100.

The imaging apparatus 200 includes a color mixing and black level subtraction unit 205, instead of the clamping unit 105 and the color mixing subtraction unit 106 of the imaging apparatus 100.

Figure 23:
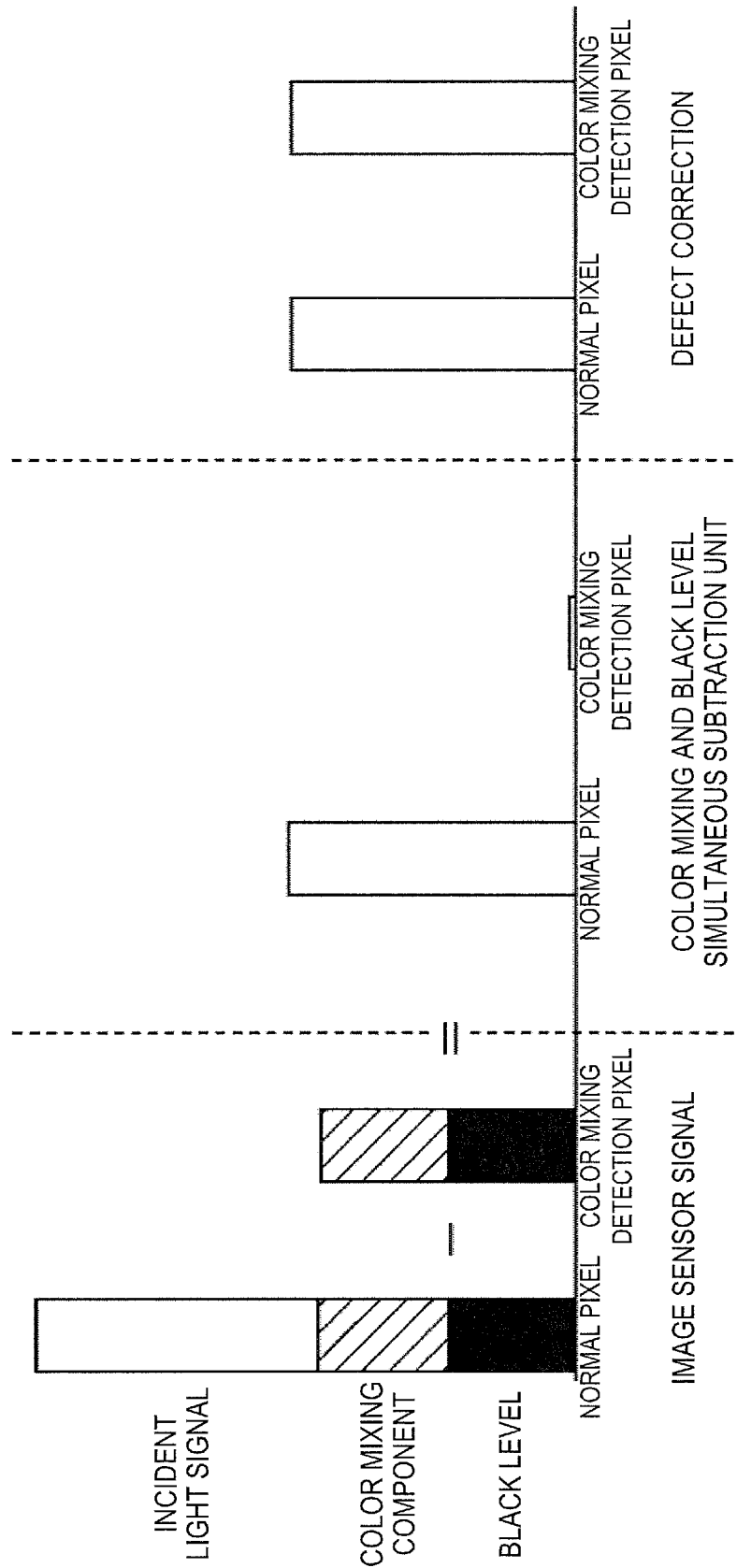
FIG. 23 is a diagram illustrating another example of how the amount of color mixing is subtracted.

The color mixing and black level subtraction unit 205 performs the subtraction of the color mixing and black level simultaneously for the pixel data on which A/D conversion is performed. More specifically, the color mixing and black level subtraction unit 205 subtracts a pixel value of the color mixing detection pixel from a pixel value of the normal pixel in the state before the black level is removed, as shown in FIG. 23. The color mixing detection pixel originally becomes a black level because the color mixing detection pixel is light-shielded. The color mixing from its neighboring pixels is added to the black level. The total value obtained from addition of the black level and color mixing is outputted from the image sensor. Thus, the only incident light signal desired to be obtained can be acquired by subtracting the total value from a normal pixel.

In the first embodiment, the black level is detected by using OPB area outside an effective area. In accordance with the second embodiment, the black level and the amount of color mixing are both detected in a plurality of the color mixing detection pixels disposed within a sensor. Therefore, it is possible to eliminate the need of OPB area in accordance with the second embodiment. So, the image sensor with color filter having a smaller chip size is possible and the cost can be reduced.

Figure 24:
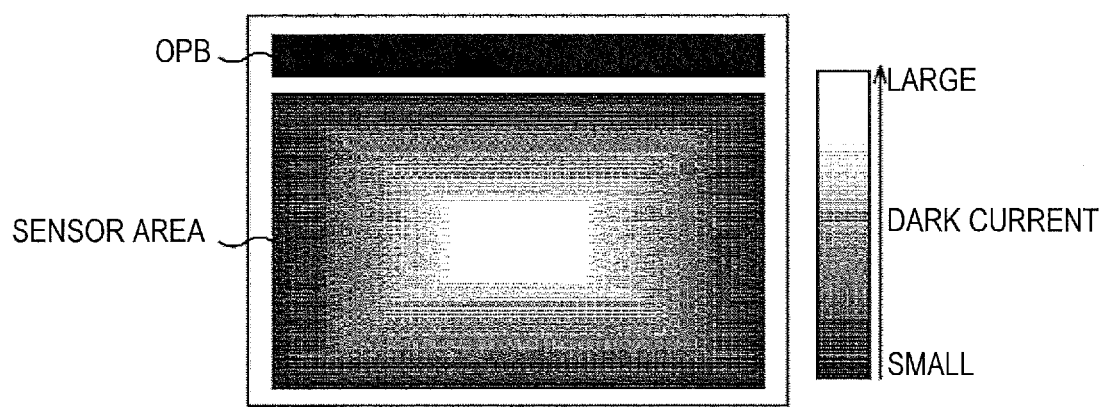
FIG. 24 is a diagram illustrating an example of how a dark current is shading.

As shown in FIG. 24, the black level containing a dark output (dark current) is not necessarily uniform in the sensor due to manufacturing variations. In this case, because respective black levels are obtained for each area as the color mixing, dark current shading can be corrected simultaneously.

Similar to the first embodiment, the pixel value of the color mixing detection pixel may be not necessarily completely consistent with the actual amount of color mixing of the normal pixel. In this case, in a similar way as described in the first embodiment, a pixel value (total value obtained from addition of the black level and the amount of color mixing) of a color mixing detection pixel corresponding to a position of a normal pixel may be estimated using pixel values of a plurality of the color mixing detection pixels, and then the estimation value may be subtracted from the pixel value of the normal pixel.

[Procedure of Imaging Process]

A procedure example of the imaging process in the case as described above will be described with reference to the flowchart of FIG. 25. As shown in the flowchart of FIG. 25, substantially similar processes to the case described above with respect to the flowchart of FIG. 20 are performed.

Figure 20:
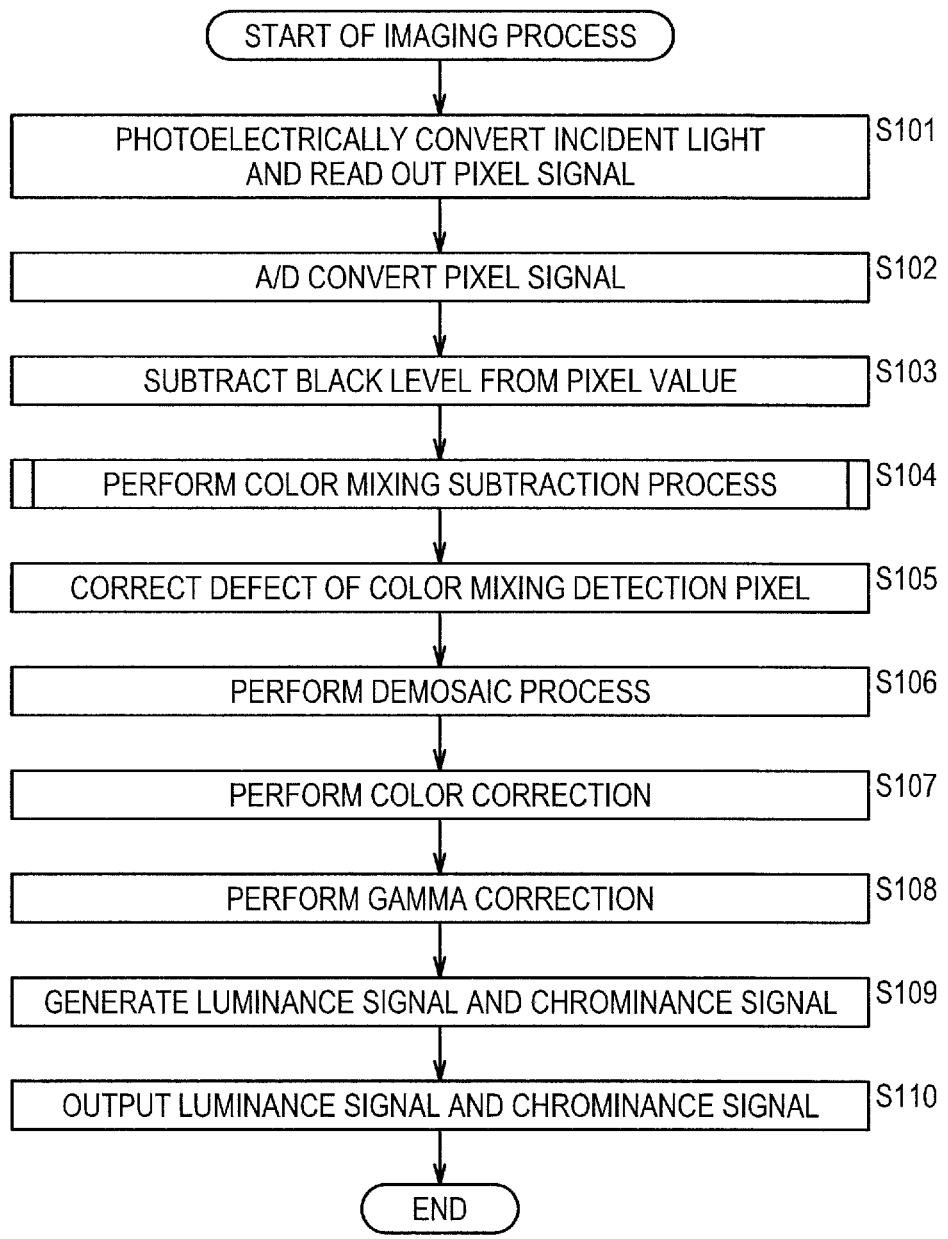
FIG. 20 is a flowchart illustrating a procedure example of an imaging process.
Figure 25:
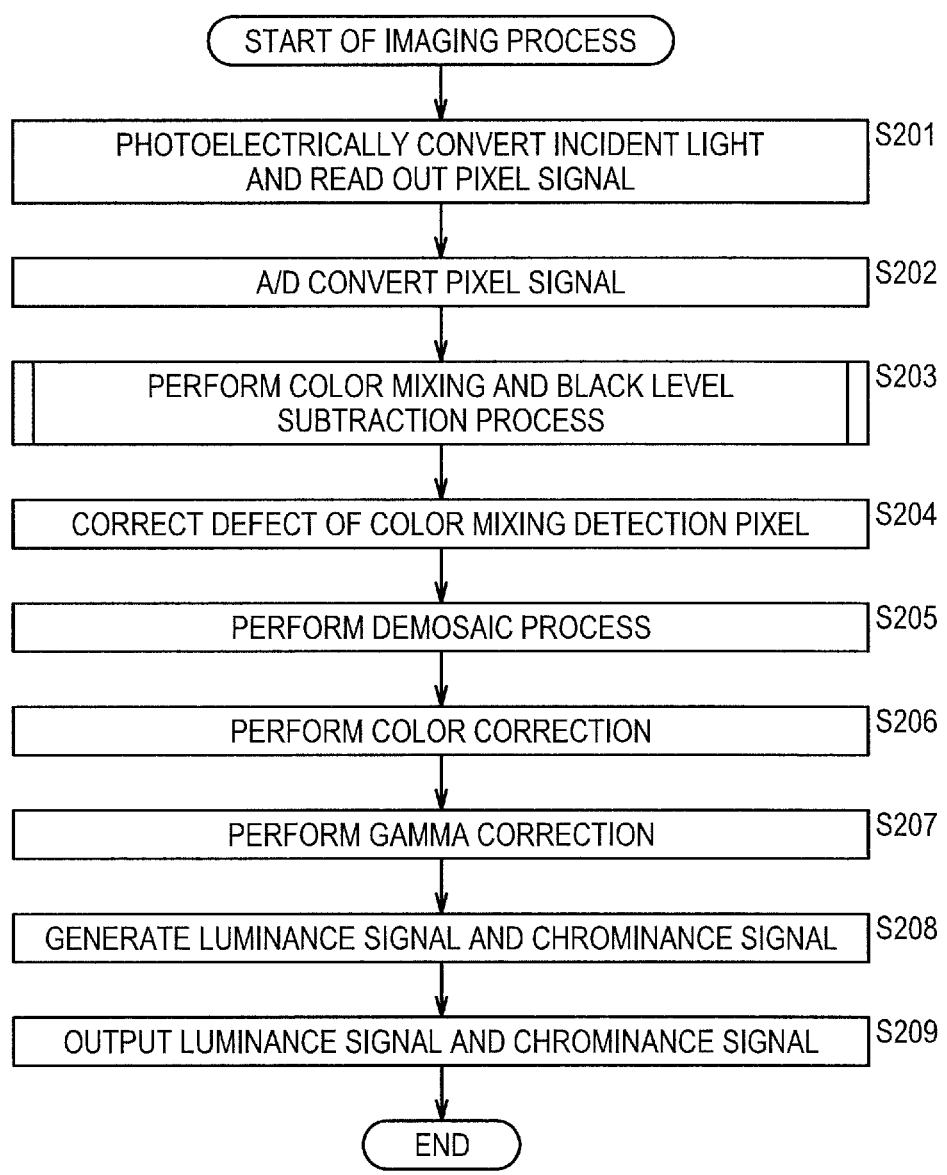
FIG. 25 is a flowchart illustrating another procedure example of the imaging process.

Specifically, each of the processes which will be performed at step S201, step S202, and steps S204 to S209 of FIG. 25 are similar to the respective processes performed at step S101, step S102, and steps S105 to S110 of FIG. 20.

As a difference between the processes of FIG. 20 and FIG. 25, a process of step S203 of FIG. 25 is performed instead of the processes of steps S103 and S104 of FIG. 20. In step S203, the color mixing and black level subtraction unit 205 performs a color mixing and black level subtraction process.

[Procedure of Color Mixing and Black Level Subtraction Process]

Figure 26:
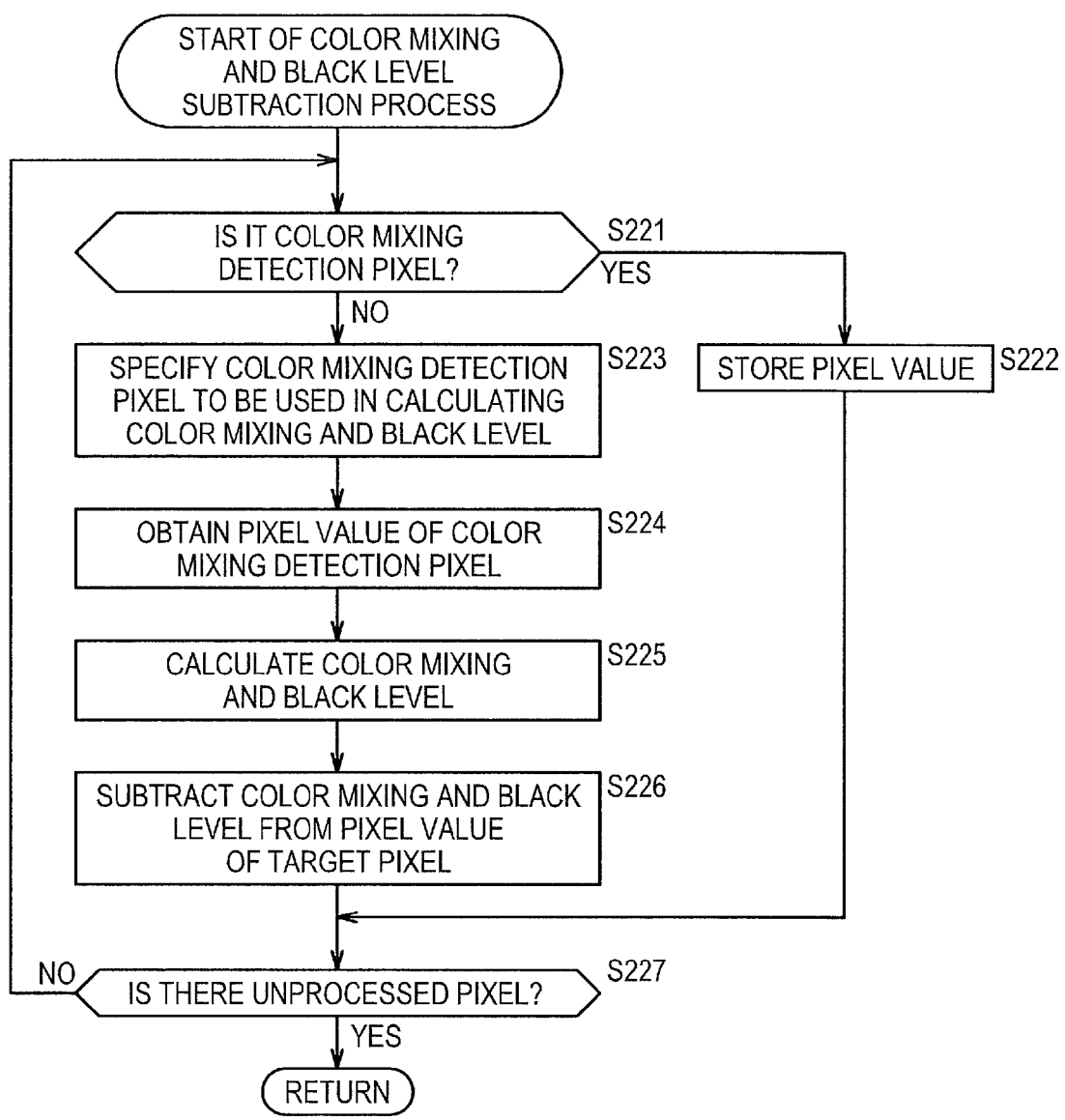
FIG. 26 is a flowchart illustrating a procedure example of a color mixing and black level subtraction process.

Next, referring to the flowchart of FIG. 26, a procedure example of the color mixing and black level subtraction process which is performed at step S203 of FIG. 25 will be described.

The procedure of the color mixing and black level subtraction process is basically similar to the procedure of the color mixing subtraction process described above with reference to the flowchart of FIG. 21, except that the color mixing and black level subtraction process performs the subtraction of black level as well as color mixing. Processes different from the color mixing subtraction process of FIG. 21 will be described below.

In step S223, the color mixing and black level subtraction unit 205 specifies a color mixing detection pixel to be used in calculating the color mixing and black level. Further, in step S225, the color mixing and black level subtraction unit 205 calculates a color mixing and black level of the target pixel to be processed, using the pixel value of the color mixing detection pixel obtained in step S224.

In step S226, the color mixing and black level subtraction unit 205 subtracts the color mixing and black level from the pixel value of the target pixel (the pixel of interest) to be processed.

Like the imaging apparatus 100, the imaging apparatus 200 can more accurately correct color mixing by performing each process as described above.

Third Embodiment

APPLICATION EXAMPLE 1

As a method of estimating the amount of color mixing, a method of calculating a color mixing ratio and then calculating the amount of color mixing may be contemplated. For example, a case where the color mixing detection pixel and the pixel to be corrected may be different from each other in brightness depending on a subject to be captured may be contemplated. In this case, since the amount of color mixing varies depending on light amount, the color mixing detection pixel and the pixel to be corrected may be largely different from each other in the amount of color mixing. For example, if the amount of color mixing obtained from a light part is subtracted from a signal value of a dark part, then the overcorrection is caused (because the more light amount or signal becomes large, the more the amount of color mixing is increased). In order to suppress such a phenomenon, the color mixing ratio may be obtained earlier than the amount of color mixing.

Figure 27:
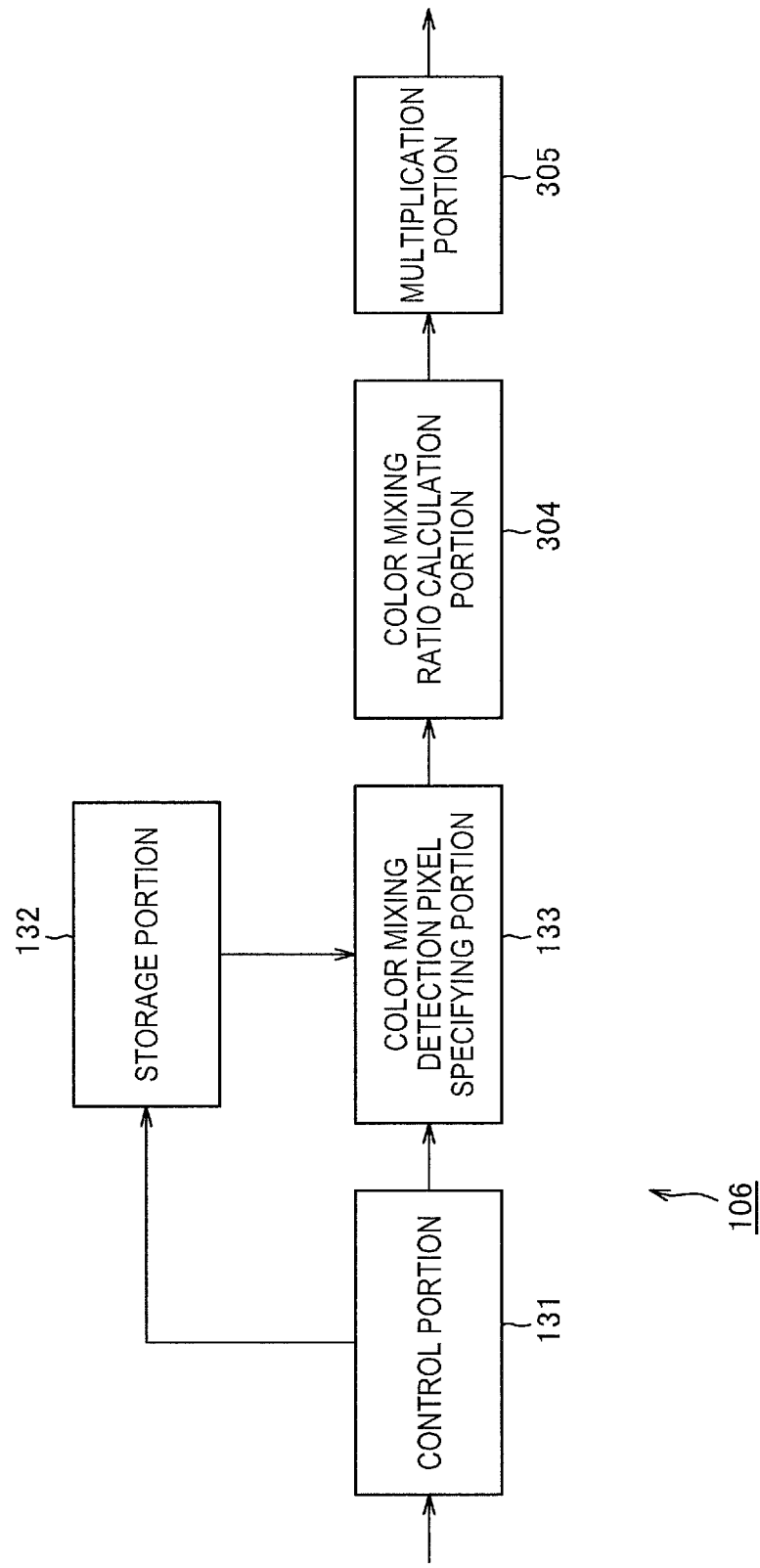
FIG. 27 is a diagram illustrating another configuration example of the color mixing subtraction unit.

FIG. 27 is a block diagram illustrating a configuration example of the color mixing subtraction unit 106 in the case as described above. As shown in FIG. 27, the color mixing subtraction unit 106 has a similar configuration to that shown in FIG. 13, except that the color mixing subtraction unit 106 includes a color mixing ratio calculation portion 304 instead of the color mixing amount calculation portion 134 and includes a multiplication portion 305 instead of the subtraction portion 135.

The color mixing ratio calculation portion 304 calculates a color mixing ratio which indicates a ratio of a color mixing component for the entire pixel value rather than the amount of color mixing of the target pixel to be processed. The multiplication portion 305 multiplies the pixel value of the target pixel to be processed, by the signal ratio of incident light corresponding to the color mixing ratio.

Figure 28:
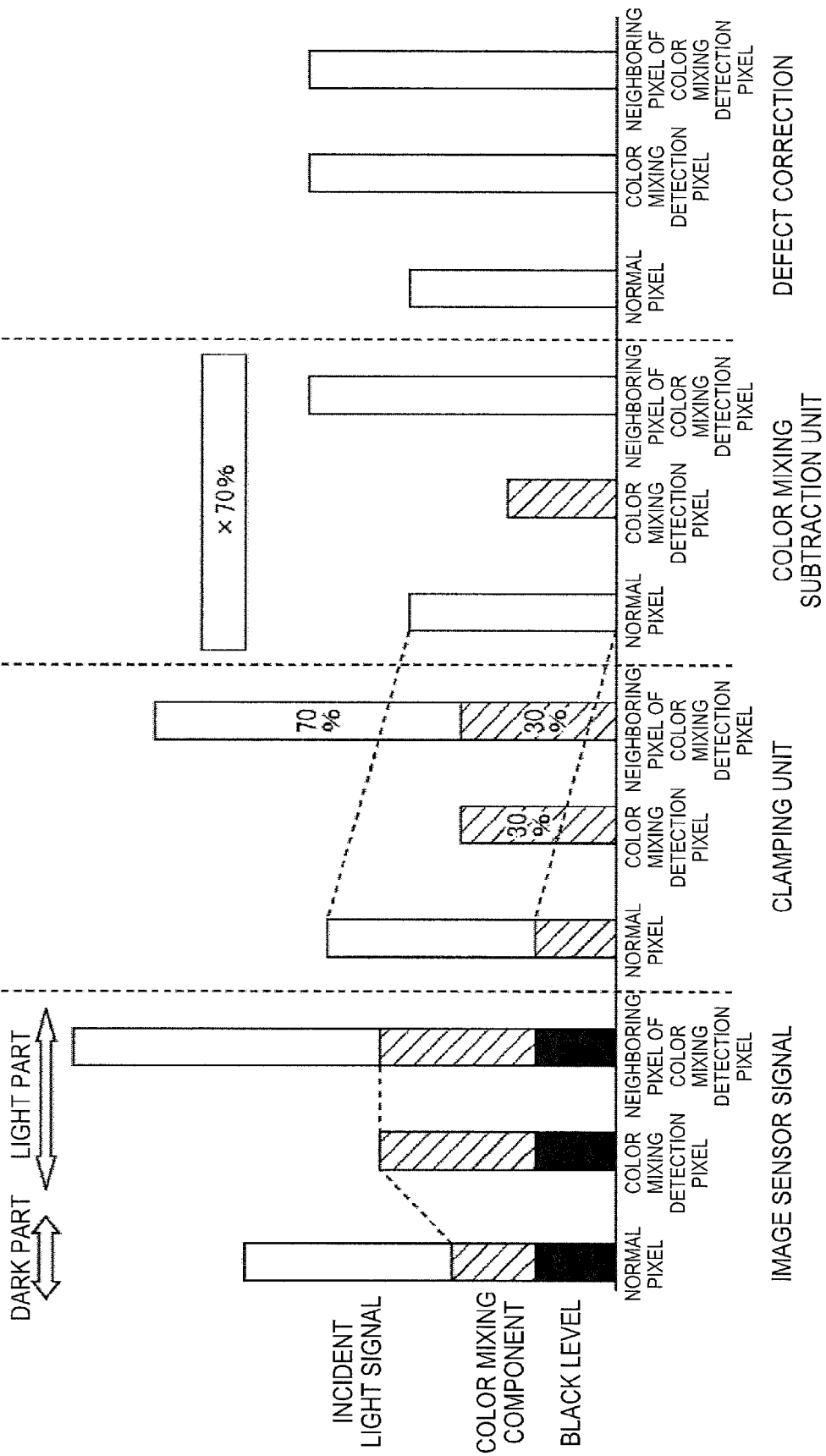
FIG. 28 is a diagram illustrating another operation example of color mixing amount subtraction.

In this case, the correction (subtraction) of color mixing is, for example, performed as the example shown in FIG. 28. The difference is that an output value of an adjacent pixel or neighboring pixel (i.e., surrounding pixel) of a color mixing detection pixel is used for operation. In the output of the clamping unit 105, it is assumed that each pixel value of the target pixel (normal pixel) to be processed necessary to correct the color mixing, a color mixing detection pixel to be used to correct the color mixing, and a surrounding pixel (neighboring pixel of a color mixing detection pixel) of the color mixing detection pixel has respective values, as follows:

Pixel value of normal pixel to correct color mixing: 50
Pixel value of color mixing detection pixel: 30
Pixel value of neighboring pixel of color mixing detection pixel: 100

The neighboring pixel of the color mixing detection pixel is assumed to be positioned nearer to the color mixing detection pixel rather than the normal pixel to correct color mixing.

It is estimated that the color mixing detection pixel has a pixel value of "100", from the fact that a neighboring pixel of the color mixing detection pixel has the pixel value of "100" on the assumption that the color mixing detection pixel is not light-shielded. Specifically, it can be found that the amount of color mixing is "30" and the incident light signal is "70" out of a total signal value of 100. In other words, the color mixing ratio is 30 percent (%) of the total signal value (incident light signal ratio is 70%). Therefore, the color mixing subtraction unit 106 multiplies these respective pixel values by a value of 70% which is a signal ratio of the incident light corresponding to the color mixing ratio.

Pixel value of normal pixel to correct color mixing: 50×0.7=35
Pixel value of color mixing detection pixel: 30×0.7=21
Pixel value of neighboring pixel of color mixing detection pixel: 100×0.7=70

The defect correction unit 107 further performs defect correction of the color mixing detection pixel (replaced by neighboring pixel value and so on).

Output value of normal pixel to correct color mixing: 35
Color mixing detection pixel: 70
Neighboring pixel of color mixing detection pixel: 70

This enables a desired signal value without color mixing to be obtained. The estimation method described above with reference to FIGS. 14 to 17 may be applied to the color mixing ratio in a similar way to the amount of color mixing as described above.

[Procedure of Color Mixing Subtraction Process]

Figure 29:
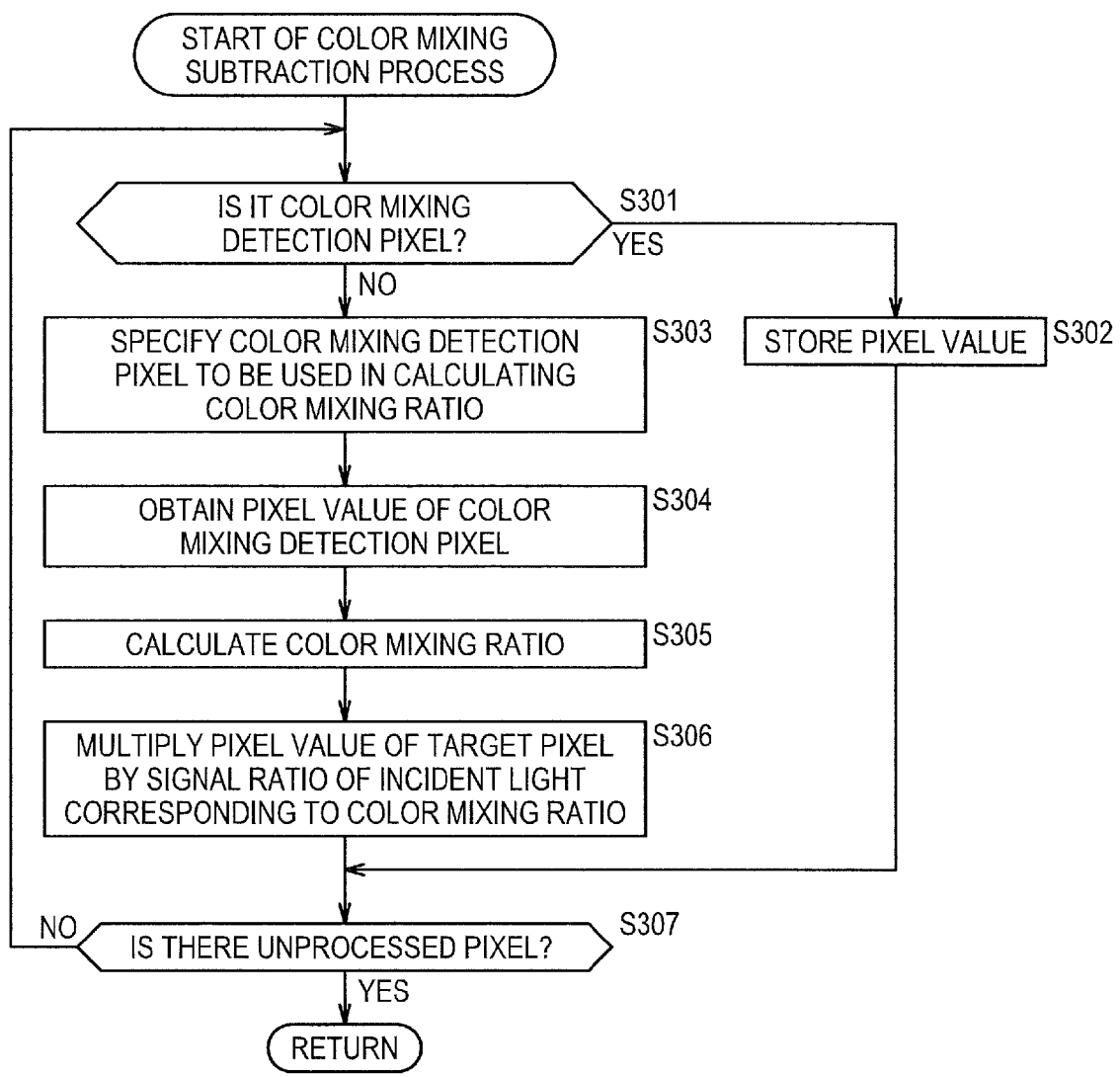
FIG. 29 is a flowchart illustrating a procedure example of a color mixing subtraction process.

Referring to the flowchart of FIG. 29, a procedure of the color mixing subtraction process will be described below.

The procedure of the color mixing subtraction process is basically similar to that of the color mixing subtraction process described above with reference to the flowchart of FIG. 21, except that the color mixing subtraction process uses the color mixing ratio instead of the amount of color mixing. Hereinafter, processes different from the color mixing subtraction process of FIG. 21 will be described.

In step S304, the color mixing detection pixel specifying portion 133 obtains the pixel value of the color mixing detection pixel specified in step S303. The color mixing detection pixel specifying portion 133 also obtains a pixel value of neighboring pixel of the color mixing detection pixel specified in step S303.

In step S305, the color mixing ratio calculation portion 304 calculates a color mixing ratio by using both a pixel value of the color mixing detection pixel obtained in step S304 and a pixel value of neighboring pixel of the color mixing detection pixel.

In step S306, the multiplication portion 305 multiplies a pixel value of the target pixel (the pixel of interest) to be processed, by a signal ratio of incident light corresponding to the color mixing ratio calculated in step S305.

Like the imaging apparatus 100, the color mixing subtraction unit 106 can more accurately subtract color mixing by performing each process described above.

APPLICATION EXAMPLE 2

As an example, if the surroundings of the color mixing detection pixel are saturated, then, in the method described above, there is a possibility that the proper amount of color mixing or color mixing ratio will not be obtained. For example, the color mixing ratio is obtained by calculating the ratio of the amount of color mixing to the total signal value containing both the incident light signal and the amount of color mixing. However, if the amount of color mixing is larger than saturation amount, then there is a possibility that total signal amount becomes a predetermined amount but the output of the shielded color mixing detection pixel is increased or decreased depending on the light amount. If this value is applied to the other unsaturated pixel, then erroneous color mixing correction is likely to be caused.

Figure 30:
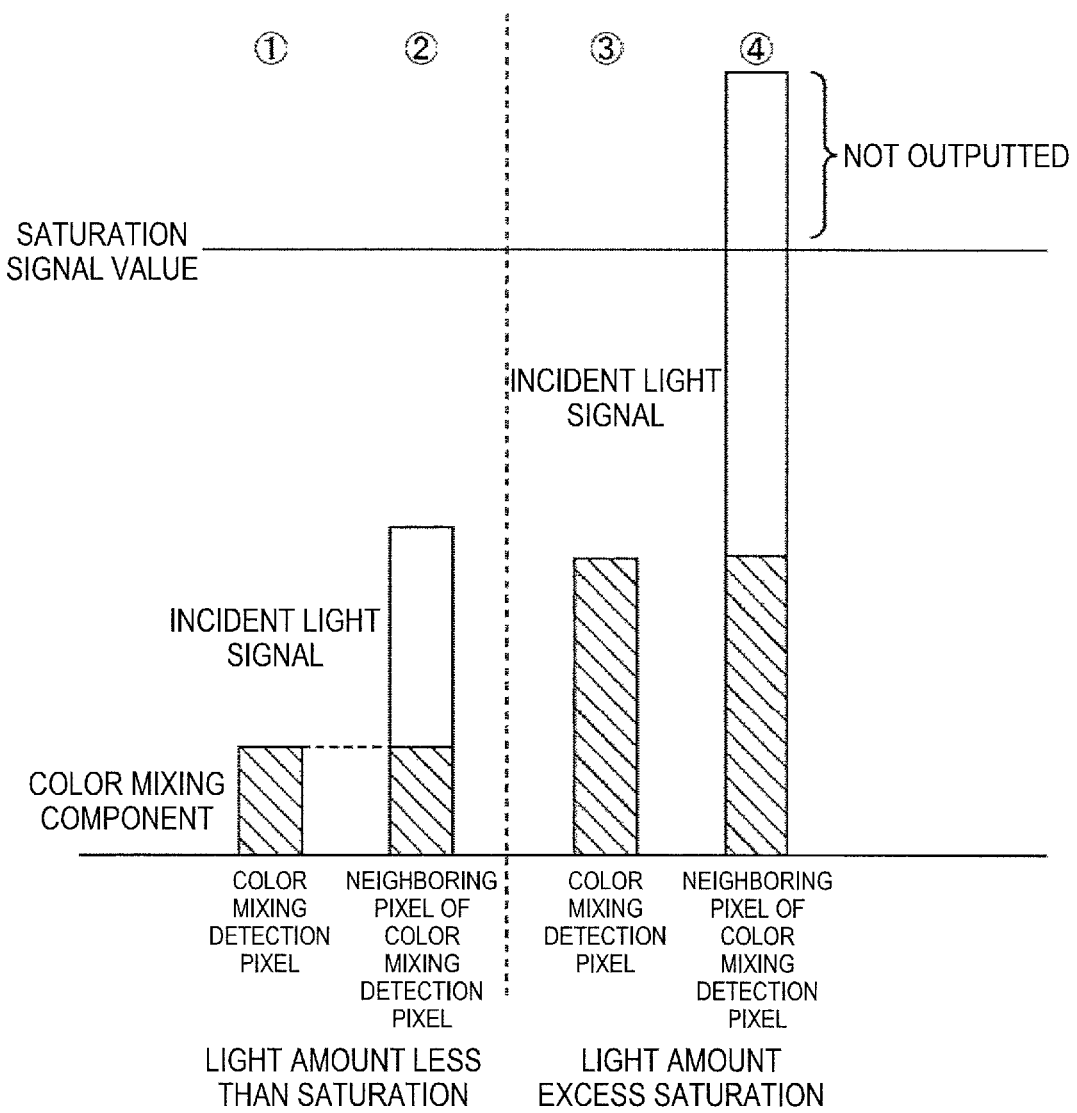
FIG. 30 is a diagram illustrating an example of when light amount is saturated.

As an example shown in FIG. 30, when the light amount of a pixel is unsaturated as shown in a left portion of FIG. 30, the ratio of the pixel value of the color mixing detection pixel to the pixel value of the neighboring pixel of the color mixing detection pixel is corresponded to the color mixing ratio. In comparison, when the light amount of a pixel is oversaturated as shown in a right portion of FIG. 30, the ratio of the pixel value of the color mixing detection pixel to the pixel value of neighboring pixel of the color mixing detection pixel is not corresponded to the color mixing ratio. That is, it could be contemplated that proper color mixing ratio becomes difficult to be obtained.

Therefore, when the neighboring pixel of the color mixing detection pixel is saturated, the color mixing ratio (amount of color mixing) may be obtained using a value of unsaturated neighboring pixel of the color mixing detection pixel rather than using a value of the concerned color mixing detection pixel.

Figure 31:
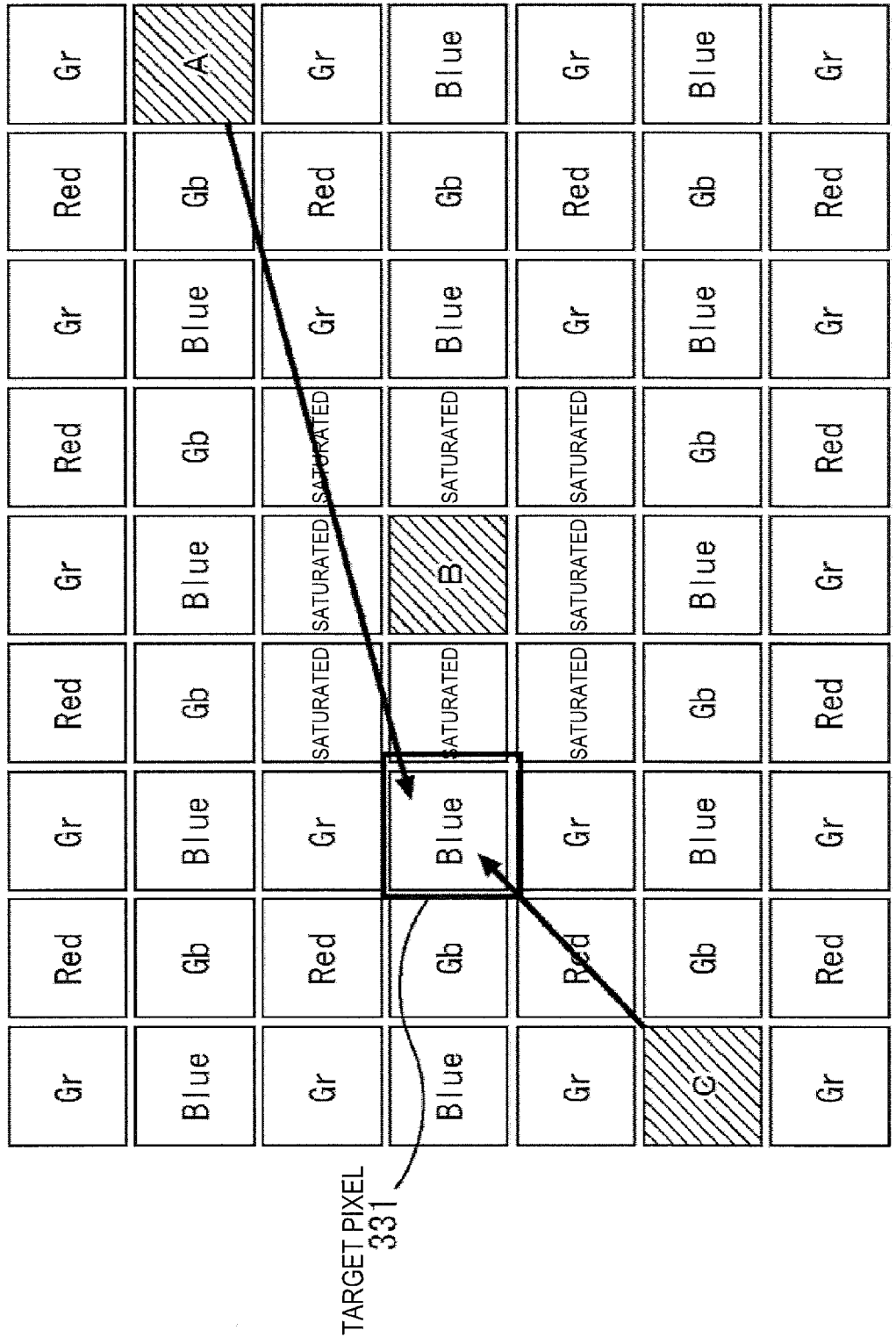
FIG. 31 is a diagram illustrating another example of color mixing subtraction when light amount is saturated.

FIG. 31 illustrates more specific example. In the example shown in FIG. 31, surrounding pixels of the color mixing detection pixel B are saturated. In FIG. 31, when a target pixel 331 is to be corrected, a method of blending the amount of color mixing or color mixing ratio of the color mixing detection pixels B and C depending on their distances will be contemplated. However, since the surrounding pixels of the color mixing detection pixel B are saturated, there is a high possibility that the accurate amount of color mixing or color mixing ratio as described above will not be obtained. Thus, in this case, the color mixing detection pixels A and C may be used without using the color mixing detection pixel B, thereby preventing erroneous correction from being caused.

[Procedure of Color Mixing Detection Pixel Specifying Process]

Figure 32:
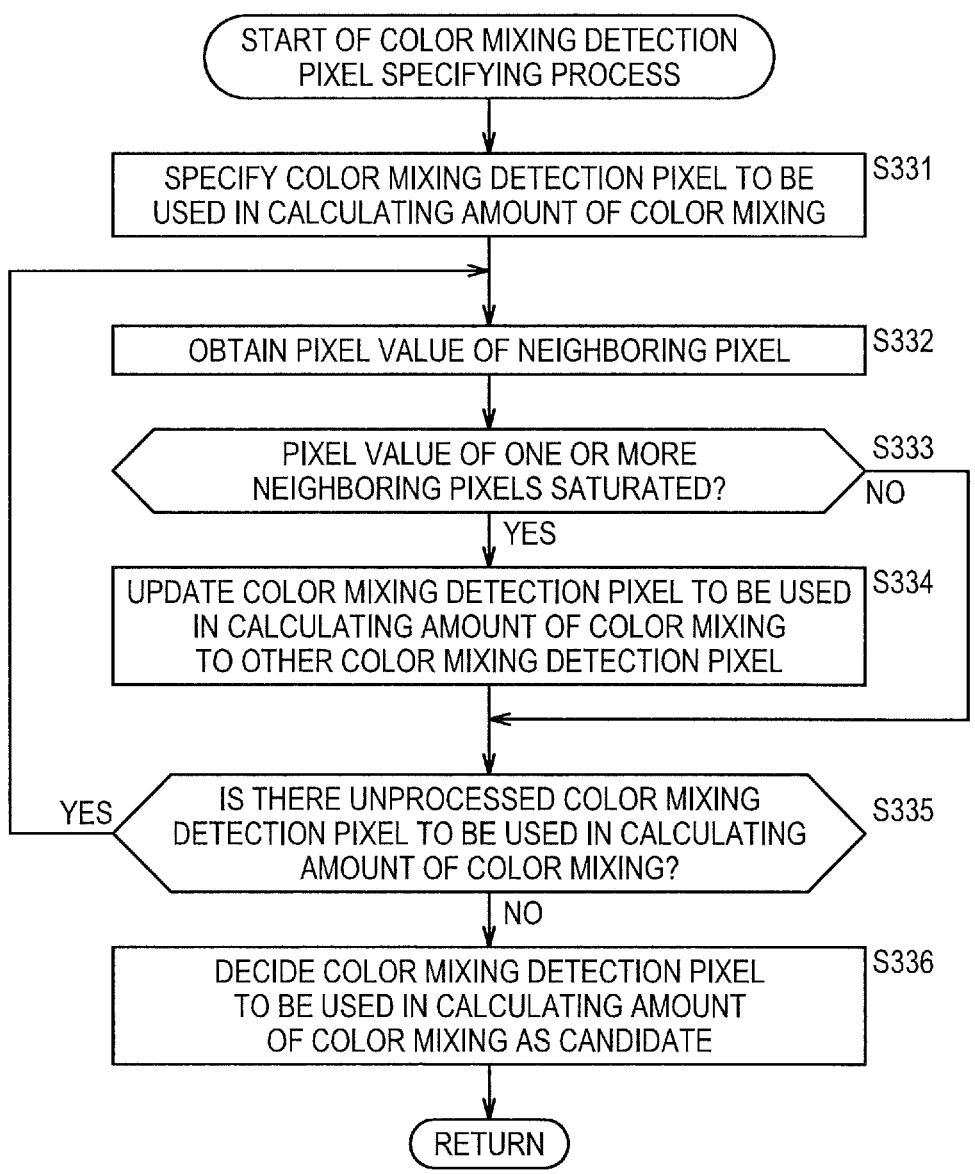
FIG. 32 is a flowchart illustrating a procedure example of a color mixing detection pixel specifying process.

Referring to the flowchart of FIG. 32, a procedure of the color mixing detection pixel specifying process will be described. This color mixing detection pixel specifying process, for example, is a process performed at step S133 of FIG. 21.

When the color mixing detection pixel specifying process is started, in step S331, the color mixing detection pixel specifying portion 133 specifies a color mixing detection pixel to be used to calculate color mixing. In step S332, the color mixing detection pixel specifying portion 133 obtains a predetermined number (one or more) of pixel value of each neighboring pixel of the color mixing detection pixel specified in step S331.

In step S333, the color mixing detection pixel specifying portion 133 determines whether one or more pixel values of the neighboring pixel are saturated. If it is determined that one or more pixel values of the neighboring pixel are saturated, then the process proceeds to step S334.

In step S334, the color mixing detection pixel specifying portion 133 updates the color mixing detection pixel used to calculate color mixing into other color mixing detection pixel. That is, the color mixing detection pixel can be avoided when its neighboring pixel is saturated. If the process of step S334 is finished, then the color mixing detection pixel specifying portion 133 moves the process to step S335. Furthermore, in step S333, if it is determined that any one of pixel values of each neighboring pixel is not saturated, then the color mixing detection pixel specifying portion 133 moves the process to step S335.

In step S335, the color mixing detection pixel specifying portion 133 determines whether or not there is any unprocessed color mixing detection pixel used to calculate the amount of color mixing. In step S331, if it is determined that there is an unprocessed pixel in which pixel values of each neighboring pixel are not checked among the specified color mixing detection pixel used to calculate the amount of color mixing, then the color mixing detection pixel specifying portion 133 returns the process to step S332 and repeats the subsequent steps.

In step S335, if it is determined that the neighboring pixels of the color mixing detection pixel, which is specified in FIG. 331, used to calculate the amount of color mixing are all checked, the color mixing detection pixel specifying portion 133 moves the process to step S336.

In step S336, the color mixing detection pixel specifying portion 133 decides a candidate of the color mixing detection pixel which is narrowed down by the process described above as the color mixing detection pixel to be used to calculate the amount of color mixing, and then color mixing detection pixel specifying process is finished.

The color mixing subtraction unit 106 can more accurately obtain the amount of color mixing (color mixing ratio) by properly selecting the color mixing detection pixel to be used to calculate the amount of color mixing depending on whether or not a pixel value of its neighboring pixel is saturated.

An image sensor may contain any defect such as a white point (output rises) or black point (output falls) due to a number of factors such as defects in a Si or transfer failure. Similarly, the color mixing detection pixel also may contain such defects. Since such defects cause an erroneous amount of color mixing, it is necessary to prevent such defects. Thus, the determination of whether the color mixing detection pixel is a defective pixel may be contemplated. If it is determined that the color mixing detection pixel is a defective pixel, then it may be contemplated that the pixel will be not used. As an example shown in FIG. 31, if the color mixing detection pixel B is a defective pixel, the amount of color mixing and color mixing ratio may be obtained using the other color mixing detection pixel B or C.

The determination of whether a color mixing detection pixel is a defective pixel can be performed by a method carried out generally when the defect is corrected. For example, a method of determining whether or not there is a jump value among a plurality of values of the color mixing detection pixel may be considered. More specifically, for example, when the pixel value of the color mixing detection pixel B positioned between the color mixing detection pixels A and C is greatly different (e.g., more than twice) from the pixel values of the color mixing detection pixels A and C, the color mixing detection pixel B may be regarded as a defective pixel, thereby prohibiting the color mixing detection pixel B from being used in calculating the amount of color mixing (color mixing ratio).

As an approach for the case where the pixel value of neighboring pixel of the target pixel is determined to be saturated or the case where the concerned color mixing detection pixel is determined to be a defective pixel, any method other than those described above may be employed. Although the method that the color mixing detection pixel used to calculate the amount of color mixing is changed (updated) from the concerned color mixing detection pixel into other color mixing detection pixel has been described above, any method other than those described above may be employed as an approach to avoid such circumstances. For example, the concerned color mixing detection pixel may be prohibited from being used to calculate the amount of color mixing.

For example, it is assumed that a plurality of the color mixing detection pixels are used to calculate the amount of color mixing. In any one of the plurality of color mixing detection pixels, if the light amount of its neighboring pixel is saturated or if it is determined the color mixing detection pixel is a defective pixel as described above, then the only concerned color mixing detection pixel may be prohibited from being used and then other color mixing detection pixels may be prevented from being newly used. That is, in this case, the number of the color mixing detection pixel used to calculate the amount of color mixing is reduced.

APPLICATION EXAMPLE 3

Figure 33:
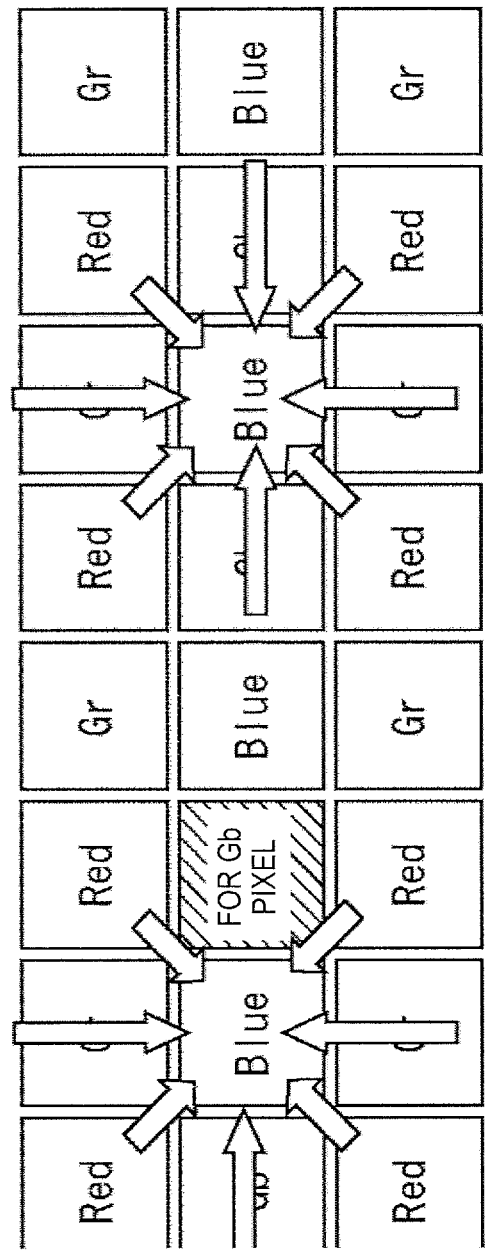
FIG. 33 is a diagram illustrating a color mixing correction process of neighboring pixels of a color mixing detection pixel.

Like a pixel 351 shown in FIG. 33, since color mixing is generally not caused from a light-shielded pixel, the amount of color mixing of a neighboring pixel of the color mixing detection pixel being light-shielded is less than that of other pixels. Thus, if the color mixing amount subtraction is performed on the neighboring pixel in a similar way to other pixel, then there is a possibility that an overcorrection will be caused.

Thus, for neighboring pixels (up, down, left, right, and oblique) of the color mixing detection pixel, the color mixing correction amount may be reduced (for example, the reduced amount is 0.8 times the amount of color mixing or color mixing ratio obtained from the color mixing detection pixel) or they may be regarded as defective pixels and thus a signal value may be reconstructed by defect correction.

[Procedure of Color Mixing Subtraction Process]

With reference to the flowchart of FIG. 34, a procedure of the color mixing subtraction process which is performed when a color mixing correction amount of each neighboring pixel of the color mixing detection pixel is reduced will be described.

Figure 21:
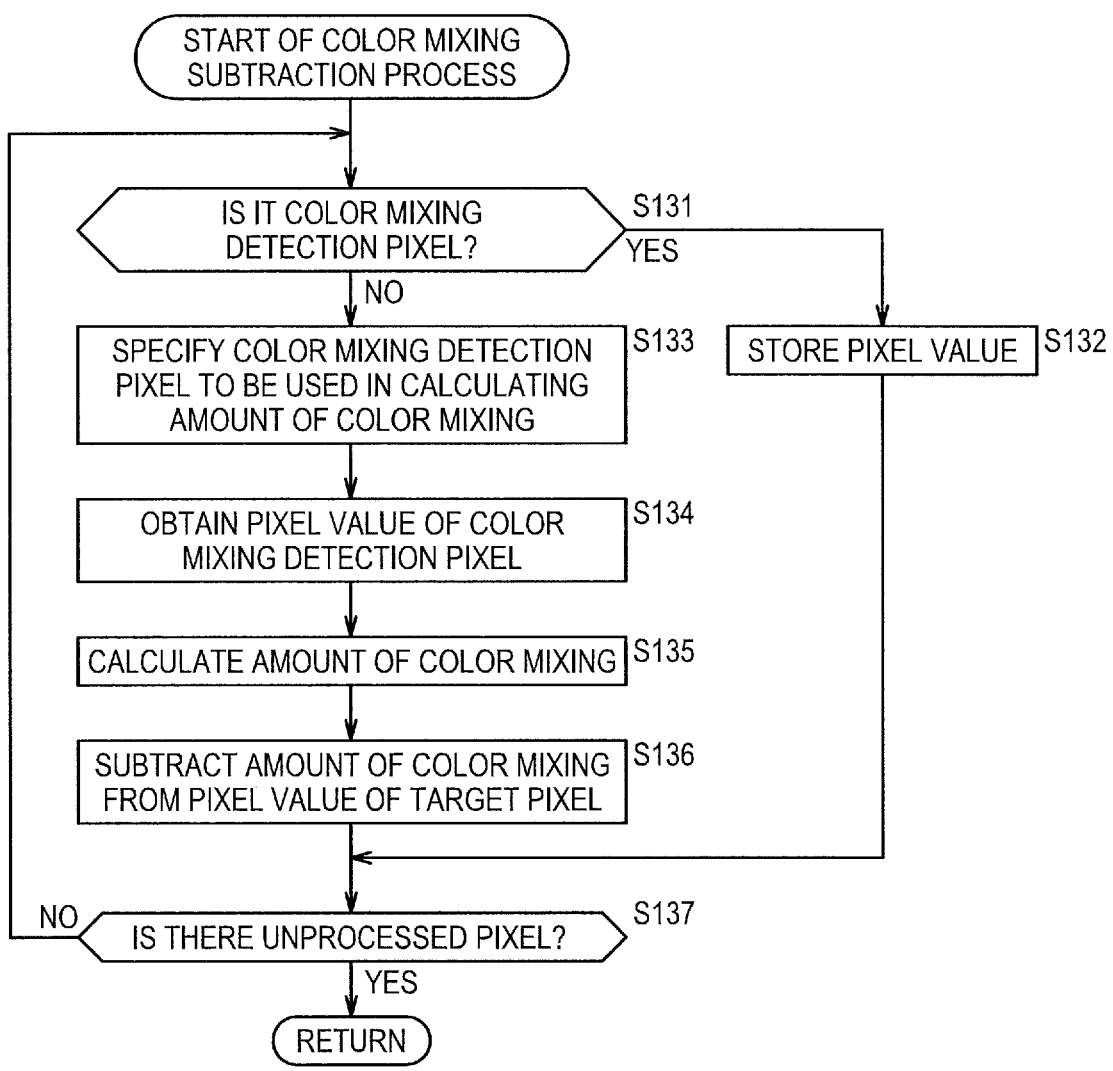
FIG. 21 is a flowchart illustrating a procedure example of a color mixing subtraction process.
Figure 34:
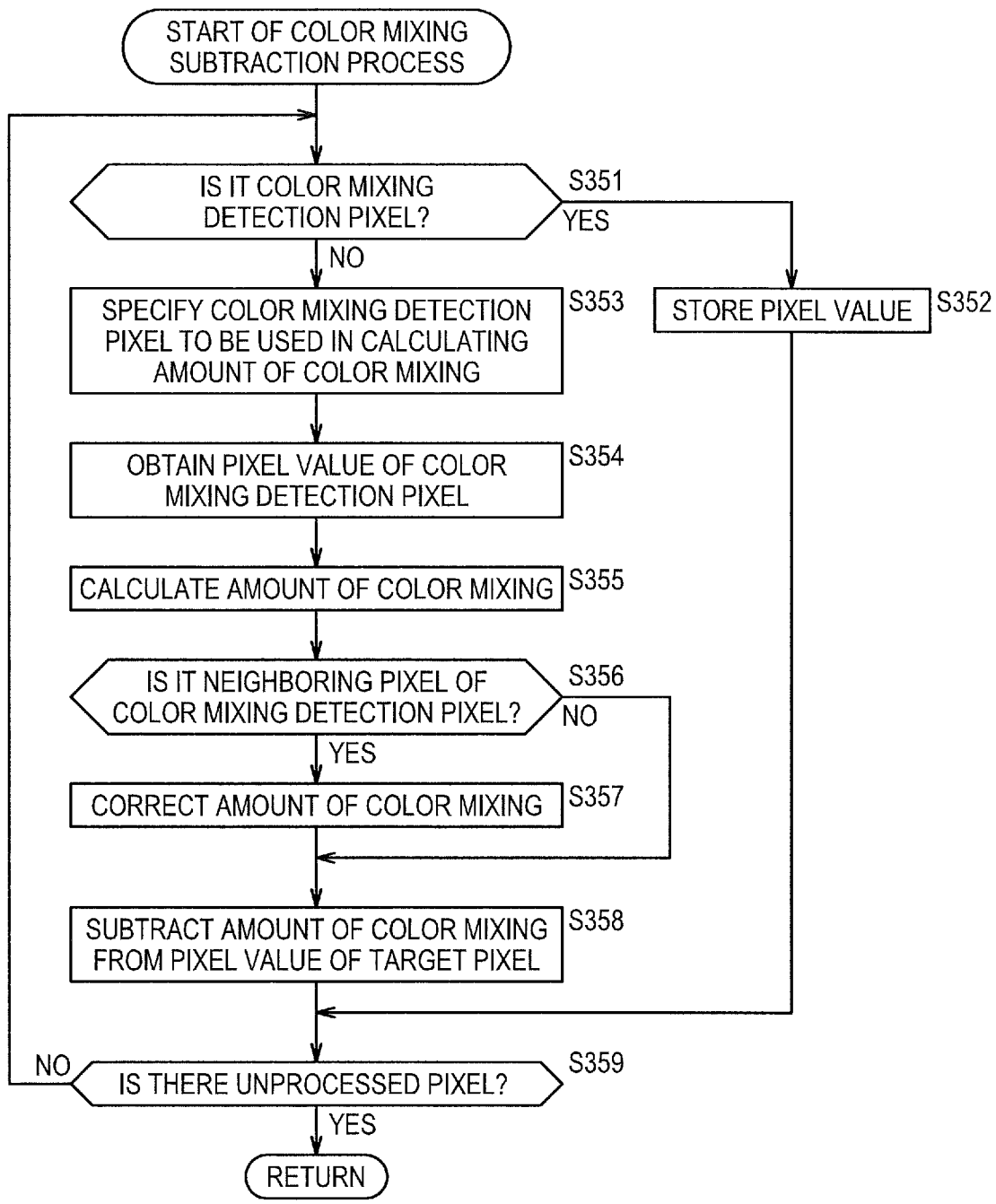
FIG. 34 is a flowchart illustrating a procedure example of a color mixing subtraction process.

In this case, each of the processes performed at step S351 to S355, S358, and S359 of FIG. 34 are similar to the respective processes performed at step S131 to S137 of FIG. 21.

In the example shown in FIG. 34, steps S356 and S357 are additionally performed. Specifically, in step S356, the color mixing amount calculation portion 134 determines whether or not the target pixel to be processed is a pixel adjacent to the color mixing detection pixel. If it is determined that the target pixel is a pixel adjacent to the color mixing detection pixel (that is, the adjacent pixel is located at a position where a color mixing is occurred from the color mixing detection pixel which is a normal pixel), the color mixing amount calculation portion 134 moves the process to step S357. In step S357, the color mixing amount calculation portion 134 further corrects (for example, multiplies a predetermined value (e.g., 0.8 times)) the amount of color mixing calculated in step S355.

If the process in step S357 is completed, the color mixing amount calculation portion 134 moves the process to step S358. Also, in step S356, if it is determined that the target pixel to be processed is not a pixel adjacent to the color mixing detection pixel, the color mixing amount calculation portion 134 moves the process to step S358.

In accordance with the process described above, the color mixing subtraction unit 106 can obtain the amount of color mixing (color mixing ratio) more accurately and can correct color mixing more accurately.

The method of correcting defects may be performed in a similar manner as those for the color mixing detection pixel.

APPLICATION EXAMPLE 4

As described above, it has been described that a color mixing detection pixel is provided for each color of color filters and all colors are corrected. But there is the possibility that the number of the defective pixel to be corrected will be increased as the number of the color mixing detection pixel becomes large.

Since the defect correction is performed by estimating from a value of a neighboring normal pixel, if such estimation value is erroneous, then there is a possibility that a false color or resolution degradation will be occurred. Thus, in order to prevent the estimation value from being erroneous as much as possible and to improve an image quality by the color mixing correction, it is considered that the color mixing detection pixel is provided only at a particular color and the correction of the amount of color mixing is performed for the particular color.

For example, in a sensor under development, when it is determined that the amount of color mixing for a Red color pixel is larger than other color pixels, it is possible that a color mixing detection pixel is provided only at the Red color pixel and the correction of the amount of color mixing is performed for the Red color pixel. Thus, a color mixing detection pixel may be not provided at Green and Blue color pixels and a defect correction also may be performed only for the color mixing detection pixel of Red color.

Fourth Embodiment

[Vertical Spectral Structure]

Embodiments of the present disclosure can correct the amount of color mixing by providing a light-shielded pixel and they can be applied to any pixel structure. For example, embodiments of the present disclosure can be applied to an image sensor without color filter. For example, as the method described in Japanese Patent Laid-open No. 2011-29453, there is provided the vertical spectral structure in which photodiodes are arranged with three stages in a vertical direction within a same pixel and color signals are obtained from a plurality of the same pixel. In pixels of this vertical spectral structure, each color may be identified only with each photodiode. There is also provided a method of obtaining color signals using an organic photoelectric conversion film. Embodiments of the present disclosure can be also applied to an image sensor having a pixel of the vertical spectral structure in the similar way to the image sensor using the color filter described above.

A case of using the image sensor of the vertical spectral structure will be described below.

[Imaging Apparatus]

Figure 35:
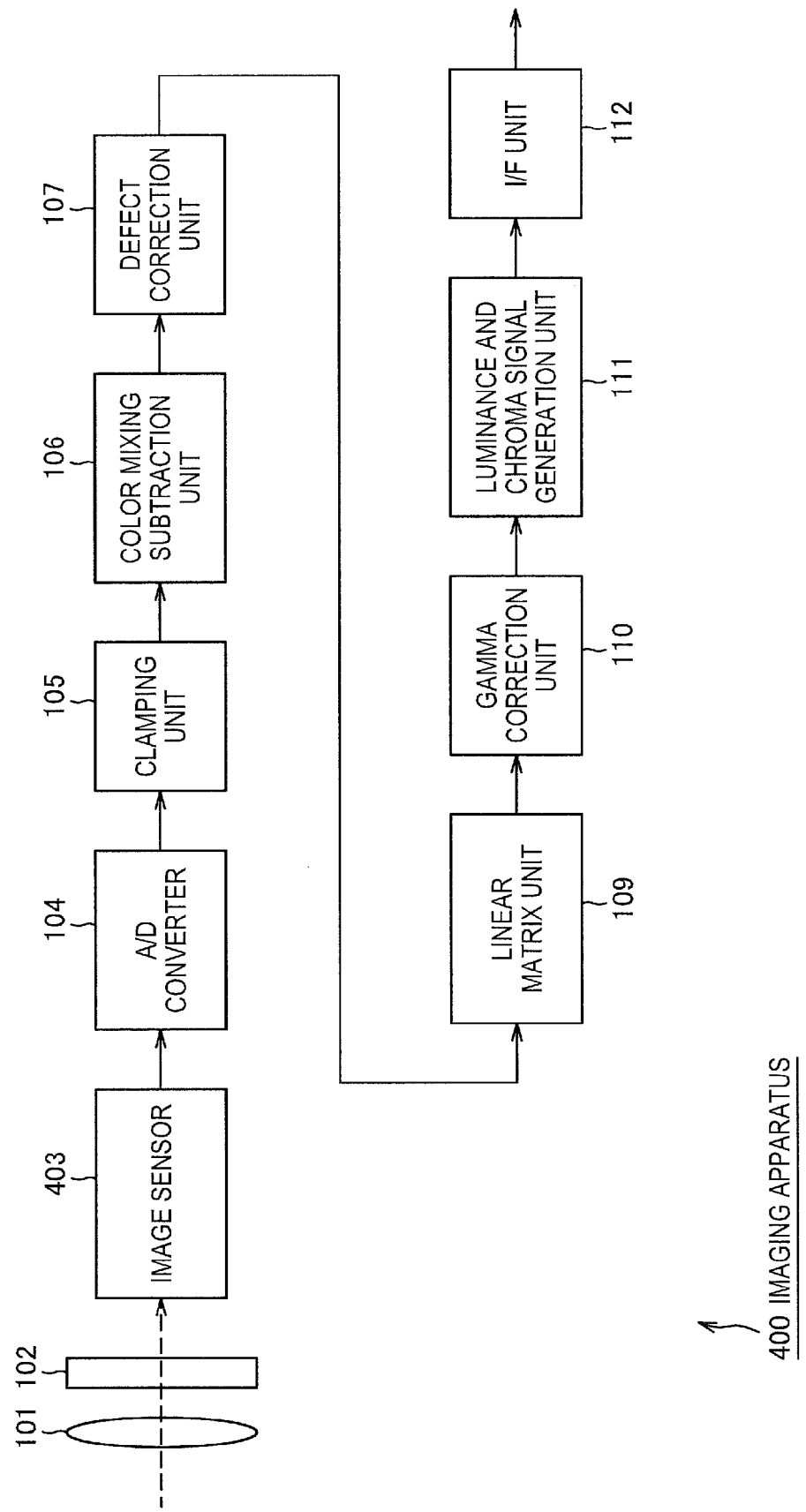
FIG. 35 is a block diagram illustrating yet another configuration example of the imaging apparatus.

FIG. 35 is a block diagram illustrating a configuration example of the imaging apparatus in the case of using the image sensor of the vertical spectral structure. The imaging apparatus 400 shown in FIG. 35 is basically similar to the imaging apparatus 100 shown in FIG. 1. Specifically, the imaging apparatus 400 has similar configuration to the imaging apparatus 100 and performs similar processes to the imaging apparatus 100. The difference is that the imaging apparatus 400 includes an image sensor without color filter 403 instead of the image sensor with color filter 103.

Figure 36:
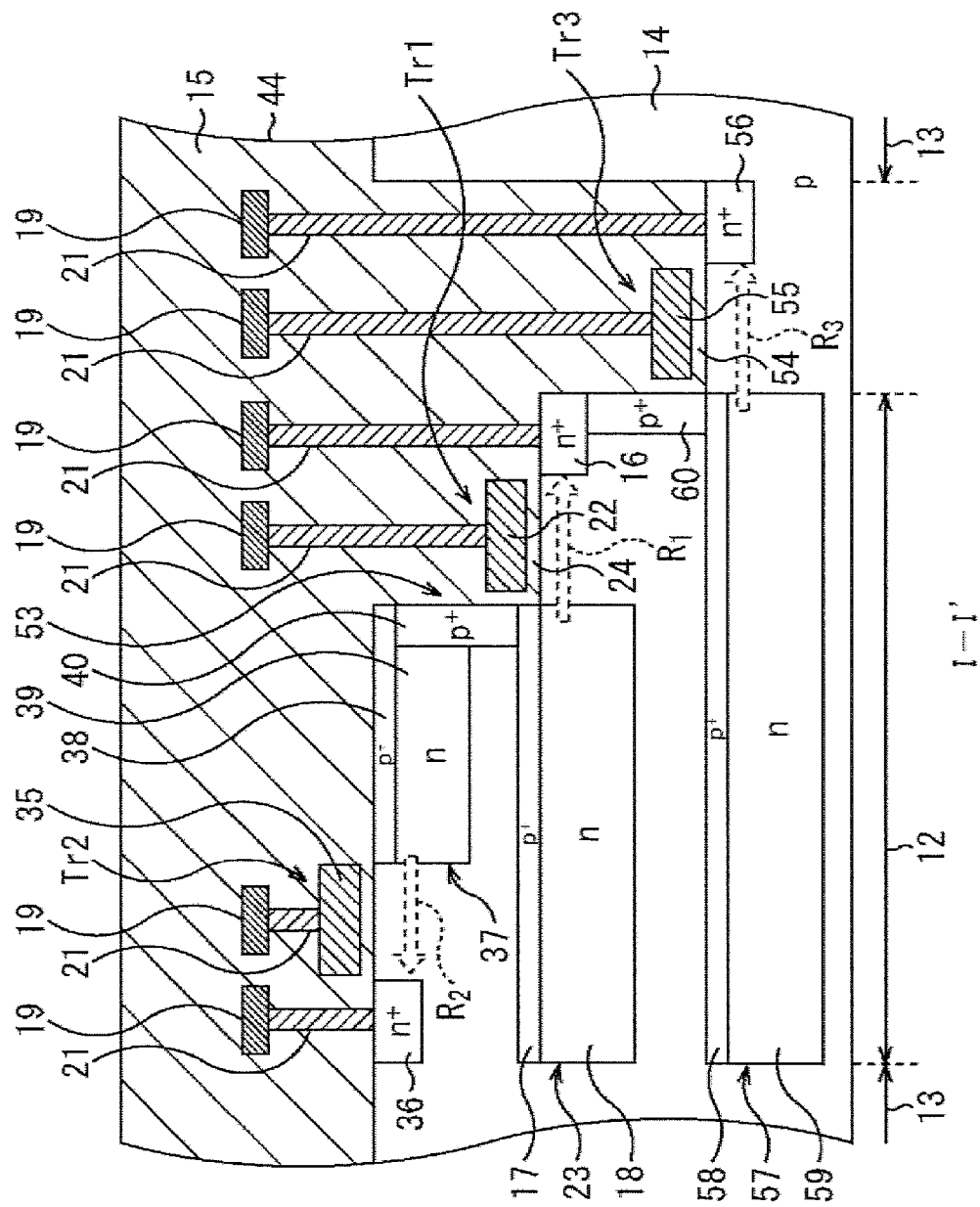
FIG. 36 is a block diagram illustrating an example of a vertical spectral structure.

The image sensor 403 is a surface irradiation type and a solid state image sensor capable of the vertical spectroscopy, as a cross-sectional view shown in FIG. 36. This vertical spectral structure, for example, is a structure as described in Japanese Patent Laid-open No. 2011-29453. In this structure, three photodiodes (P-N junction) are stacked in a vertical direction. The color signal having three colors can be obtained from a single pixel by photoelectrically converting Blue in top stage, Green in middle stage, and Red in bottom stage.

For example, in FIG. 36, a surface type photodiode (PD) 36 is formed in a region at a depth of approximately 0.5 micrometers (μm) from a light incident surface of a semiconductor substrate 14 to generate signal charge by the blue color (B) of light. A first buried type photodiode (PD) 23 is formed in a region at a depth of approximately 0.5 to 1.5 micrometers (μm) from a light incident surface of the semiconductor substrate 14 to generate signal charge by the green color (G) of light. A second buried type photodiode (PD) 57 is formed in a region at a depth of approximately 1.5 to 3 micrometers (μm) from a light incident surface of the semiconductor substrate 14 to generate a signal charge by the red color (R) of light for the case where entire thickness of the semiconductor substrate 14 is, for example, 3 micrometers (μm). The second buried type photodiode (PD) 57 may be extended in a depth direction of the substrate for the case where entire thickness of the semiconductor substrate 14 is thicker than 3 micrometers (μm).

Thus, the image sensor 403 capable of the vertical spectroscopy may not be provided with a color filter layer at the light illumination portion of the semiconductor substrate 14. Within a single pixel, because all the RGB lights can be photoelectrically converted, the utilization efficiency of light for single pixel is three times higher than a pixel on which spectroscopy is performed using a color filter in the related art, thereby improving the sensitivity.

Figure 37:
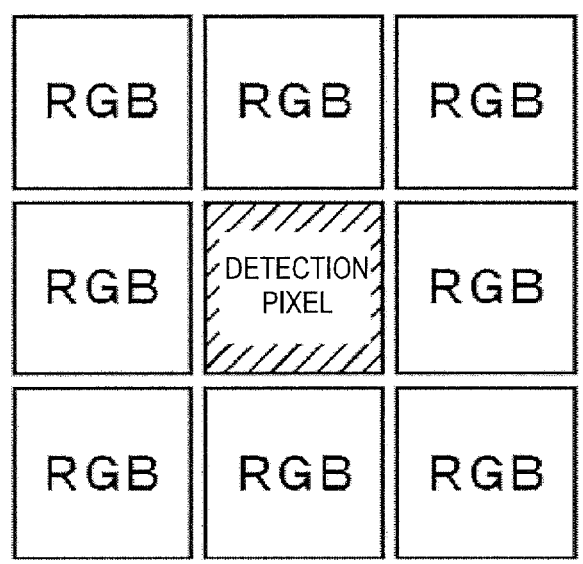
FIG. 37 is a diagram illustrating an arrangement example of a color mixing detection pixel of a vertical spectral structure.

If pixels of the image sensor 403 have such vertical spectral structure, as shown in FIG. 37, a color mixing detection pixel is provided in the similar way to the methods of embodiments described above. However, in the case of the vertical spectral structure, the entire RGB light in a single pixel can be photoelectrically converted as described above. Thus, in also the case of the color mixing detection pixel, the color mixing for each color of RGB can be detected in a single pixel.

Figure 38:
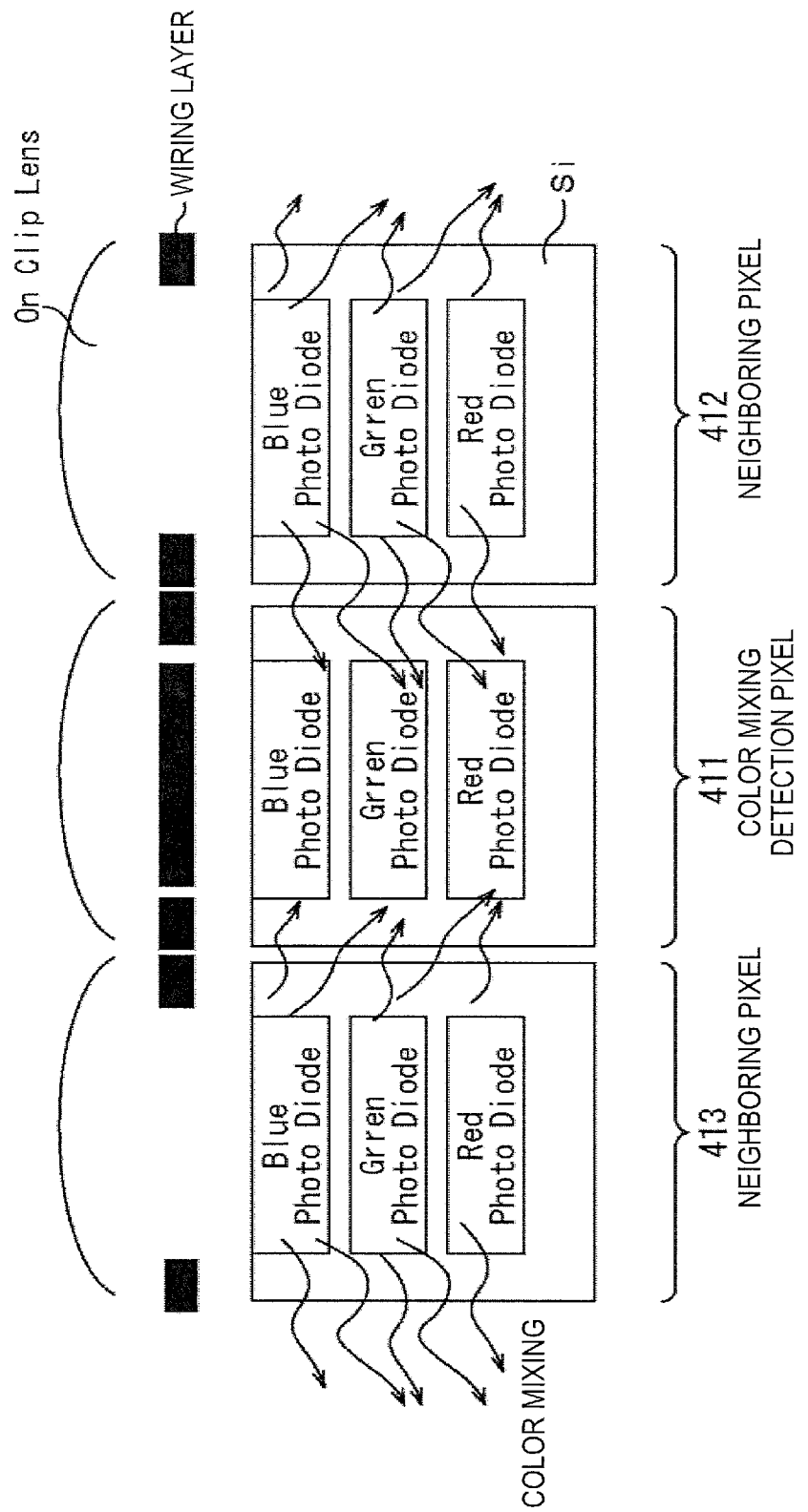
FIG. 38 is a diagram illustrating an example of a color mixing detection pixel of a vertical spectral structure.

More specifically, as shown in FIG. 38, color mixing is occurred within a Si even with the vertical spectral structure. The output of color mixing detection pixel (middle portion of FIG. 38) which is light-shielded by a wiring layer becomes only a bulk color mixing from neighboring pixels together with R, G, and B. This color mixing is corrected by the same method as those of embodiments described above. The difference from the methods described above is that the color mixing of a plurality of pixels (for example, R, G, B) can be discriminated from each other in a single pixel (an example of the read-out structure is described in Japanese Patent Laid-open No. 2011-29453).

In the imaging apparatus 400 shown in FIG. 35, since the image sensor 403 has the vertical spectral structure and data of each color is obtained from each pixel, it is possible to eliminate the demosaic unit 108. That is, the output of the defect correction unit 107 is directly supplied to the linear matrix unit 109.

[Procedure of Imaging Process]

A procedure of an imaging process will be described with reference to the flowchart of FIG. 39. This imaging process is basically performed in a similar manner as that of FIG. 20.

Figure 39:
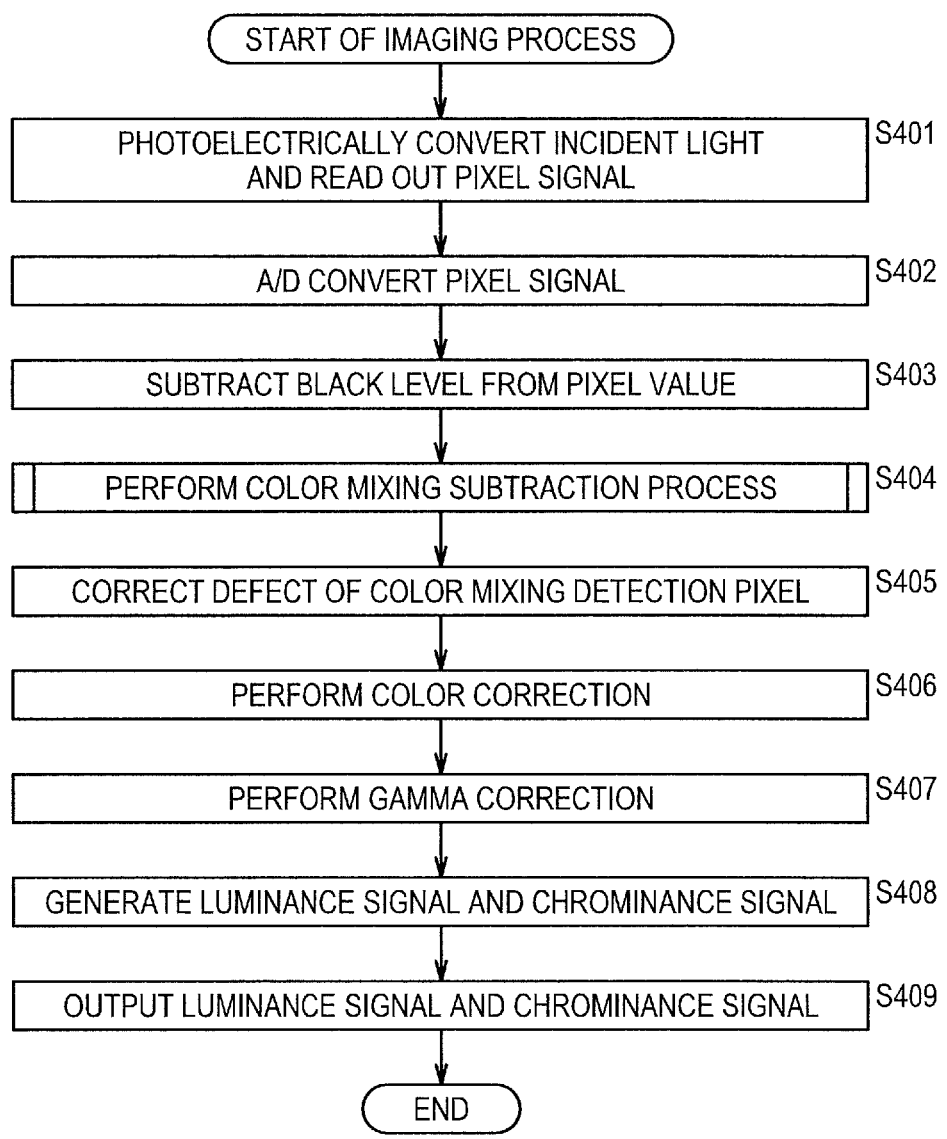
FIG. 39 is a flowchart illustrating yet another example of the imaging process.

However, in step S401 of FIG. 39, pixel signals of a plurality of colors are read out from a single pixel. Thus, in this case, a demosaic process corresponding to step S106 is omitted.

This enables the imaging apparatus 400 to more accurately correct color mixing as those of the imaging apparatus 100.

Moreover, for example, it is possible to provide a configuration that a single photodiode is provided for Green color and photodiodes having the vertical spectral structure are provided for Red and Blue colors. In this case, a demosaic process is necessary.

Fifth Embodiment

[Imaging Apparatus]

Even in the case where the image sensor without color filter 403 is used as described in the fourth embodiment, the black level and the amount of color mixing may be corrected simultaneously as described in the second embodiment.

Figure 40:
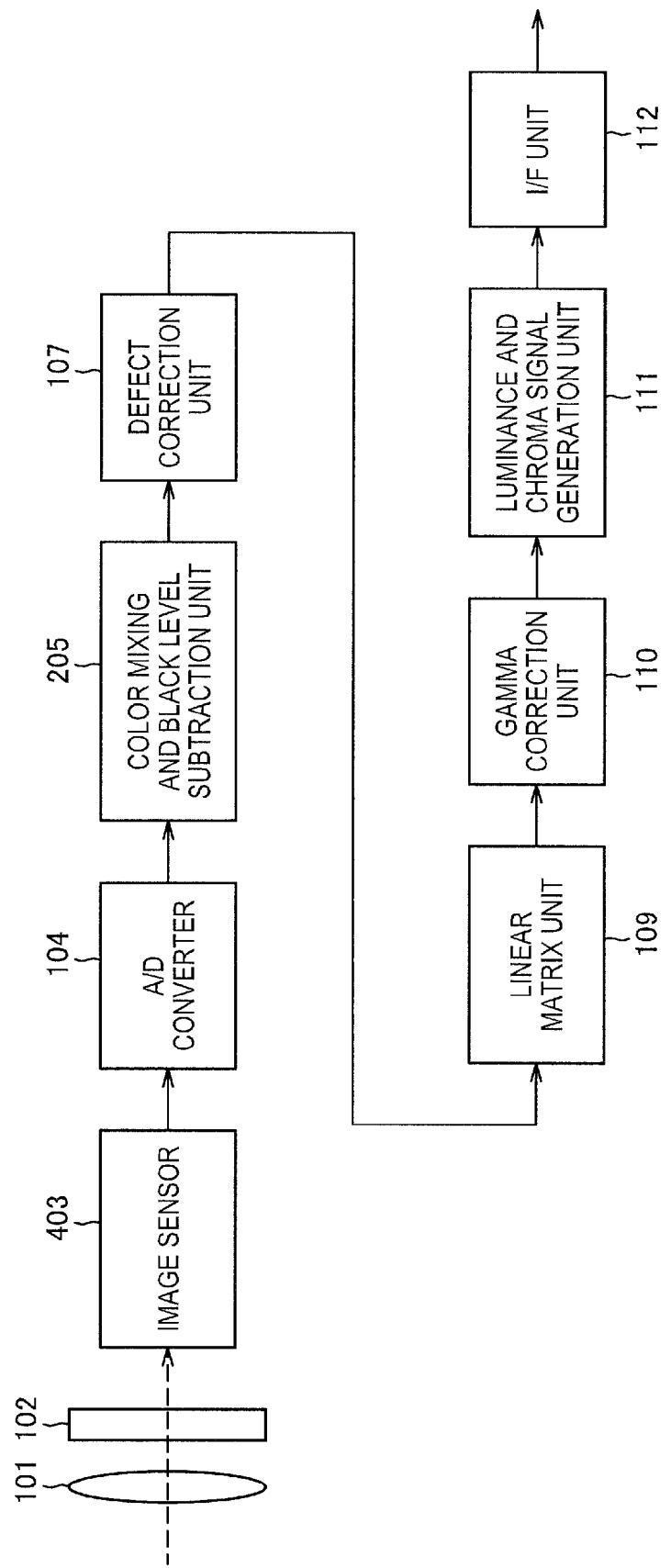
FIG. 40 is a block diagram illustrating yet another configuration example of the imaging apparatus.

FIG. 40 is a block diagram illustrating a configuration example of the imaging apparatus in the case of using the image sensor without color filter. In FIG. 40, an imaging apparatus 500 has a basically similar configuration to that of the imaging apparatus 400 in FIG. 35. However, the imaging apparatus 500 includes a color mixing and black level subtraction unit 205 instead of the clamping unit 105 and the color mixing subtraction unit 106, as the imaging apparatus 200 shown in FIG. 22.

More specifically, the imaging apparatus 500 corrects the black level and the amount of color mixing simultaneously, as the imaging apparatus 200. In comparison with the imaging apparatus 200, the imaging apparatus 500 includes the image sensor 403 instead of the image sensor with color filter 103. Also, the demosaic unit 108 is omitted.

[Procedure of Imaging Process]

A procedure of the imaging process of the case described above will be described with reference to the flowchart of FIG. 41. This imaging process is performed in a basically similar manner to that of the FIG. 25.

Figure 41:
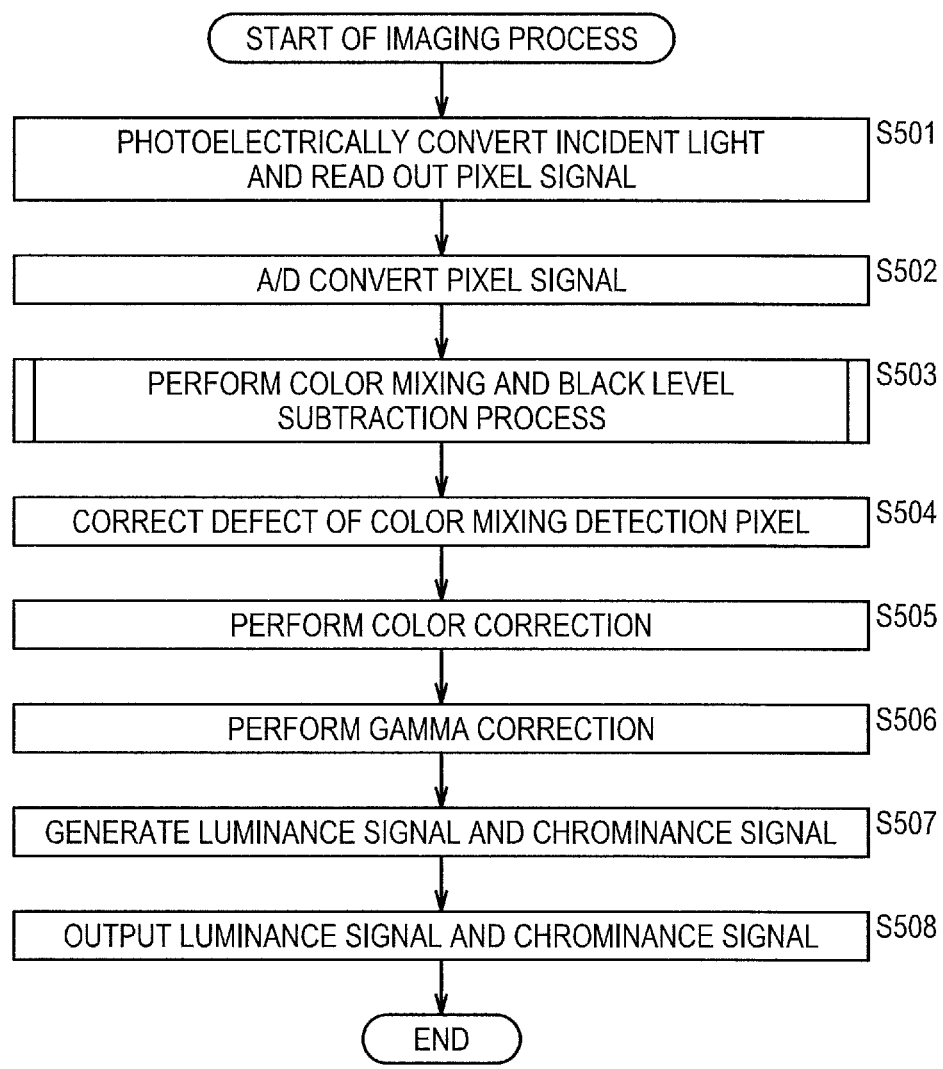
FIG. 41 is a flowchart illustrating still another example of the imaging process.

However, in step S501 of FIG. 41, pixel signals of a plurality of colors are read out from a single pixel. Thus, in this case, a demosaic process corresponding to step S205 is omitted.

This enables the imaging apparatus 500 to more accurately correct color mixing as those of the imaging apparatus 200.

Sixth Embodiment

[Imaging Apparatus]

The imaging apparatus described above may be configured as a part of other apparatus. For example, the imaging apparatus described above may be configured as a part of the imaging apparatus shown in FIG. 42.

Figure 42:
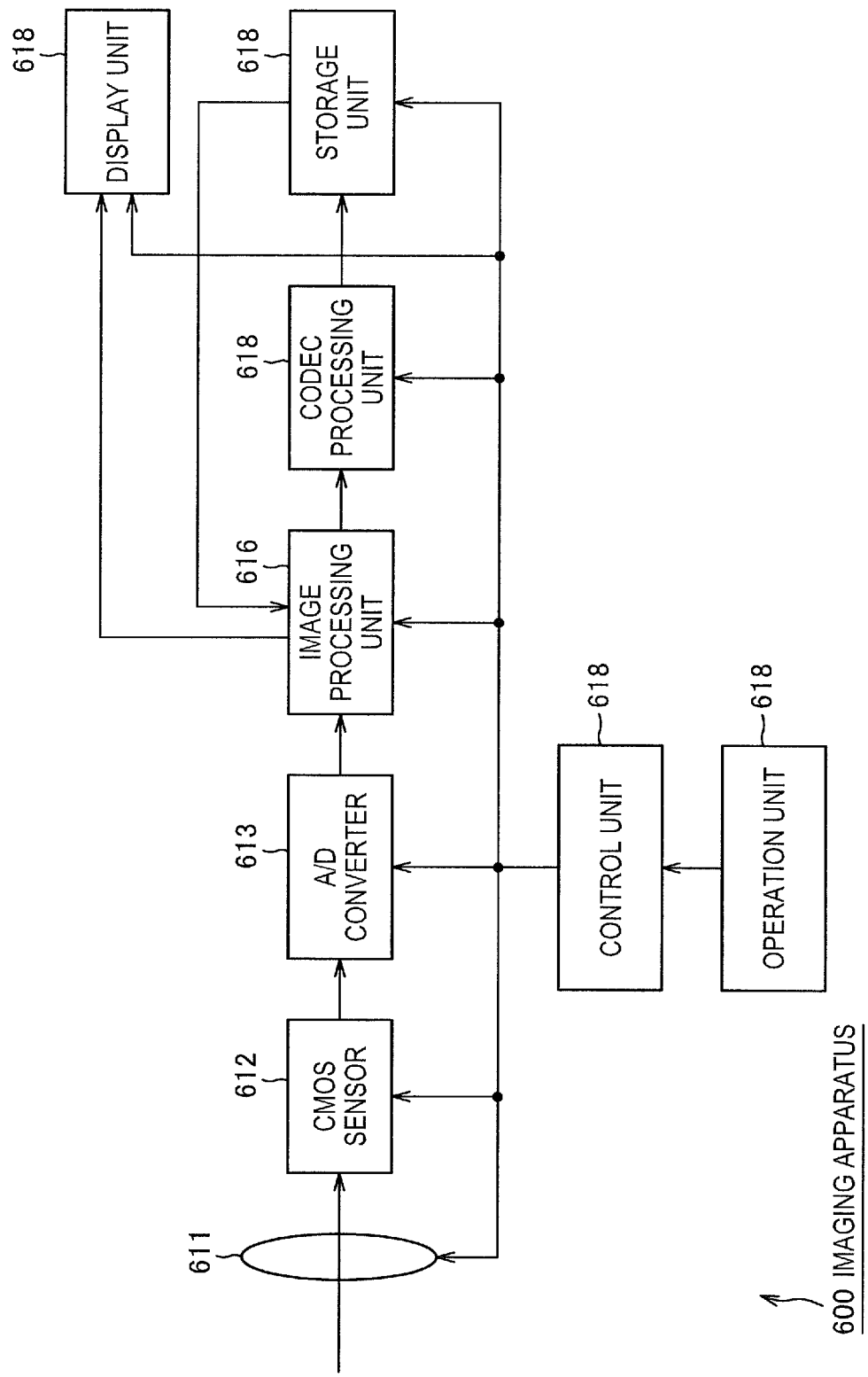
FIG. 42 is a block diagram illustrating still another configuration example of the imaging apparatus.

FIG. 42 is a block diagram illustrating a configuration example of an imaging apparatus according to an embodiment of the present disclosure.

As shown in FIG. 42, an imaging apparatus 600 includes a lens unit 611, a CMOS sensor 612, an analog-to-digital (A/D) converter 613, an operation unit 614, a control unit 615, an image processing unit 616, a display unit 617, a codec processing unit 618, and a storage unit 619.

The lens unit 611 adjusts a focal length to a subject, condenses a light from a position in focus, and supplies it to the CMOS sensor 612.

The CMOS sensor 612 is a solid-state image sensor having the configuration described above and is provided with a color mixing detection pixel in an effective pixel area.

The A/D converter 613 converts a voltage signal for each pixel supplied from the CMOS sensor 612 at a predetermined timing into a digital image signal (hereinafter, appropriately referred to as "image signal"). The A/D converter 613 also supplies the image signal to the image processing unit 616 sequentially at a predetermined timing.

The operation unit 614 may configured to include a Jog Dial (registered trademark), a key, a button, or a touch panel. The operation unit 614 receives a user's operation input and supplies a signal corresponding to the user's operation input to the control unit 615.

The control unit 615 controls the lens unit 611, the CMOS sensor 612, the A/D converter 613, the image processing unit 616, the display unit 617, the codec processing unit 618, and the storage unit 619, based on the signal corresponding to the user's operation input inputted to the operation unit 614.

The image processing unit 616 performs a variety of processes such as the color mixing correction described above, black level correction, white balance adjustment, demosaic processing, matrix processing, gamma correction, YC conversion, and so on for the image signal supplied from the A/D converter 613. The image processing unit 616 supplies the image signal on which image processing is performed to both the display unit 617 and the codec processing unit 618.

The display unit 617 may be configured to include a liquid crystal display. The display unit 617 displays an image of a subject based on the image signal from the image processing unit 616.

The codec processing unit 618 performs a predetermined coding process on the image signal from the image processing unit 616 and supplies an image data obtained by the coding process to the storage unit 619.

The storage unit 619 stores the image data supplied from the codec processing unit 618. The image data stored in the storage unit 619 is supplied to the display unit 617 by reading out to the image processing unit 616 as necessary. The display unit 617 displays an image corresponding to the image data.

The imaging apparatus which includes the solid-state image sensor or the image processing unit according to the embodiment of the present disclosure is not limited the configurations described above and other configurations may be employed.

As has been described, the respective apparatus may be configured to include other configurations than those described above. The apparatus may be configured as a single apparatus or as a system including a plurality of apparatus.

Seventh Embodiment

[Personal Computer]

The series of processes described above may be performed by hardware, software, or a combination of both. In this case, the series of processes may be performed in a personal computer shown in FIG. 43.

Figure 43:
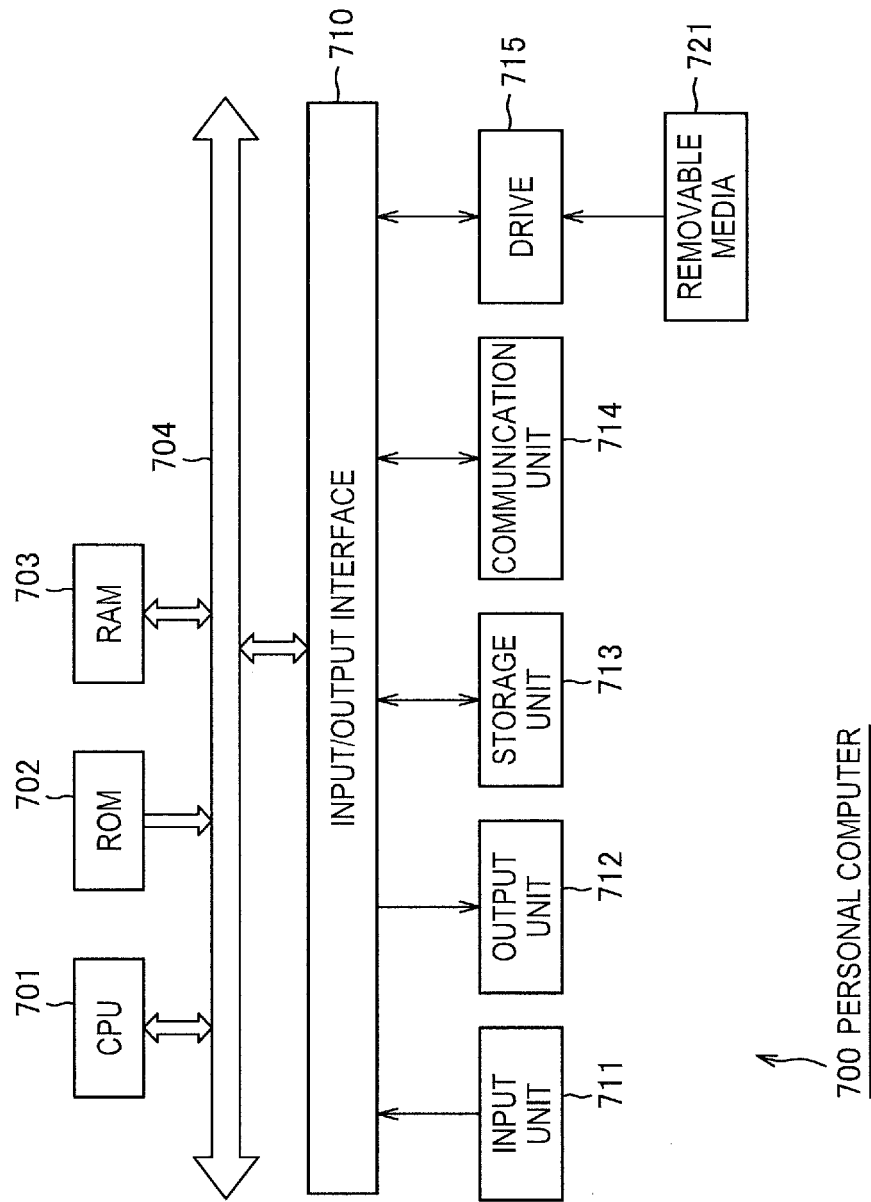
FIG. 43 is a block diagram illustrating a configuration example of a personal computer.

In FIG. 43, a central processing unit (CPU) 701 of the personal computer 700 performs a variety of processes according to a program stored in a read only memory (ROM) 702. The CPU 701 also performs a variety of processes according to a program loaded from a storage unit 713 to a random access memory (RAM) 703. For example, data which is necessary for the CPU 701 to execute a variety of processes is also appropriately stored in the RAM 703.

The CPU 701, the ROM 702, and the RAM 703 are connected to each other via a bus 704. An input/output interface 710 is also connected to the bus 704.

The input/output interface 710 is connected to an input unit 711 such as a keyboard and a mouse. The input/output interface 710 is also connected to an output unit 712. The output unit 712 may includes a speaker and a display such as a cathode ray tube (CRT) display or a liquid crystal display (LCD). The input/output interface 710 is also connected to the storage unit 713. The storage unit 713 may include a hard disk or a solid state drive (SSD) such as a flash memory. The input/output interface 710 is connected to a communication unit 714. The communication unit 714 may include a modem or an interface such as a wire or wireless local area networks (LANs). The communication unit 714 performs a communication process via a network including the Internet.

The input/output interface 710 is also connected to a drive 715 as necessary. Furthermore, a removable media 721 such as a magnetic disk, an optical disk, a magneto-optical disk, or a semiconductor memory is appropriately attached to the drive 715. A computer program which is read-out from the removable media 721 through the drive 715 is installed into the storage unit 713 as necessary.

When the series of processes described above are performed by software, the programs constituting the software are installed from a network or a recording medium.

This recording medium may be configured to include the removable media 721 in which the programs distributed to deliver to a user are stored independently of the apparatus, as shown in FIG. 43. Examples of the removable media 721 include a magnetic disk (including a flexible disk) or an optical disk (including a CD-ROM or DVD). Further, examples of the removable media 721 include a magneto-optical disk (including MD (Mini-Disc)) or a semiconductor memory. The recording medium may be configured as the ROM 702 in which programs distributed to a user in a state pre-incorporated in the apparatus as well as the removable media 721 are stored or may be configured as a hard disk included in the storage unit 713.

Further, the programs executed by a computer may include not only processes performed in a time series according to the procedures described herein but also processes performed in parallel or at a necessary suitable timing such as when a call or routine is performed.

Moreover, in the present specification, the steps describing the programs stored in the recording medium may include not only processes performed in a time series according to the procedures described herein, but also processes performed in parallel or separately rather than necessarily performed in the time series.

Also, in the present specification, the system may be an entire assembly configured to include a plurality of devices (apparatus).

It should be appreciated that the configuration including a single apparatus (or processing unit) as described herein may be configured to include a plurality of apparatus (or processing units). In contrast, the configuration including a plurality of apparatus (or processing units) as described herein may be configured to include a single apparatus (or processing unit). Also, configurations other than those described above may be added to the configuration of each apparatus (or processing unit). Further, a part of a configuration of any one apparatus (or processing unit) may be included in a configuration of other apparatus (or other processing unit) as long as the configuration or operation of the entire system will be substantially identical to each other. Example embodiments of the present disclosure should not be construed as limited to example embodiments of the present disclosure set forth herein. It should be understood that various changes, substitutions and alterations may be made herein without departing from the scope of the present disclosure.

Additionally, the present technology may also be configured as below.

(1) An image sensor including:
a normal pixel group composed of a plurality of normal pixels, each of the normal pixels having a photoelectric conversion device for photoelectrically converting an incident light; and
a detection pixel configured to detect a light incident from a neighboring pixel by the photoelectric conversion device within an effective pixel area of the normal pixel group.

(2) The image sensor according to (1), wherein the detection pixel further includes a light shielding film configured to shield an incident light incident upon the detection pixel from outside.

(3) The image sensor according to (2), wherein the light shielding film is formed by a wiring layer.

(4) The image sensor according to (3), wherein the light shielding film is formed by a plurality of wiring layers.

(5) The image sensor according to (4), wherein each of the wiring layers has a gap formed thereon at different positions from each other.

(6) The image sensor according to (4) or (5), wherein each of the wiring layers is arranged depending on an incident angle of an incident light.

(7) The image sensor according to any of (2) to (6), wherein the light shielding film is formed by a metal disposed on the photoelectric conversion device.

(8) The image sensor according to any of (1) to (7), wherein the image sensor includes a plurality of the detection pixels.

(9) The image sensor according to (8), further including:
a filter configured to transmit an incident light of a predetermined wavelength,
wherein a result obtained by detecting a light incident from the neighboring pixel by the detection pixel is used to correct a pixel value of a normal pixel provided with a filter configured to transmit an incident light having the same wavelength as a filter provided at the detection pixel.

(10) The image sensor according to (8) or (9), wherein the detection pixels are provided in positions that are not contiguous with each other.

(11) An imaging apparatus including:
an image sensor which includes
a normal pixel group composed of a plurality of normal pixels, each of the normal pixels having a photoelectric conversion device for photoelectrically converting an incident light, and
a detection pixel configured to detect a light incident from a neighboring pixel by the photoelectric conversion device within an effective pixel area of the normal pixel group; and
a subtraction unit configured to subtract a light amount of a light incident from a neighboring pixel of the normal pixel from a pixel value of the normal pixel by using a light amount of a light detected by the detection pixel of the image sensor.

(12) The imaging apparatus according to (11), wherein the subtraction unit includes
a selection unit configured to select a detection pixel to be used in subtracting the light amount,
a light amount calculation unit configured to calculate the light amount included in a pixel value of a normal pixel to be processed using a pixel value of the detection pixel selected by the selection unit, and
a light amount subtraction unit configured to subtract the light amount calculated by the light amount calculation unit from a pixel value of a normal pixel to be processed.

(13) The imaging apparatus according to (12),
wherein the selection unit selects a plurality of detection pixels, and
wherein the light amount calculation unit calculates the light amount by adding a weight to each pixel value of the plurality of detection pixels depending on a positional relationship between the plurality of detection pixels selected by the selection unit and a normal pixel to be processed.

(14) The imaging apparatus according to (12) or (13), wherein the light amount calculation unit changes the detection pixel used to calculate the light amount to another detection pixel or prohibits the detection pixel from being used, when a pixel value of a neighboring pixel of the detection pixel selected by the selection unit is saturated.

(15) The imaging apparatus according to any of (12) to (14), wherein the light amount calculation unit changes the detection pixel used to calculate the light amount to another detection pixel or prohibits the detection pixel from being used, when the detection pixel selected by the selection unit is a defective pixel.

(16) The imaging apparatus according to any of (12) to (15), wherein the light amount calculation unit further corrects the calculated light amount to reduce the light amount, when a normal pixel to be processed is adjacent to a detection pixel.

(17) The imaging apparatus according to any of (11) to (16), wherein the subtraction unit subtracts a black level as well as the light amount from the pixel value of the normal pixel.

(18) The imaging apparatus according to any of (11) to (17), wherein the subtraction unit includes
a selection unit configured to select a detection pixel to be used in subtracting the light amount,
a ratio calculation unit configured to calculate a ratio of the light amount included in a pixel value of a normal pixel to be processed using a pixel value of the detection pixel selected by the selection unit, and
a multiplication unit configured to multiply a pixel value of a normal pixel to be processed by a ratio of an incident light inputted to the normal pixel to be processed from outside, the ratio of the incident light being corresponded to the ratio of the light amount calculated by the ratio calculation unit.

(19) The imaging apparatus according to any of (11) to (18), wherein the normal pixel and the detection pixel of the image sensor have a vertical spectral structure.

(20) An imaging method of an imaging apparatus having an image sensor including
a normal pixel group composed of a plurality of normal pixels, each of the normal pixels having a photoelectric conversion device for photoelectrically converting an incident light; and
a detection pixel configured to detect a light incident from a neighboring pixel by the photoelectric conversion device within an effective pixel area of the normal pixel group,
the imaging method including
subtracting, at a subtraction unit, a light amount of a light incident from a neighboring pixel of the normal pixel from a pixel value of the normal pixel using a light amount of a light detected by the detection pixel of the image sensor.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2011-168946 filed in the Japan Patent Office on Aug. 2, 2011, the entire content of which is hereby incorporated by reference.

What is claimed is:

1. An image sensor comprising:
a normal pixel group composed of a plurality of normal pixels, each of the normal pixels having a photoelectric conversion device for photoelectrically converting an incident light; and
a detection pixel configured to detect a light incident from a neighboring pixel by the photoelectric conversion device within an effective pixel area of the normal pixel group.

2. The image sensor according to claim 1, wherein the detection pixel further includes a light shielding film configured to shield an incident light incident upon the detection pixel from outside.

3. The image sensor according to claim 2, wherein the light shielding film is formed by a wiring layer.

4. The image sensor according to claim 3, wherein the light shielding film is formed by a plurality of wiring layers.

5. The image sensor according to claim 4, wherein each of the wiring layers has a gap formed thereon at different positions from each other.

6. The image sensor according to claim 4, wherein each of the wiring layers is arranged depending on an incident angle of an incident light.

7. The image sensor according to claim 2, wherein the light shielding film is formed by a metal disposed on the photoelectric conversion device.

8. The image sensor according to claim 1, wherein the image sensor includes a plurality of the detection pixels.

9. The image sensor according to claim 8, further comprising:
a filter configured to transmit an incident light of a predetermined wavelength,
wherein a result obtained by detecting a light incident from the neighboring pixel by the detection pixel is used to correct a pixel value of a normal pixel provided with a filter configured to transmit an incident light having the same wavelength as a filter provided at the detection pixel.

10. The image sensor according to claim 8, wherein the detection pixels are provided in positions that are not contiguous with each other.

11. An imaging apparatus comprising:
an image sensor which includes
a normal pixel group composed of a plurality of normal pixels, each of the normal pixels having a photoelectric conversion device for photoelectrically converting an incident light, and
a detection pixel configured to detect a light incident from a neighboring pixel by the photoelectric conversion device within an effective pixel area of the normal pixel group; and
a subtraction unit configured to subtract a light amount of a light incident from a neighboring pixel of the normal pixel from a pixel value of the normal pixel by using a light amount of a light detected by the detection pixel of the image sensor.

12. The imaging apparatus according to claim 11, wherein the subtraction unit includes
a selection unit configured to select a detection pixel to be used in subtracting the light amount,
a light amount calculation unit configured to calculate the light amount included in a pixel value of a normal pixel to be processed using a pixel value of the detection pixel selected by the selection unit, and
a light amount subtraction unit configured to subtract the light amount calculated by the light amount calculation unit from a pixel value of a normal pixel to be processed.

13. The imaging apparatus according to claim 12,
wherein the selection unit selects a plurality of detection pixels, and
wherein the light amount calculation unit calculates the light amount by adding a weight to each pixel value of the plurality of detection pixels depending on a positional relationship between the plurality of detection pixels selected by the selection unit and a normal pixel to be processed.

14. The imaging apparatus according to claim 12, wherein the light amount calculation unit changes the detection pixel used to calculate the light amount to another detection pixel or prohibits the detection pixel from being used, when a pixel value of a neighboring pixel of the detection pixel selected by the selection unit is saturated.

15. The imaging apparatus according to claim 12, wherein the light amount calculation unit changes the detection pixel used to calculate the light amount to another detection pixel or prohibits the detection pixel from being used, when the detection pixel selected by the selection unit is a defective pixel.

16. The imaging apparatus according to claim 12, wherein the light amount calculation unit further corrects the calculated light amount to reduce the light amount, when a normal pixel to be processed is adjacent to a detection pixel.

17. The imaging apparatus according to claim 11, wherein the subtraction unit subtracts a black level as well as the light amount from the pixel value of the normal pixel.

18. The imaging apparatus according to claim 11, wherein the subtraction unit includes
a selection unit configured to select a detection pixel to be used in subtracting the light amount,
a ratio calculation unit configured to calculate a ratio of the light amount included in a pixel value of a normal pixel to be processed using a pixel value of the detection pixel selected by the selection unit, and
a multiplication unit configured to multiply a pixel value of a normal pixel to be processed by a ratio of an incident light inputted to the normal pixel to be processed from outside, the ratio of the incident light being corresponded to the ratio of the light amount calculated by the ratio calculation unit.

19. The imaging apparatus according to claim 11, wherein the normal pixel and the detection pixel of the image sensor have a vertical spectral structure.

20. An imaging method of an imaging apparatus having an image sensor including
a normal pixel group composed of a plurality of normal pixels, each of the normal pixels having a photoelectric conversion device for photoelectrically converting an incident light; and
a detection pixel configured to detect a light incident from a neighboring pixel by the photoelectric conversion device within an effective pixel area of the normal pixel group,
the imaging method comprising
subtracting, at a subtraction unit, a light amount of a light incident from a neighboring pixel of the normal pixel from a pixel value of the normal pixel using a light amount of a light detected by the detection pixel of the image sensor.

* * * * *